United States Patent
Chen et al.

(10) Patent No.: US 10,581,461 B2
(45) Date of Patent: Mar. 3, 2020

(54) METHOD AND APPARATUS FOR SEQUENCE DETERMINATION, DEVICE AND STORAGE MEDIUM

(71) Applicant: ZTE Corporation, Shenzhen, Guangdong (CN)

(72) Inventors: Mengzhu Chen, Guangdong (CN); Jin Xu, Guangdong (CN); Jun Xu, Guangdong (CN); Focai Peng, Guangdong (CN)

(73) Assignee: ZTE Corporation, Shenzhen (CN)

( * ) Notice: Subject to any disclaimer, the term of this patent is extended or adjusted under 35 U.S.C. 154(b) by 0 days.

(21) Appl. No.: 16/446,605

(22) Filed: Jun. 19, 2019

(65) Prior Publication Data
US 2019/0326929 A1    Oct. 24, 2019

Related U.S. Application Data
(63) Continuation of application No. PCT/CN2018/085645, filed on May 4, 2018.

(30) Foreign Application Priority Data

May 5, 2017    (CN) .......................... 2017 1 0314013
Aug. 24, 2017    (CN) .......................... 2017 1 0737955

(51) Int. Cl.
*H03M 13/00* (2006.01)
*H03M 13/11* (2006.01)
(Continued)

(52) U.S. Cl.
CPC ............. *H03M 13/116* (2013.01); *G06F 7/76* (2013.01); *G06F 17/16* (2013.01); *H03M 13/13* (2013.01); *G06F 11/076* (2013.01)

(58) Field of Classification Search
CPC ..... H03M 13/116; H03M 13/13; G06F 17/16; G06F 7/76; G06F 11/076
See application file for complete search history.

(56) References Cited

U.S. PATENT DOCUMENTS
2016/0352464 A1    12/2016   Shen et al.
2017/0366205 A1*   12/2017   Zhang ................. H03M 13/635
(Continued)

FOREIGN PATENT DOCUMENTS
| | | |
|---|---|---|
| CN | 103684477 A | 3/2014 |
| CN | 104539393 A | 4/2015 |
| CN | 106899379 A | 6/2017 |

OTHER PUBLICATIONS
International Search Report and Written Opinion dated Jul. 18, 2018 for International Application No. PCT/CN2018/085645, filed on May 4, 2018 (10 pages).
(Continued)

*Primary Examiner* — Samir W Rizk
(74) *Attorney, Agent, or Firm* — Perkins Coie LLP

(57) ABSTRACT

The present disclosure provides a method and an apparatus for sequence determination, a device and a storage medium. The method for sequence determination includes: mapping a first bit sequence having a length of K bits to a specified position based on M_index to obtain a second bit sequence; applying Polar encoding to the second bit sequence to obtain a Polar encoded bit sequence; and selecting T bits based on the Polar encoded bit sequence as a bit sequence to be transmitted, where K and T are both non-negative integers and K≤T.

18 Claims, 2 Drawing Sheets

(51) Int. Cl.
  *G06F 7/76* (2006.01)
  *G06F 17/16* (2006.01)
  *H03M 13/13* (2006.01)
  *G06F 11/07* (2006.01)

(56) References Cited

U.S. PATENT DOCUMENTS

2018/0198469 A1* 7/2018 Sarkis .................. H03M 13/13
2018/0294920 A1* 10/2018 Chen .................... H03M 13/13

OTHER PUBLICATIONS

Zte, et al., "Rate Matching of Polar Codes for eMBB," 3GPP TSG RAN WG1 Meeting #88, Athens, Greece, R1-1701602, pp. 1-20, Feb. 2017.

* cited by examiner

METHOD AND APPARATUS FOR SEQUENCE DETERMINATION, DEVICE AND STORAGE MEDIUM

CROSS REFERENCE TO RELATED APPLICATIONS

This patent document is a continuation of and claims priority to International Patent Application No. PCT/CN2018/085645, filed on May 4, 2018, which claims priority to Chinese Patent Application No. 201710314013.X, filed on May 5, 2017, and Chinese Patent Application No. 201710737955.9, filed on Aug. 24, 2017. The entire contents of the before-mentioned patent applications are incorporated by reference as part of the disclosure of this application.

TECHNICAL FIELD

The present disclosure relates to communication technology, and more particularly, to a method and an apparatus for sequence determination, a device and a storage medium.

BACKGROUND

Due to the presence of channel noise, a channel coding, as an independent part of a mobile communication system, guarantees the reliability, accuracy and effectiveness of information delivery.

Polar coding is a constructive coding scheme that has been strictly proven to be capable of reaching a channel capacity. Polar code is capable of satisfying requirements of the $5^{th}$ Generation (5G) New Radio Access Technology (RAT) with respect to communication throughput and latency. A codeword encoded by Polar code can be represented as $x = u \cdot G_N$, where $u = (u1, \ldots, uN)$ is composed of information bits, known bits and parity check bits, $G_N = F_2^{\otimes n}$, $F_2^{\otimes n}$ denotes the n-th Kronecker product of $F_2$, $$F_2 = \begin{bmatrix} 1 & 0 \\ 1 & 1 \end{bmatrix}, \text{ and } n = \log 2(N).$$

Due to the Polarization characteristics of the Polar codes, input bits have different reliabilities, i.e., input bits at different positions have different Bit Error Rates (BERs). In order to improve a decoding performance, the information bits and the parity check bits are placed at positions having high reliabilities (i.e., positions having low BERs) and the known bits are placed at positions having low reliabilities in an encoding process, such that the Block Error Rate (BLER) can be effectively reduced.

Conventionally, for different mother code lengths of Polar codes, different hardware implementations would be required for permutation and rate matching of the information bits, parity check bits and known bits, which is highly complicated.

Currently, there are no effective solutions to the above problem in the related art.

SUMMARY

The embodiments of the present disclosure provide a method and an apparatus for sequence determination, a device and a storage medium, capable of solving the problem in the related art associated with lack of a sequence determination scheme in the 5G New RAT.

According to an embodiment of the present disclosure, a method for sequence determination is provided. The method includes: mapping a first bit sequence having a length of K bits to a position based on M_index to obtain a second bit sequence; applying Polar encoding to the second bit sequence to obtain a Polar encoded bit sequence; and selecting T bits based on the Polar encoded bit sequence as a bit sequence to be transmitted, where K and T are both non-negative integers and K≤T.

In an embodiment of the present disclosure, the method further includes, prior to mapping the first bit sequence having the length of K bits to the specified position based on M_index to obtain the second bit sequence: applying a first predetermined transform to a first index matrix to obtain a second index matrix and obtaining M_index based on the second index matrix. The first predetermined transform includes row permutation or column permutation.

In an embodiment of the present disclosure, the method further includes, prior to selecting T bits from the Polar encoded bit sequence as the bit sequence to be transmitted: forming a first bit sequence matrix based on the Polar encoded bit sequence; and applying a second predetermined transform to the first bit sequence matrix to obtain a second bit sequence matrix. The second predetermined transform includes row permutation or column permutation. The operation of selecting T bits based on the Polar encoded bit sequence as the bit sequence to be transmitted includes: selecting T bits based on the second bit sequence matrix as the bit sequence to be transmitted.

In an embodiment of the present disclosure, the second index matrix is $M_{re}$, which is a matrix of $R_{re}$ rows and $C_{re}$ columns. The first index matrix is $M_{or}$, which is:

$$M_{or} = \begin{bmatrix} 0 & 1 & 2 & \ldots & C_{re}-1 \\ C_{re} & C_{re}+1 & C_{re}+2 & \ldots & 2C_{re}-1 \\ \vdots & \vdots & \vdots & \ddots & \vdots \\ (R_{re}-1) \times C_{re} & (R_{re}-1) \times C_{re}+1 & (R_{re}-1) \times C_{re}+2 & \ldots & R_{re} \times C_{re}-1 \end{bmatrix} \text{ or}$$

$$M_{or} = \begin{bmatrix} 0 & R_{re} & 2R_{re} & \ldots & (C_{re}-1) \times R_{re} \\ 1 & R_{re}+1 & 2R_{re}+1 & \ldots & (C_{re}-1) \times R_{re}+1 \\ \vdots & \vdots & \vdots & \ddots & \vdots \\ R_{re}-1 & 2R_{re}-1 & 3R_{re}-1 & \ldots & R_{re} \times C_{re}-1 \end{bmatrix},$$

where $R_{re} \times C_{re} \geq N$, $R_{re}$ and $C_{re}$ are both non-negative integers, and N is a length of the Polar encoded bit sequence.

In an embodiment of the present disclosure, when $R_{re}$ is constant, $C_{re}$ is a minimum value satisfying $R_{re} \times C_{re} \geq N$; or when $C_{re}$ is constant, $R_{re}$ is a minimum value satisfying $R_{re} \times C_{re} \geq N$.

In an embodiment of the present disclosure, the operation of applying the first predetermined transform to the first index matrix to obtain the second index matrix includes at least one of: the i-th column of $M_{re}$ being obtained from the $\pi_1(i)$-th column of $M_{or}$ by means of column permutation, where $0 \le i \le C_{re}-1$, $0 \le \pi_1(i) \le C_{re}-1$, $R_{re} \times C_{re} \ge N$, and i and $\pi_1(i)$ are both non-negative integers; or the j-th row of $M_{re}$ being obtained from the $\pi_2(j)$-th row of $M_{or}$, where $0 \le j \le R_{re}-1$, $0 \le \pi_2(j) \le R_{re}-1$, $R_{re} \times C_{re} \ge N$, and j and $\pi_2(j)$ are both non-negative integers.

In an embodiment of the present disclosure, $\pi_1(i)$ is obtained as at least one of: $\pi_1(i)=BRO(i)$, where BRO( ) denotes a bit reverse ordering operation which includes: converting a decimal number i into a first binary number $(B_{n1-1}, B_{n1-2}, \ldots, B_0)$, reversing the first binary number to obtain a second binary number $(B_0, B_1, \ldots, B_{n1-1})$ and converting the second binary number into a decimal number $\pi_1(i)$, where $n1=\log_2(C_{re})$ and $0 \le i \le C_{re}-1$; $i(i)=\{S1, S2, S3\}$, where $S1=\{0, 1, \ldots, i1-1\}$, $S2=\{i2, i3, i2+1, i3+1, \ldots, i4, i5\}$, and S3 is a set of elements in $\{0, 1, \ldots, C_{re}-1\}$ other than those included in S1 and S2, where $C_{re}/8 \le i1 \le i2 \le C_{re}/3$, $i2 \le i4 \le i3 \le 2C_{re}/3$, $i3 \le i5 \le C_{re}-1$, i1, i2, i3, i4 and i5 are all non-negative integers, and an intersection of any two of S1, S2 and S3 is null; or $\pi_1(i)=\{I\}$, where $\{I\}$ is a sequence obtained by organizing numerical results of applying a function f(r) to column indices r of $M_{or}$ in ascending or descending order, where $0 \le r \le C_{re}-1$.

In an embodiment of the present disclosure, f(r) includes at least one of:

$$f(r) = \sum_{m1=0}^{n1-1} B_{m1} \times 2^{\frac{m1}{k}},$$

$(B_{n1-1}, B_{n1-2}, \ldots, B_0)$ is a binary representation of the index r, where $0 \le m1 \le n1-1$, $n1=\log_2(C_{re})$, and k is a non-negative integer; initializing a function value corresponding to r as $f_1^{(r)}$, and obtaining a function value for each element $f_{C_{re}}^{(r)}$ after n1-th iteration in accordance with a first iteration equation:

$$\begin{cases} f_{2m2}^{(2r-1)} = \varphi^{-1}\left(1 - [1 - \varphi(f_{m2}^{(r_1)})][1 - \varphi(f_{m2}^{(r_2)})]\right) \\ f_{2m2}^{(2r)} = f_{m2}^{(r_1)} + f_{m2}^{(r_2)} \end{cases},$$

where $f_1^{(r)}$ is a mean log likelihood ratio; or initializing a function value corresponding to r as $f_1^{(r)}$, and obtaining a function value for each element $f_{C_{re}}^{(r)}$ after n1-th iteration in accordance with a second iteration equation:

$$\begin{cases} f_{2m3}^{(2r-1)} = f_{m3}^{(r_1)} + f_{m3}^{(r_2)} - f_{m3}^{(r_1)} f_{m3}^{(r_2)} \\ f_{2m3}^{(2r)} = f_{m3}^{(r_1)} f_{m3}^{(r_2)} \end{cases},$$

where $f_1^{(r)}$ is mutual information, where $1 \le m2 \le n1$, $1 \le m3 \le n1$, and r1, r2, 2r and 2r-1 are all integers larger than or equal to 0 and smaller than or equal to $C_{re}-1$.

In an embodiment of the present disclosure, $\pi_2(j)$ is obtained as at least one of: $\pi_2(j)=BRO(j)$, where BRO( ) denotes a bit reverse ordering operation which includes: converting a decimal number j into a third binary number $(B_{n2-1}, B_{n2-2}, \ldots, B_0)$, reversing the third binary number to obtain a fourth binary number $(B_0, B_1, \ldots, B_{n2-1})$ and converting the fourth binary number into a decimal number $\pi_2(j)$, where $n2=\log_2(R_{re})$ and $0 \le j \le R_{re}-1$; $\lambda_2(j)=\{S4, S5, S6\}$, where $S4=\{0, 1, \ldots, j1-1\}$, $S5=\{j2, j3, j2+1, j3+1, \ldots, j4, j5\}$, and S6 is a set of elements in $\{0, 1, \ldots, R_{re}-1\}$ other than those included in S4 and S5, where $R_{re}/8 \le j1 \le j2 \le R_{re}/3$, $j2 \le j4 \le j3 \le 2 R_{re}/3$, $j3 \le j5 \le R_{re}-1$, j1, j2, j3, j4 and j5 are all non-negative integers, and an intersection of any two of S4, S5 and S6 is null; or $\pi_2(j)=\{J\}$, where $\{J\}$ is a sequence obtained by organizing numerical results of applying a function f(s) to row indices s of $M_{or}$ in ascending or descending order, where $0 \le s \le R_{re}-1$.

In an embodiment of the present disclosure, f(s) includes at least one of:

$$f(s) = \sum_{m4=0}^{n2-1} B_{m4} \times 2^{\frac{m4}{k}},$$

$(B_{n2-1}, B_{n2-2}, \ldots, B_0)$ is a binary representation of the index s, where $0 \le m4 \le n2-1$, $n2=\log_2(R_{re})$, and k is a non-negative integer; initializing a function value corresponding to s as $f_1^{(s)}$, and obtaining a function value for each element $f_{R_{re}}^{(s)}$ after n2-th iteration in accordance with a third iteration equation:

$$\begin{cases} f_{2m5}^{(2s-1)} = \varphi^{-1}\left(1 - [1 - \varphi(f_{m5}^{(s_1)})][1 - \varphi(f_{m5}^{(s_2)})]\right) \\ f_{2m5}^{(2s)} = f_{m5}^{(s_1)} + f_{m5}^{(s_2)} \end{cases},$$

where $f_1^{(s)}$ is a mean log likelihood ratio; or initializing a function value corresponding to s as $f_1^{(s)}$, and obtaining a function value for each element $f_{R_{re}}^{(s)}$ after n2-th iteration in accordance with a fourth iteration equation:

$$\begin{cases} f_{2m6}^{(2s-1)} = f_{m6}^{(s_1)} + f_{m6}^{(s_2)} - f_{m6}^{(s_1)} f_{m6}^{(s_2)} \\ f_{2m6}^{(2s)} = f_{m6}^{(s_1)} f_{m6}^{(s_2)} \end{cases},$$

where $f_1^{(s)}$ is mutual information, where $1 \le m5 \le n2$, $1 \le m6 \le n2$, s1, s2, 2s and 2s-1 are all integers larger than or equal to 0 and smaller than or equal to $R_{re}-1$.

In an embodiment of the present disclosure, the first bit sequence matrix is $M_{og}$. The second bit sequence matrix is $M_{vb}$, which is a matrix of $R_{vb}$ rows and $C_{vb}$ columns. $M_{og}$ is:

$$M_{og} = \begin{bmatrix} x_0 & x_1 & x_2 & \cdots & x_{C_{vb}-1} \\ x_{C_{vb}} & x_{C_{vb}+1} & x_{C_{vb}+2} & \cdots & x_{2C_{vb}-1} \\ \vdots & \vdots & \vdots & \ddots & \vdots \\ x_{(R_{vb}-1) \times C_{vb}} & x_{(R_{vb}-1) \times C_{vb}+1} & x_{(R_{vb}-1) \times C_{vb}+2} & \cdots & x_{R_{vb} \times C_{vb}-1} \end{bmatrix} \text{ or}$$

$$M_{og} = \begin{bmatrix} x_0 & x_{R_{vb}} & x_{2R_{vb}} & \cdots & x_{(C_{vb}-1) \times R_{vb}} \\ x_1 & x_{R_{vb}+1} & x_{2R_{vb}+1} & \cdots & x_{(C_{vb}-1) \times R_{vb}+1} \\ \vdots & \vdots & \vdots & \ddots & \vdots \\ x_{R_{vb}-1} & x_{2R_{vb}-1} & x_{3R_{vb}-1} & \cdots & x_{R_{vb} \times C_{vb}-1} \end{bmatrix},$$

where $x_0, x_1, x_2, \ldots, x_{R_{vb} \times C_{vb}-1}$ is the Polar encoded bit sequence, $R_{vb} \times C_{vb} \ge N$, $R_{vb}$ and $C_{vb}$ are both non-negative integers and N is a length of the Polar encoded bit sequence.

In an embodiment of the present disclosure, when $R_{vb}$ is constant, $C_{vb}$ is a minimum value satisfying $R_{vb} \times C_{vb} \ge N$; or when $C_{vb}$ is constant, $R_{vb}$ is a minimum value satisfying $R_{vb} \times C_{vb} \ge N$.

In an embodiment of the present disclosure, the operation of applying the second predetermined transform to the first bit sequence matrix to obtain the second bit sequence matrix includes at least one of: the g-th column of $M_{vb}$ being obtained from the $\pi_3(g)$-th column of $M_{og}$ by means of column permutation, where $0 \le g \le C_{vb}-1$, $0 \le \pi_3(g) \le C_{vb}-1$, $R_{vb} \times C_{vb} \ge N$, and g and $\pi_3(g)$ are both non-negative integers; or the h-th row of $M_{vb}$ being obtained from the $\pi_4(h)$-th row of $M_{og}$ by means of row permutation, where $0 \le h \le R_{vb}-1$, $0 \le \pi_4(h) \le R_{vb}-1$, $R_{vb} \times C_{vb} \ge N$, and h and $\pi_4(h)$ are both non-negative integers.

In an embodiment of the present disclosure, $\pi_3(g)$ is obtained as at least one of: $\pi_3(g)=BRO(g)$, where BRO( ) denotes a bit reverse ordering operation which includes: converting a decimal number g into a fifth binary number $(B_{n3-1}, B_{n3-2}, \ldots, B_0)$, reversing the fifth binary number to obtain a sixth binary number $(B_0, B_{11}, \ldots, B_{n3-1})$ and converting the sixth binary number into a decimal number $\pi_3(g)$, where $n3=\log_2(C_{vb})$ and $0 \le g \le C_{vb}-1$; $\pi_3(g)=\{S1, S2, S3\}$, where $S1=\{0, 1, \ldots, g1-1\}$, $S2=\{g2, g3, g2+1, g3+1, \ldots, g4, g5\}$, and S3 is a set of elements in $\{0, 1, \ldots, C_{vb}-1\}$ other than those included in S1 and S2, where $C_{vb}/8 \le g1 \le g2 \le C_{vb}/3$, $g2 \le g4 \le g3 \le 2C_{vb}/3$, $g3 \le g5 \le C_{vb}-1$, g1, g2, g3, g4 and g5 are all non-negative integers, and an intersection of any two of S1, S2 and S3 is null; $\pi_3(g)=\{G\}$, where $\{G\}$ is a sequence obtained by organizing numerical results of applying a function $f(\alpha)$ to column indices $\alpha$ of $M_{og}$ in ascending or descending order, where $0 \le \alpha \le C_{vb}-1$; $\pi_3(g)=\{Q1, Q2, Q3\}$, where $Q2=\{q1, q2, q1+1, q2+1, \ldots, q3, q4\}$, $0 \le q1 \le q3 \le (C_{vb}-1)/2$, $0 \le q2 \le q4 \le (C_{vb}-1)/2$, q1, q2, q3, q4 and q5 are all non-negative integers, Q1 and Q3 are other elements in a difference set between $\{0, 1, \ldots, C_{vb}-1\}$ and Q2, and an intersection of any two of Q1, Q2 and Q3 is null; $\pi_3(g)$ being different from a predefined sequence V1 in nV1 positions, where $V1=\{0, 1, 2, 3, 4, 5, 6, 7, 8, 9, 10, 11, 12, 16, 13, 17, 14, 18, 15, 19, 20, 24, 21, 22, 25, 26, 28, 23, 27, 29, 30, 31\}$, $0 \le nV1 \le 23$; or $\pi_3(g)$ being different from a predefined sequence V2 in nV2 positions, where $V2=\{0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31\}$, $0 \le nV2 \le 3$.

In an embodiment of the present disclosure, $f(\alpha)$ includes at least one of:

$$f(\alpha) = \sum_{m6=0}^{n3-1} B_{m6} \times 2^{\frac{m6}{k}},$$

$(B_{n3-1}, B_{n3-2}, \ldots, B_0)$ is a binary representation of the index $\alpha$, where $0 \le m6 \le n3-1$, $n3=\log_2(C_{vb})$, and k is a non-negative integer; initializing a function value corresponding to $\alpha$ as $f_1^{(\alpha)}$, and obtaining a function value for each element $f_{C_{vb}}^{(\alpha)}$ after n3-th iteration in accordance with a fifth iteration equation:

$$\begin{cases} f_{2m7}^{(2\alpha-1)} = \varphi^{-1}\left(1 - [1 - \varphi(f_{m7}^{(\alpha_1)})][1 - \varphi(f_{m7}^{(\alpha_2)})]\right) \\ f_{2m7}^{(2\alpha)} = f_{m7}^{(\alpha_1)} + f_{m7}^{(\alpha_2)} \end{cases},$$

where $f_1^{(\alpha)}$ is a mean log likelihood ratio; or initializing a function value corresponding to s as $f_1^{(\alpha)}$, and obtaining a function value for each element $f_{C_{vb}}^{(\alpha)}$ after n3-th iteration in accordance with a sixth iteration equation:

$$\begin{cases} f_{2m8}^{(2\alpha-1)} = f_{m8}^{(\alpha_1)} + f_{m8}^{(\alpha_2)} - f_{m8}^{(\alpha_1)} f_{m8}^{(\alpha_2)} \\ f_{2m8}^{(2\alpha)} = f_{m8}^{(\alpha_1)} f_{m8}^{(\alpha_2)} \end{cases},$$

where $f_1^{(\alpha)}$ is mutual information, where $1 \le m7 \le n3$, $1 \le m8 \le n3$, and $\alpha1$, $\alpha2$, 2a and $2\alpha-1$ are all integers larger than or equal to 0 and smaller than or equal to $C_{vb}-1$.

In an embodiment of the present disclosure, $\pi_4(h)$ is obtained as at least one of: $\pi_4(h)=BRO(h)$, where BRO( ) denotes a bit reverse ordering operation which includes: converting a decimal number h into a seventh binary number $(B_{n4-1}, B_{n4-2}, \ldots, B_0)$, reversing the seventh binary number to obtain an eighth binary number $(B_0, B_1, \ldots, B_{n4-1})$ and converting the eighth binary number into a decimal number $\pi_4(h)$, where $n4=\log_2(R_{vb})$ and $0 \le h \le R_{vb}-1$; $\pi_4(h)=\{S4, S5, S6\}$, where $S4=\{0, 1, \ldots, h1-1\}$, $S5=\{h2, h3, h2+1, h3+1, \ldots, h4, h5\}$, and S6 is a set of elements in $\{0, 1, \ldots, R_{vb}-1\}$ other than those included in S4 and S5, where $R_{vb}/8 \le h1 \le h2 \le R_{vb}/3$, $h2 \le h4 \le h3 \le 2R_{vb}/3$, $h3 \le h5 \le R_{vb}-1$, h1, h2, h3, h4 and h5 are all non-negative integers, and an intersection of any two of S4, S5 and S6 is null; $\pi_4(h)=\{H\}$, where $\{H\}$ is a sequence obtained by organizing numerical results of applying a function $f(\beta)$ to row indices $\beta$ of $M_{og}$ in ascending or descending order, where $0 \le \beta \le R_{vb}-1$; $\pi_4(h)=\{O1, O2, O3\}$, where $O2=\{o1, o2, o1+1, o2+1, \ldots, o3, o4\}$, $0 \le o1 \le o3 \le (R_{vb}-1)/2$, $0 \le o2 \le o4 \le (R_{vb}-1)/2$, o1, o2, o3, o4 and o5 are all non-negative integers, O1 and O3 are other elements in a difference set between $\{0, 1, \ldots, R_{vb}-1\}$ and O2, and an intersection of any two of O1, O2 and O3 is null; $\pi_4(h)$ being different from a predefined sequence VV1 in nVV1 positions, where $VV1=\{0, 1, 2, 3, 4, 5, 6, 7, 8, 9, 10, 11, 12, 16, 13, 17, 14, 18, 15, 19, 20, 24, 21, 22, 25, 26, 28, 23, 27, 29, 30, 31\}$, $0 \le nVV1 \le 23$; or $\pi_4(h)$ being different from a predefined sequence VV2 in nVV2 positions, where $VV2=\{0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31\}$, $0 \le nVV2 \le 3$.

In an embodiment of the present disclosure, $f(\beta)$ includes at least one of:

$$f(\beta) = \sum_{m9=0}^{n4-1} B_{m9} \times 2^{\frac{m9}{k}},$$

$(B_{n4-1}, B_{n4-2}, \ldots, B_0)$ is a binary representation of the index $\beta$, where $0 \le m9 \le n4-1$, $n4=\log_2(R_{vb})$, and k is a non-negative integer; initializing a function value corresponding to $\beta$ as $f_1^{(\beta)}$, and obtaining a function value for each element $f_{R_{vb}}^{(\beta)}$ after n4-th iteration in accordance with a seventh iteration equation:

$$\begin{cases} f_{2m10}^{(2\beta-1)} = \varphi^{-1}\left(1 - [1 - \varphi(f_{m10}^{(\beta_1)})][1 - \varphi(f_{m10}^{(\beta_2)})]\right) \\ f_{2m10}^{(2\beta)} = f_{m10}^{(\beta_1)} + f_{m10}^{(\beta_2)} \end{cases},$$

where $f_1^{(\beta)}$ is a mean log likelihood ratio; or initializing a function value corresponding to $\beta$ as $f_1^{(\beta)}$, and obtaining a function value for each element $f_{R_{vb}}^{(\beta)}$ after n4-th iteration in accordance with an eighth iteration equation:

$$\begin{cases} f_{2m11}^{(2\beta-1)} = f_{m11}^{(\beta_1)} + f_{m11}^{(\beta_2)} - f_{m11}^{(\beta_1)} f_{m11}^{(\beta_2)} \\ f_{2m11}^{(2\beta)} = f_{m11}^{(\beta_1)} f_{m11}^{(\beta_2)} \end{cases},$$

where $f_1^{(\beta)}$ is mutual information, where $1 \leq m10 \leq n4$, $1 \leq m11 \leq n4$, and $\beta1$, $\beta2$, $2\beta$ and $2\beta-1$ are all integers larger than or equal to 0 and smaller than or equal to $R_{vb}-1$.

In an embodiment of the present disclosure, the operation of obtaining M_index based on the second index matrix includes: selecting a predetermined number of indices from $M_{re}$ row by row, column by column or diagonal by diagonal, as M_index.

In an embodiment of the present disclosure, the operation of selecting the predetermined number of indices from $M_{re}$ column by column includes: selecting $\pi_p$ indices from the p-th column of $M_{re}$, where $\Sigma_{p=1}^{C_{re}} K_p = K$, p is an integer, and $1 \leq p \leq C_{re}$. The operation of selecting the predetermined number of indices from $M_{re}$ row by row includes: selecting $\pi_q$ indices from the q-th row of $M_{re}$, where $\Sigma_{q=1}^{R_{re}} K_q = K$, q is an integer, and $1 \leq q \leq R_{re}$. The operation of selecting the predetermined number of indices from $M_{re}$ diagonal by diagonal includes: selecting $K_\delta$ indices from the $\delta$-th diagonal of $M_{re}$, where $$\sum_{\delta=-min(R_{re},C_{re})+1}^{max(R_{re},C_{re})-1} K_\delta = K,$$

$\delta$ is an integer, and $-min(R_{re}, C_{re})+1 \leq \delta \leq max(R_{re}, C_{re})-1$, where $min(R_{re}, C_{re})$ denotes the smaller of $R_{re}$ and $C_{re}$, and $max(R_{re}, C_{re})$ denotes the larger of $R_{re}$ and $C_{re}$.

In an embodiment of the present disclosure, the operation of selecting the predetermined number of indices from $M_{re}$ column by column includes at least one of: selecting $K_{ic1}$ indices from the $1^{st}$, $2^{nd}$, $C_1$-th columns of $M_{re}$, where $\Sigma_{ic1=1}^{C_1} K_{ic1} = K$, $1 \leq ic1 \leq C_1$, $1 \leq C_1 \leq C_{re}$, and ic1 and $C_1$ are integers; selecting $K_{ic2}$ indices from the $C_2$-th, $(C_2+1)$-th, ..., $C_3$-th columns of $M_{re}$, where $\Sigma_{ic2=C_2}^{C_3} K_{ic2} = K$, $C_2 \leq ic2 \leq C_3$, $1 \leq C_2 \leq C_3 \leq C_{re}$, and ic2, $C_2$ and $C_3$ are integers; or selecting $K_{ic3}$ indices from the $C_4$-th, $(C_4+1)$-th, ..., $C_{re}$-th columns of $M_{re}$, where $\Sigma_{ic3=C_4}^{C_{re}} K_{ic3} = K$, $C_4 \leq ic3 \leq C_{re}$, $1 \leq C_4 \leq C_{re}$, and ic3 and $C_4$ are integers.

In an embodiment of the present disclosure, the operation of selecting the predetermined number of indices from $M_{re}$ row by row includes at least one of: selecting $K_{ir1}$ indices from the $1^{st}$, $2^{nd}$, ..., $R_1$-th rows of $M_{re}$, where $\Sigma_{ir1=1}^{R_1} K_{ir1} = K$, $1 \leq ir1 \leq R_1$, $1 \leq R_1 \leq R_{re}$, and ir1 and $R_1$ are integers; selecting $K_{ir2}$ indices from the $R_2$-th, $(R_2+1)$-th, ..., $R_3$-th rows of $M_{re}$, where $\Sigma_{ir2=R_2}^{R_3} K_{ir2} = K$, $R_2 \leq ir2 \leq R_3$, $1 \leq R_2 \leq R_3 \leq R_{re}$, and ir2, $R_2$ and $R_3$ are integers; or selecting $K_{ir3}$ indices from the $R_4$-th, $(R_4+1)$-th, ..., $R_{re}$-th rows of $M_{re}$, where $\Sigma_{ir3=R_4}^{R_{re}} K_p = K$, $1 \leq R_4 \leq R_{re}$, and ir3 and $R_4$ are integers.

In an embodiment of the present disclosure, the operation of selecting the predetermined number of indices from $M_{re}$ diagonal by diagonal includes at least one of: selecting $K_{id1}$ indices from the $(-min(R_{re}, C_{re})+1)$-th, $(-min(R_{re}, C_{re})+2)$-th, ..., $D_1$-th diagonals of $M_{re}$, where $\Sigma_{id1=-min(R_{re},C_{re})+1}^{D_1} K_{id1} = K$, $-min(R_{re}, C_{re})+1 \leq D_1 \leq max(R_{re}, C_{re})-1$, and id1 and $D_1$ are integers; selecting $K_{id2}$ indices from the $D_2$-th, $(D_2+1)$-th, ..., $D_3$-th diagonals of $M_{re}$, where $\Sigma_{id2=D_2}^{D_3} K_{id2} = K$, $-min(R_{re}, C_{re})+1 \leq D_2 \leq D_3 \leq max(R_{re}, C_{re})-1$, and id2, $D_2$ and $D_3$ are integers; and selecting $K_{id3}$ indices from the $D_4$-th, $(D_4+1)$-th, ..., $(max(R_{re}, C_{re})-1)$-th diagonals of $M_{re}$, where $$\sum_{id3=D_4}^{max(R_{re},C_{re})-1} K_{id3} = K,$$

$-min(R_{re}, C_{re})+1 \leq D_4 \leq max(R_{re}, C_{re})-1$, and id3 and $D_4$ are integers, where $min(R_{re}, C_{re})$ denotes the smaller of $R_{re}$ and $C_{re}$, and $max(R_{re}, C_{re})$ denotes the larger of $R_{re}$ and $C_{re}$.

In an embodiment of the present disclosure, when the predetermined number of indices are selected from $M_{re}$ row by row, column by column or diagonal by diagonal, each index corresponding to a non-transmitted bit sequence in a second bit sequence matrix is skipped. The second bit sequence matrix is obtained from a first bit sequence matrix by using a second predetermined transform. The first bit sequence matrix is formed from the Polar encoded bit sequence. The second predetermined transform includes row permutation or column permutation.

In an embodiment of the present disclosure, the operation of selecting T bits based on the second bit sequence matrix as the bit sequence to be transmitted includes: selecting T bits based on the second bit sequence matrix row by row, column by column or diagonal by diagonal, as the bit sequence to be transmitted.

In an embodiment of the present disclosure, the operation of selecting T bits based on the second bit sequence matrix row by row, column by column or diagonal by diagonal as the bit sequence to be transmitted includes: selecting T bits based on the second bit sequence matrix row by row, column by column or diagonal by diagonal, from a starting position t in the second bit sequence matrix. When the selection reaches the first or last bit in the second bit sequence matrix, it continues with the last or first bit in the second bit sequence matrix, where $1 \leq t \leq R_{vb} \times C_{vb}$.

In an embodiment of the present disclosure, the operation of selecting T bits based on the second bit sequence matrix row by row, column by column or diagonal by diagonal as the bit sequence to be transmitted includes: selecting the $1^{st}$ to T-th bits or the (N−T+1)-th to N-th bits from the second bit sequence matrix column by column, when T is smaller than or equal to a length N of the Polar encoded bit sequence; selecting the $1^{st}$ to T-th bits or the (N−T+1)-th to N-th bits from the second bit sequence matrix row by row, when T is smaller than or equal to the length N of the Polar encoded bit sequence; selecting the $1^{st}$ to T-th bits or the (N−T+1)-th to N-th bits from the second bit sequence matrix diagonal by diagonal, when T is smaller than or equal to the length N of the Polar encoded bit sequence; selecting, when T is larger than the length N of the Polar encoded bit sequence, T bits row by row, column by column or diagonal by diagonal, from the t-th bit in the second bit sequence matrix. When the selection reaches the first or last bit in the second bit sequence matrix, it continues with the last or first bit in the second bit sequence matrix, where $1 \leq t \leq R_{vb} \times C_{vb}$ and N is a non-negative integer.

In an embodiment of the present disclosure, the operation of selecting T bits from the second bit sequence matrix column by column includes at least one of: selecting $T_{ie1}$ bits from the $1^{st}$, $2^{nd}$, ..., $E_1$-th columns, where $\Sigma_{ie1=1}^{E_1} T_{ie1} = T$, $1 \leq E_1 \leq C_{vb}$, and ie1 and $E_1$ are integers; selecting $T_{ie2}$ bits from the $E_2$-th, $(E_2+1)$-th, ..., $E_3$-th columns, where $\Sigma_{ie2=E_2}^{E_3} T_{ie2} = T$, $1 \leq E_2 \leq E_3 \leq C_{re}$, and ie2, $E_2$ and $E_3$ are integers; or selecting $T_{ie3}$ bits from the $E_4$-th, $(E_4+1)$-th, ... $E_{vb}$-th columns, where $\Sigma_{ie3=E_4}^{C_{vb}} T_{ie3} = T$, $1 \leq E_4 \leq C_{vb}$, and ie3 and $E_4$ are integers.

In an embodiment of the present disclosure, the operation of selecting T bits from the second bit sequence matrix row by row includes at least one of: selecting Tin bits from the $1^{st}$, $2^{nd}$, ..., $F_1$-th rows, where $\Sigma_{if1=1}^{F_1} T_{if1} = T$, $1 \leq F_1 \leq R_{vb}$, and if1 and $F_1$ are integers; selecting $T_{if2}$ bits from the $F_2$-th, $(F_2+1)$-th, ..., $F_3$-th rows, where $\Sigma_{if2=F_2}^{F_3} T_{if2} = T$, $1 \leq F_2 \leq F_3 \leq R_{vb}$, and if2, $F_2$ and $F_3$ are integers; or selecting $T_{if3}$ bits from the $F_4$-th, $(F_4+1)$-th, ..., $R_{vb}$-th rows, where $\Sigma_{if3=F_4}^{R_{vb}} T_{if3}=T$, $1 \le F_4 \le R_{vb}$, and if3 and $F_4$ are integers.

In an embodiment of the present disclosure, the operation of selecting T bits from the second bit sequence matrix diagonal by diagonal includes at least one of: selecting $T_{ig1}$ bits from the $(-\min(R_{vb}, C_{vb})+1)$-th, $(-\min(R_{vb}, C_{vb})+2)$-th, ..., $G_1$-th diagonals, where $\Sigma_{ig1=-\min(R_{vb}, C_{vb})+1}^{G_1} T_{ig1}=T$, $-\min(R_{vb}, C_{vb})+1 \le G_1 \le \max(R_{vb}, C_{vb})-1$, and ig1 and $G_1$ are integers; selecting $K_{ig2}$ bits from the $G_2$-th, $(G_2+1)$-th, ..., $G_3$-th diagonals, where $\Sigma_{ig2=G_2}^{G_3} T_{ig2}=T$, $-\min(R_{vb}, C_{vb})+1 \le G_2 \le G_3 \le \max(R_{vb}, C_{vb})-1$, and ig2, $G_2$ and $G_3$ are integers; or selecting $K_{id3}$ bits from the $G_4$-th, $(G_4+1)$-th, ..., $(\max(R_{vb}, C_{vb})-1)$-th diagonals, where $$\sum_{ig3=G_4}^{max(R_{vb},C_{vb})-1} T_{ig3} = T,$$

$-\min(R_{vb}, C_{vb})+1 \le G_4 \le \max(R_{vb}, C_{vb})-1$, and ig3 and $G_4$ are integers.

In an embodiment of the present disclosure, $M_{og}$ has 32 columns.

According to an embodiment of the present disclosure, an apparatus for sequence determination is provided. The apparatus includes: a permuting module configured to map a first bit sequence having a length of K bits to a specified position based on M_index to obtain a second bit sequence; an encoding module configured to apply Polar encoding to the second bit sequence to obtain a Polar encoded bit sequence; and a selecting module configured to select T bits based on the Polar encoded bit sequence as a bit sequence to be transmitted, where K and T are both non-negative integers and K≤T.

In an embodiment of the present disclosure, the apparatus further includes: a first transform module configured to apply a first predetermined transform to a first index matrix to obtain a second index matrix and obtain M_index based on the second index matrix. The first predetermined transform includes row permutation or column permutation.

In an embodiment of the present disclosure, the apparatus further includes: a second transform module configured to form a first bit sequence matrix from the Polar encoded bit sequence, and apply a second predetermined transform to the first bit sequence matrix to obtain a second bit sequence matrix. The second predetermined transform includes row permutation or column permutation. The selecting module is further configured to select T bits based on the second bit sequence matrix as the bit sequence to be transmitted.

In an embodiment of the present disclosure, the second index matrix is $M_{re}$, which is a matrix of $R_{re}$ rows and $C_{re}$ columns. The first index matrix is $M_{or}$, which is:

$$M_{or} = \begin{bmatrix} 0 & 1 & 2 & \cdots & C_{re}-1 \\ C_{re} & C_{re}+1 & C_{re}+2 & \cdots & 2C_{re}-1 \\ \vdots & \vdots & \vdots & \ddots & \vdots \\ (R_{re}-1) \times C_{re} & (R_{re}-1) \times C_{re}+1 & (R_{re}-1) \times C_{re}+2 & \cdots & R_{re} \times C_{re}-1 \end{bmatrix} \text{ or }$$

$$M_{or} = \begin{bmatrix} 0 & R_{re} & 2R_{re} & \cdots & (C_{re}-1) \times R_{re} \\ 1 & R_{re}+1 & 2R_{re}+1 & \cdots & (C_{re}-1) \times R_{re}+1 \\ \vdots & \vdots & \vdots & \ddots & \vdots \\ R_{re}-1 & 2R_{re}-1 & 3R_{re}-1 & \cdots & R_{re} \times C_{re}-1 \end{bmatrix},$$

where $R_{re} \times C_{re} \ge N$, $R_{re}$ and $C_{re}$ are both non-negative integers, and N is a length of the Polar encoded bit sequence.

In an embodiment of the present disclosure, when $R_{re}$ is constant, $C_{re}$ is a minimum value satisfying $R_{re} \times C_{re} \ge N$; or when $C_{re}$ is constant, $R_{re}$ is a minimum value satisfying $R_{re} \times C_{re} \ge N$.

In an embodiment of the present disclosure, the first index matrix is configured such that the second index matrix is obtained according to at least one of: the i-th column of $M_{re}$ being obtained from the $\pi_1(i)$-th column of $M_{or}$ by means of column permutation, where $0 \le i \le C_{re}-1$, $0 \le \pi_1(i) \le C_{re}-1$, $R_{re} \times C_{re} \ge N$, and i and $\pi_1(i)$ are both non-negative integers; or the j-th row of $M_{re}$ being obtained from the $\pi_2(j)$-th row of $M_{or}$, where $0 \le j \le R_{re}-1$, $0 \le \pi_2(j) \le R_{re}-1$, $R_{re} \times C_{re} \ge N$, and j and $\pi_2(j)$ are both non-negative integers.

In an embodiment of the present disclosure, the first bit sequence matrix is $M_{og}$. The second bit sequence matrix is $M_{vb}$, which is a matrix of $R_{vb}$ rows and $C_{vb}$ columns. $M_{og}$ is:

$$M_{og} = \begin{bmatrix} x_0 & x_1 & x_2 & \cdots & x_{C_{vb}-1} \\ x_{C_{vb}} & x_{C_{vb}+1} & x_{C_{vb}+2} & \cdots & x_{2C_{vb}-1} \\ \vdots & \vdots & \vdots & \ddots & \vdots \\ x_{(R_{vb}-1) \times C_{vb}} & x_{(R_{vb}-1) \times C_{vb}+1} & x_{(R_{vb}-1) \times C_{vb}+2} & \cdots & x_{R_{vb} \times C_{vb}-1} \end{bmatrix} \text{ or }$$

$$M_{og} = \begin{bmatrix} x_0 & x_{R_{vb}} & x_{2R_{vb}} & \cdots & x_{(C_{vb}-1) \times R_{vb}} \\ x_1 & x_{R_{vb}+1} & x_{2R_{vb}+1} & \cdots & x_{(C_{vb}-1) \times R_{vb}+1} \\ \vdots & \vdots & \vdots & \ddots & \vdots \\ x_{R_{vb}-1} & x_{2R_{vb}-1} & x_{3R_{vb}-1} & \cdots & x_{R_{vb} \times C_{vb}-1} \end{bmatrix},$$

where $x_0, x_1, x_2, \ldots, x_{R_{vb} \times C_{vb}-1}$ is the Polar encoded bit sequence, $R_{vb} \times C_{vb} \ge N$, $R_{vb}$ and $C_{vb}$ are both non-negative integers and N is a length of the Polar encoded bit sequence.

In an embodiment of the present disclosure, when $R_{vb}$ is constant, $C_{vb}$ is a minimum value satisfying $R_{vb} \times C_{vb} \ge N$; or when $C_{vb}$ is constant, $R_{vb}$ is a minimum value satisfying $R_{vb} \times C_{vb} \ge N$.

In an embodiment of the present disclosure, the first bit sequence matrix is configured such that the second bit sequence matrix is obtained according to at least one of: the g-th column of $M_{vb}$ being obtained from the $\pi_3(g)$-th column of $M_{og}$ by means of column permutation, where $0 \le g \le C_{vb}-1$, $0 \le \pi_3(g) \le C_{vb}-1$, $R_{vb} \times C_{vb} \ge N$, and g and $\pi_3(g)$ are both non-negative integers; or the h-th row of $M_{vb}$ being obtained from the $\pi_4(h)$-th row of $M_{og}$ by means of row permutation, where $0 \le h \le R_{vb}-1$, $0 \le \pi_4(h) \le R_{vb}-1$, $R_{vb} \times C_{vb} \ge N$, and h and $\pi_4(h)$ are both non-negative integers.

In an embodiment of the present disclosure, $M_{og}$ has 32 columns.

According to an embodiment of the present disclosure, a device is provided. The device includes: a processor configured to: map a first bit sequence having a length of K bits to a specified position based on M_index to obtain a second bit sequence; apply Polar encoding to the second bit sequence to obtain a Polar encoded bit sequence; and select T bits based on the Polar encoded bit sequence as a bit sequence to be transmitted, where K and T are both non-negative integers and K≤T, and a memory coupled to the processor.

In an embodiment of the present disclosure, the processor is further configured to: apply a first predetermined transform to a first index matrix to obtain a second index matrix; and obtain M_index based on the second index matrix. The first predetermined transform includes row permutation or column permutation.

In an embodiment of the present disclosure, the processor is further configured to: form a first bit sequence matrix from the Polar encoded bit sequence; apply a second predetermined transform to the first bit sequence matrix to obtain a second bit sequence matrix; and select T bits based on the second bit sequence matrix as the bit sequence to be transmitted. The second predetermined transform includes row permutation or column permutation.

In an embodiment of the present disclosure, the second index matrix is $M_{re}$, which is a matrix of $R_{re}$ rows and $C_{re}$ columns. The first index matrix is $M_{or}$, which is:

$$M_{or} = \begin{bmatrix} 0 & 1 & 2 & \cdots & C_{re}-1 \\ C_{re} & C_{re}+1 & C_{re}+2 & \cdots & 2C_{re}-1 \\ \vdots & \vdots & \vdots & \ddots & \vdots \\ (R_{re}-1) \times C_{re} & (R_{re}-1) \times C_{re}+1 & (R_{re}-1) \times C_{re}+2 & \cdots & R_{re} \times C_{re}-1 \end{bmatrix} \text{ or}$$

$$M_{or} = \begin{bmatrix} 0 & R_{re} & 2R_{re} & \cdots & (C_{re}-1) \times R_{re} \\ 1 & R_{re}+1 & 2R_{re}+1 & \cdots & (C_{re}-1) \times R_{re}+1 \\ \vdots & \vdots & \vdots & \ddots & \vdots \\ R_{re}-1 & 2R_{re}-1 & 3R_{re}-1 & \cdots & R_{re} \times C_{re}-1 \end{bmatrix},$$

where $R_{re} \times C_{re} \geq N$, $R_{re}$ and $C_{re}$ are both non-negative integers, and N is a length of the Polar encoded bit sequence.

In an embodiment of the present disclosure, when $R_{re}$ is constant, $C_{re}$ is a minimum value satisfying $R_{re} \times C_{re} \geq N$; or when $C_{re}$ is constant, $R_{re}$ is a minimum value satisfying $R_{re} \times C_{re} \geq N$.

In an embodiment of the present disclosure, the processor is further configured to obtain the second index matrix according to at least one of: the i-th column of $M_{re}$ being obtained from the $\pi_1(i)$-th column of $M_{or}$ by means of column permutation, where $0 \leq i \leq C_{re}-1$, $0 \leq \pi_1(i) \leq C_{re}-1$, $R_{re} \times C_{re} \geq N$, and i and $\pi_1(i)$ are both non-negative integers; or the j-th row of $M_{re}$ being obtained from the $\pi_2(j)$-th row of $M_{or}$, where $0 \leq j \leq R_{re}-1$, $0 \leq \pi_2(j) \leq R_{re}-1$, $R_{re} \times C_{re} \geq N$, and j and $\pi_2(j)$ are both non-negative integers.

In an embodiment of the present disclosure, the first bit sequence matrix is $M_{og}$. The second bit sequence matrix is $M_{vb}$, which is a matrix of $R_{vb}$ rows and $C_{vb}$ columns. $M_{og}$ is:

$$M_{og} = \begin{bmatrix} x_0 & x_1 & x_2 & \cdots & x_{C_{vb}-1} \\ x_{C_{vb}} & x_{C_{vb}+1} & x_{C_{vb}+2} & \cdots & x_{2C_{vb}-1} \\ \vdots & \vdots & \vdots & \ddots & \vdots \\ x_{(R_{vb}-1) \times C_{vb}} & x_{(R_{vb}-1) \times C_{vb}+1} & x_{(R_{vb}-1) \times C_{vb}+2} & \cdots & x_{R_{vb} \times C_{vb}-1} \end{bmatrix} \text{ or}$$

$$M_{og} = \begin{bmatrix} x_0 & x_{R_{vb}} & x_{2R_{vb}} & \cdots & x_{(C_{vb}-1) \times R_{vb}} \\ x_1 & x_{R_{vb}+1} & x_{2R_{vb}+1} & \cdots & x_{(C_{vb}-1) \times R_{vb}+1} \\ \vdots & \vdots & \vdots & \ddots & \vdots \\ x_{R_{vb}-1} & x_{2R_{vb}-1} & x_{3R_{vb}-1} & \cdots & x_{R_{vb} \times C_{vb}-1} \end{bmatrix},$$

where $x_0, x_1, x_2, \ldots, x_{R_{vb} \times C_{vb}-1}$ is the Polar encoded bit sequence, $R_{vb} \times C_{vb} \geq N$, $R_{vb}$ and $C_{vb}$ are both non-negative integers and N is a length of the Polar encoded bit sequence.

In an embodiment of the present disclosure, when $R_{vb}$ is constant, $C_{vb}$ is a minimum value satisfying $R_{vb} \times C_{vb} \geq N$; or when $C_{vb}$ is constant, $R_{vb}$ is a minimum value satisfying $R_{vb} \times C_{vb} \geq N$.

In an embodiment of the present disclosure, the processor is configured to obtain the second bit sequence matrix according to at least one of: the g-th column of $M_{vb}$ being obtained from the $\pi_3(g)$-th column of $M_{og}$ by means of column permutation, where $0 \leq g \leq C_{vb}-1$, $0 \leq \pi_3(g) \leq C_{vb}-1$, $R_{vb} \times C_{vb} \geq N$, and g and $\pi_3(g)$ are both non-negative integers; or the h-th row of $M_{vb}$ being obtained from the $\pi_4(h)$-th row of $M_{og}$ by means of row permutation, where $0 \leq h \leq R_{vb}-1$, $0 \leq \pi_4(h) \leq R_{vb}-1$, $R_{vb} \times C_{vb} \geq N$, and h and $\pi_4(h)$ are both non-negative integers.

In an embodiment of the present disclosure, $M_{og}$ has 32 columns.

According to another embodiment of the present disclosure, a storage medium is provided. The storage medium stores a program which, when executed, performs the method according to any of the above embodiments.

According to yet another embodiment of the present disclosure, a processor is provided. The processor is configured to execute a program for performing the method according to any of the above embodiments.

With the present disclosure, a first bit sequence having a length of K bits is mapped to a specified position based on M_index to obtain a second bit sequence. Polar encoding is applied to the second bit sequence to obtain a Polar encoded bit sequence. T bits are selected based on the Polar encoded bit sequence as a bit sequence to be transmitted. That is, the present disclosure provides a method for determining a bit sequence to be transmitted, capable of solving the problem in the related art associated with lack of a sequence determination scheme in the 5G New RAT.

BRIEF DESCRIPTION OF THE DRAWINGS

The present disclosure can be further understood with reference to the figures described below, which constitute a part of the present disclosure. The illustrative embodiments of the present disclosure and descriptions thereof are provided for explaining, rather than limiting, the present disclosure. In the figures.

DETAILED DESCRIPTION OF THE EMBODIMENTS

In the following, the present disclosure will be described in detail with reference to the figures, taken in conjunction with the embodiments. The embodiments, and the features thereof, can be combined with each other, provided that they do not conflict.

It is to be noted that, the terms such as "first", "second" and so on in the description, claims and figures are used for distinguishing among similar objects and do not necessarily imply any particularly order or sequence.

Embodiment 1

Figure 1:
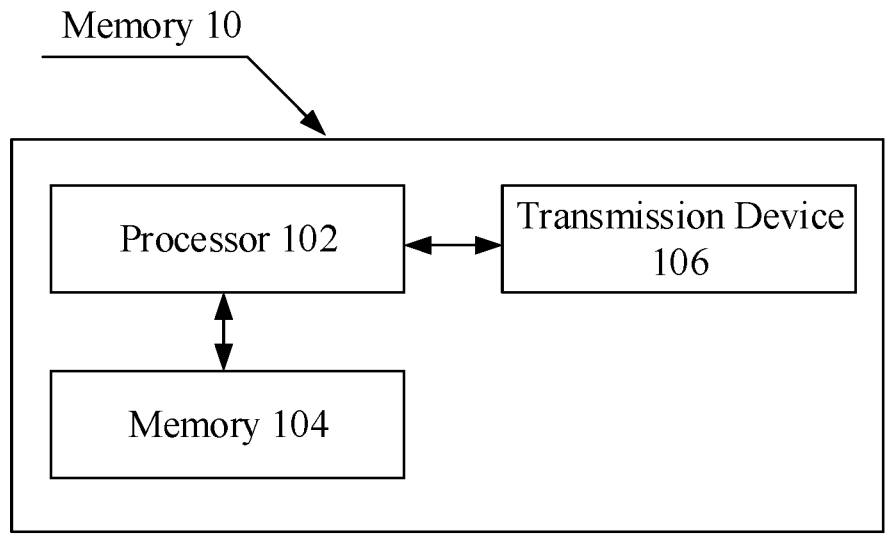
FIG. 1 is a block diagram showing a hardware structure of a mobile terminal in which a method for sequence determination can be applied according to an embodiment of the present disclosure.

The method according to Embodiment 1 of the present disclosure can be performed in a mobile terminal, a computer terminal or a similar computing device. When the method is performed in a mobile terminal for example, FIG. 1 is a block diagram showing a hardware structure of a mobile terminal in which a method for sequence determination can be applied according to an embodiment of the present disclosure. As shown in FIG. 1, the mobile terminal 10 can include: one or more processors 102 (only one is shown, including, but not limited to, a processing device such as a microprocessor or a Micro Control Unit (MCU) or a programmable logic device such as Field Programmable Gate Array (FPGA)), a memory 104 for storing data, and a transmission device 106 for providing communication functions. It can be appreciated by those skilled in the art that the structure shown in FIG. 1 is illustrative only, and the structure of the above electronic device is not limited thereto. For example, the mobile terminal 10 may include more or less components than those shown in FIG. 1, or have a different configuration from the one shown in FIG. 1.

The memory 104 can store software programs and modules of software applications, e.g., program instructions/modules associated with the method for sequence determination according to an embodiment of the present disclosure. The processor 102 performs various functional applications and data processing operations, i.e., performing the above method, by executing the software programs and modules stored in the memory 104. The memory 104 may include a random cache or a non-volatile memory such as one or more magnetic storage devices, flash memories or other non-volatile solid-state memories. In some examples, the memory 104 may further include one or more memories provided remotely from the processor 102, which can be connected to the mobile terminal 10 via a network. Examples of such network include, but not limited to, Internet, an intranet of an enterprise, a Local Area Network (LAN), a mobile communication network, or any combination thereof.

The transmission device 106 can transmit or receive data via a network. The network can be e.g., a wireless network provided by a communication provider of the mobile terminal 10. In an example, the transmission device 106 includes a Network Interface Controller (NIC), which can be connected to other network devices via a base station for communication with Internet. In an example, the transmission device 106 can be a Radio Frequency (RF) module for communicating with Internet wirelessly.

Alternatively, the method according to Embodiment 1 of the present disclosure can be, but not limited to be, performed in network device, e.g., a base station.

Figure 2:
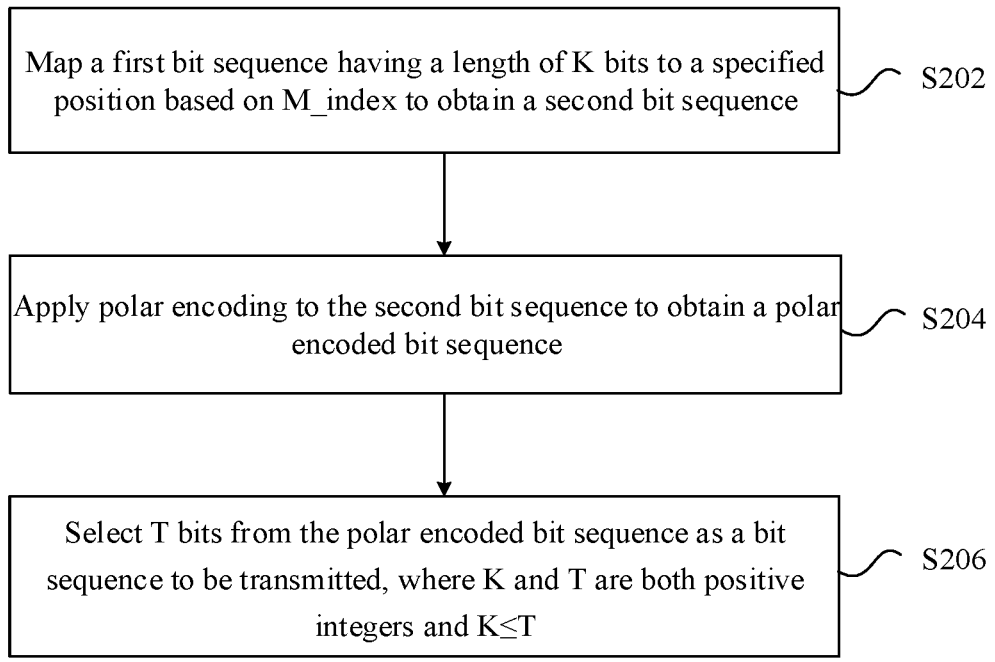
FIG. 2 is a flowchart illustrating a method for sequence determination according to an embodiment of the present disclosure.

In this embodiment, a method performed in the above mobile terminal or network device for sequence determination is provided. FIG. 2 is a flowchart illustrating a method for sequence determination according to this embodiment. As shown in FIG. 2, the process includes the following steps.

At step S202, a first bit sequence having a length of K bits is mapped to a specified position based on M_index to obtain a second bit sequence.

At step S204, Polar encoding is applied to the second bit sequence to obtain a Polar encoded bit sequence.

At step S206, T bits are selected based on the Polar encoded bit sequence as a bit sequence to be transmitted, where K and T are both non-negative integers and K≤T.

With the above steps, a first bit sequence having a length of K bits is mapped to a specified position based on M_index to obtain a second bit sequence. Polar encoding is applied to the second bit sequence to obtain a Polar encoded bit sequence. T bits are selected based on the Polar encoded bit sequence as a bit sequence to be transmitted. That is, the present disclosure provides a method for determining a bit sequence to be transmitted, capable of solving the problem in the related art associated with lack of a sequence determination scheme in the 5G New RAT.

It is to be noted that the above method may further include, prior to the step S202: applying a first predetermined transform to a first index matrix to obtain a second index matrix and obtaining M_index based on the second index matrix. The first predetermined transform includes row permutation or column permutation. That is, in the Polar encoding process, the same transform pattern is applied to one dimension of the first index matrix, such that only the other dimension of the first index matrix needs to be changed when a mother code length changes. Thus, the hardware can be reused in the implementation of Polar codes, thereby solving the problem in the related art associated with incapability of hardware reuse in the Polar encoding process.

It is to be noted that the method can further include, prior to selecting T bits based on the Polar encoded bit sequence as the bit sequence to be transmitted: forming a first bit sequence matrix from the Polar encoded bit sequence; and applying a second predetermined transform to the first bit sequence matrix to obtain a second bit sequence matrix. The second predetermined transform includes row permutation or column permutation. The operation of selecting T bits based on the Polar encoded bit sequence as the bit sequence to be transmitted includes: selecting T bits based on the second bit sequence matrix as the bit sequence to be transmitted. That is, the same transform pattern is applied to one dimension of the first bit sequence matrix, such that only the other dimension of the first bit sequence matrix needs to be changed when a mother code length changes. Thus, the hardware can be further reused in the implementation of Polar codes, thereby further solving the problem in the related art associated with incapability of hardware reuse in the Polar encoding process.

It is to be noted that the above method can further include, subsequent to applying the second predetermined transform to the first bit sequence matrix to obtain the second bit sequence matrix: storing bit sequences in the second bit sequence matrix in a buffer and selecting T bits from the buffer as the bit sequence to be transmitted.

It is to be noted that the above buffer can be, but not limited to be, embodied as another physical or logic entity.

It is to be noted that the above first index matrix can be, but not limited to, a two dimensional, three dimensional or multi-dimensional matrix. In an example where the above first index matrix is a two dimensional matrix, the above first predetermined transform can be embodied such that a row transform pattern or a column transform pattern for the first index matrix is the same.

In an example where the above first index matrix is a two dimensional matrix, in an embodiment of the present disclosure, the second index matrix is $M_{re}$, which is a matrix of $R_{re}$ rows and $C_{re}$ columns. The first index matrix is $M_{or}$, which is:

$$M_{or} = \begin{bmatrix} 0 & 1 & 2 & \cdots & C_{re}-1 \\ C_{re} & C_{re}+1 & C_{re}+2 & \cdots & 2C_{re}-1 \\ \vdots & \vdots & \vdots & \ddots & \vdots \\ (R_{re}-1) \times C_{re} & (R_{re}-1) \times C_{re}+1 & (R_{re}-1) \times C_{re}+2 & \cdots & R_{re} \times C_{re}-1 \end{bmatrix} \text{ or}$$

$$M_{or} = \begin{bmatrix} 0 & R_{re} & 2R_{re} & \cdots & (C_{re}-1) \times R_{re} \\ 1 & R_{re}+1 & 2R_{re}+1 & \cdots & (C_{re}-1) \times R_{re}+1 \\ \vdots & \vdots & \vdots & \ddots & \vdots \\ R_{re}-1 & 2R_{re}-1 & 3R_{re}-1 & \cdots & R_{re} \times C_{re}-1 \end{bmatrix},$$

where $R_{re} \times C_{re} \geq N$, $R_{re}$ and $C_{re}$ are both non-negative integers, and N is a length of the Polar encoded bit sequence.

It is to be noted that the above $R_{re}$ and $C_{re}$ have one of the following characteristics: when $R_{re}$ is constant, $C_{re}$ is a minimum value satisfying $R_{re} \times C_{re} \geq N$; or when $C_{re}$ is constant, $R_{re}$ is a minimum value satisfying $R_{re} \times C_{re} \geq N$.

It is to be noted that the operation of applying the first predetermined transform to the first index matrix to obtain the second index matrix includes at least one of: the i-th column of $M_{re}$ being obtained from the $\pi_1(i)$-th column of $M_{or}$ by means of column permutation, where $0 \leq i \leq C_{re}-1$, $0 \leq \pi_1(i) \leq C_{re}-1$, $R_{re} C_{re} \geq N$, and i and $\pi_1(i)$ are both non-negative integers; or the j-th row of $M_{re}$ being obtained from the $\pi_2(j)$-th row of $M_{or}$, where $0 \leq j \leq R_{re}-1$, $0 \leq \pi_2(j) \leq R_{re}-1$, $R_{re} \times C_{re} \geq N$, and j and $\pi_2(j)$ are both non-negative integers.

In the Polar encoding process, as the permutation pattern from $M_{or}$ to $M_{re}$ is the same for each row, if the number of columns of each of $M_{or}$ and $M_{re}$ is fixed, when the mother code length of the Polar codes changes, only the number of rows of each of $M_{or}$ and $M_{re}$ needs to be changed. Alternatively, the permutation pattern from $M_{or}$ to $M_{re}$ can be the same for each column and, if the number of rows of each of $M_{or}$ and $M_{re}$ is fixed, when the mother code length of the Polar codes changes, only the number of columns of each of $M_{or}$ and $M_{re}$ needs to be changed. In this way, in the implementation of the Polar codes, if the hardware for mapping input bit sequences to input positions in the encoder is designed for the maximum mother code length $N_{max}$, it also applies to situations where the mother code length is smaller than $N_{max}$, which allows reuse of the hardware.

It is to be noted that the number of columns of the above $M_{og}$ is 32.

It is to be noted that the above $\pi_1(i)$ can be obtained according to at least one of:

Scheme 1: $\pi_1(i)$=BRO(i), where BRO( ) denotes a bit reverse ordering operation which includes: converting a decimal number i into a first binary number $(B_{n1-1}, B_{n1-2}, \ldots, B_0)$, reversing the first binary number to obtain a second binary number $(B_0, B_1, \ldots, B_{n1-1})$ and converting the second binary number into a decimal number $\pi_1(i)$, where $n1=\log_2(C_{re})$ and $0 \leq i \leq C_{re}-1$;

Scheme 2: $\pi_1(i)=\{S1, S2, S3\}$, where $S1=\{0, 1, \ldots, i1-1\}$, $S2=\{i2, i3, i2+1, i3+1, \ldots, i4, i5\}$, and S3 is a set of elements in $\{0, 1, \ldots, C_{re}-1\}$ other than those included in S1 and S2, where $C_{re}/8 \leq i1 \leq i2 \leq C_{re}/3$, $i2 \leq i4 \leq i3 \leq 2C_{re}/3$, $i3 \leq i5 \leq C_{re}-1$, i1, i2, i3, i4 and i5 are all non-negative integers, and an intersection of any two of S1, S2 and S3 is null; or Scheme 3: $\pi_1(i)=\{I\}$, where $\{I\}$ is a sequence obtained by organizing numerical results of applying a function f(r) to column indices r of $M_{or}$ in ascending or descending order, where $0 \leq r \leq C_{re}-1$.

The above three schemes will be explained with reference to the following examples.

For Scheme 1, if $C_{re}=8$, i=6, then $n1=\log_2(8)=3$. i=6 is converted into a binary number $(B_2, B_1, B_0)=(1, 1, 0)$. The binary number $(B_2, B_1, B_0)=(1, 1, 0)$ is reversed to obtain $(B_0, B_1, B_2)=(0, 1, 1)$. $(B_0, B_1, B_2)=(0, 1, 1)$ is then converted into a decimal number $\pi_1(i)=3$.

For Scheme 2, if $C_{re}=8$, $i_1=2$, $i_2=2$, $i_3=4$, $i_4=3$ and $i_5=5$, then $S1=\{0, 1\}$, $S2=\{2, 4, 3, 5\}$, $S3=\{6, 7\}$, and $\pi_1(i)=\{0, 1, 2, 4, 3, 5, 6, 7\}$.

For Scheme 3, $C_{re}=8$, $\{f(0), \ldots, f(7)\}=\{0, 1, 1.18, 2.18, 1.41, 2.41, 2.60, 3.60\}$. $f(0), \ldots, f(7)$ is organized in ascending order to obtain 1 i(i)=$\{1, 2, 3, 5, 4, 6, 7, 8\}$.

It is to be noted that f(r) includes at least one of:

$$f(r) = \sum_{m1=0}^{n1-1} B_{m1} \times 2^{\frac{m1}{k}},$$

$(B_{n1-1}, B_{n1-2}, \ldots, B_0)$ is a binary representation of the index r, where $0 \leq m1 \leq n1-1$, $n1=\log_2(C_{re})$, and k is a non-negative integer (e.g., $C_{re}=8$, i=6, k=4, $n1=\log_2(8)=3$, i=6 is converted into a binary number $(B_2, B_1, B_0)=(1, 1, 0)$, $$f(6) = \sum_{m1=0}^{n1-1} B_{m1} \times 2^{\frac{m1}{4}} = 0 \times 2^{\frac{0}{4}} + 1 \times 2^{\frac{1}{4}} + 1 \times 2^{\frac{2}{4}} = 2.4142,$$

where ( ) $\Sigma$ is a summation equation);

initializing a function value corresponding to r as $f_1^{(r)}$, and obtaining a function value for each element $f_{C_{re}}^{(r)}$ after n1-th iteration in accordance with a first iteration equation:

$$\begin{cases} f_{2m2}^{(2r-1)} = \varphi^{-1}\left(1 - [1 - \varphi(f_{m2}^{(r_1)})][1 - \varphi(f_{m2}^{(r_2)})]\right) \\ f_{2m2}^{(2r)} = f_{m2}^{(r_1)} + f_{m2}^{(r_2)} \end{cases},$$

where $f_1^{(r)}$ is a mean log likelihood ratio (e.g., $\varphi(z)$ can be approximately:

$$\varphi(z) = \begin{cases} 1 - \frac{1}{\sqrt{4\pi z}} \int_{-\infty}^{+\infty} \tanh\frac{u}{2} \exp(-(u-z)^2/(4z)) du & z > 0 \\ 1 & z = 0 \end{cases},$$

where the nodes $i_1$ and $i_2$ involving in the iterative calculation are dependent on the structure of the Polar encoder);

(Let the initial value $f_1^{(r)} = 2/\sigma^2$, where $\sigma^2$ is the variance of noise, $C_{re}=8$, $\sigma^2=0$. $f_1^{(r)}$ is substituted into the iteration equation to obtain $f_2^{(r)}$, which is then substituted into the iteration equation to obtain $f_4^{(r)}$, and so on, until $f_8^{(r)}$ is calculated, where $f(r)=f_8^{(r)}$, $0 \leq r \leq C_{re}-1$, $\{f(0), \ldots, f(7)\}=\{0.04, 0.41, 0.61, 3.29, 1.00, 4.56, 5.78, 16.00\}$); or initializing a function value corresponding to r as $f_1^{(r)}$, and obtaining a function value for each element $f_{C_{re}}^{(r)}$ after n1-th iteration in accordance with a second iteration equation:

$$\begin{cases} f_{2m3}^{(2r-1)} = f_{m3}^{(r_1)} + f_{m3}^{(r_2)} - f_{m3}^{(r_1)} f_{m3}^{(r_2)} \\ f_{2m3}^{(2r)} = f_{m3}^{(r_1)} f_{m3}^{(r_2)} \end{cases},$$

where $f_1^{(r)}$ is mutual information, where $1 \leq m2 \leq n1$, $1 \leq m3 \leq n1$, and r1, r2, 2r and 2r-1 are all integers larger than or equal to 0 and smaller than or equal to $C_{re}-1$ (the nodes $i_1$ and $i_2$ involving in the iterative calculation are dependent on the structure of the Polar encoder);

(Let $f_1^{(r)}=0.5$ and $C_{re}=8$. $f_1^{(r)}$ is substituted into the iteration equation to obtain $f_2^{(r)}$, which is then substituted into the iteration equation to obtain $f_4^{(r)}$, and so on, until $f_8^{(r)}$ is calculated, where $f(r)=f_8^{(r)}$, $0 \leq i \leq C_{re}-1$, $\{f(0), \ldots, f(7)\}=\{0.008, 0.152, 0.221, 0.682, 0.313, 0.779, 0.850, 0.991\}$).

It is to be noted that the above $\pi_2(j)$ can be obtained according to at least one of:

$\pi_2(j)=BRO(j)$, where $BRO()$ denotes a bit reverse ordering operation which includes: converting a decimal number j into a third binary number $(B_{n2-1}, B_{n2-2}, \ldots, B_0)$, reversing the third binary number to obtain a fourth binary number $(B_0, B_1, \ldots, B_{n2-1})$ and converting the fourth binary number into a decimal number $\pi_2(j)$, where $n2=\log_2(R_{re})$ and $0 \leq j \leq R_{re}-1$;

$\pi_2(j)=\{S4, S5, S6\}$, where $S4=\{0, 1, \ldots, j1-1\}$, $S5=\{j2, j3, j2+1, j3+1, \ldots, j4, j5\}$, and S6 is a set of elements in $\{0, 1, \ldots, R_{re}-1\}$ other than those included in S4 and S5, where $R_{re}/8 \leq j1 \leq j2 \leq R_{re}/3$, $j2 \leq j4 \leq j3 \leq 2 R_{re}/3$, $j3 \leq j5 \leq R_{re}-1$, j1, j2, j3, j4 and j5 are all non- negative integers, and an intersection of any two of S4, S5 and S6 is null; or $\pi_2(j)=\{J\}$, where $\{J\}$ is a sequence obtained by organizing numerical results of applying a function f(s) to row indices s of $M_{or}$ in ascending or descending order, where $0 \leq s \leq R_{re}$.

It is to be noted that f(s) includes at least one of:

$$f(s) = \sum_{m4=0}^{n2-1} B_{m4} \times 2^{\frac{m4}{k}},$$

$(B_{n2-1}, B_{n2-2}, \ldots, B_0)$ is a binary representation of the index s, where $0 \leq m4 \leq n2-1$, $n2=\log_2(R_{re})$, and k is a non-negative integer;

initializing a function value corresponding to s as $f_1^{(s)}$, and obtaining a function value for each element $f_{R_{re}}^{(s)}$ after n2-th iteration in accordance with a third iteration equation:

$$\begin{cases} f_{2m5}^{(2s-1)} = \varphi^{-1}\left(1 - [1 - \varphi(f_{m5}^{(s_1)})][1 - \varphi(f_{m5}^{(s_2)})]\right) \\ f_{2m5}^{(2s)} = f_{m5}^{(s_1)} + f_{m5}^{(s_2)} \end{cases},$$

where $f_1^{(s)}$ is a mean log likelihood ratio; or initializing a function value corresponding to s as f(s), and obtaining a function value for each element $f_{R_{re}}^{(s)}$ by updating $f_1^{(s)}$ for n2 iterations in accordance with a fourth iteration equation:

$$\begin{cases} f_{2m6}^{(2s-1)} = f_{m6}^{(s_1)} + f_{m6}^{(s_2)} - f_{m6}^{(s_1)} f_{m6}^{(s_2)} \\ f_{2m6}^{(2s)} = f_{m6}^{(s_1)} f_{m6}^{(s_2)} \end{cases},$$

where $f_1^{(s)}$ is mutual information, where $1 \leq m5 \leq n2$, $1 \leq m6 \leq n2$, s1, s2, 2s and 2s-1 are all integers larger than or equal to 0 and smaller than or equal to $R_{re}-1$.

It is to be noted that, for explanations for the above $\pi_2(j)$, reference can be made to $\pi_1(i)$.

It is to be noted that the above first bit sequence matrix can be, but not limited to, a two dimensional, three dimensional or multi-dimensional matrix. In an example where the above first bit sequence matrix is a two dimensional matrix, the above second predetermined transform can be embodied such that a row transform pattern or a column transform pattern for the first bit sequence matrix is the same.

It is to be noted that the first bit sequence matrix is $M_{og}$. The second bit sequence matrix is $M_{vb}$, which is a matrix of $R_{vb}$ rows and $C_{vb}$ columns. $M_{og}$ is:

$$M_{og} = \begin{bmatrix} x_0 & x_1 & x_2 & \cdots & x_{C_{vb}-1} \\ x_{C_{vb}} & x_{C_{vb}+1} & x_{C_{vb}+2} & \cdots & x_{2C_{vb}-1} \\ \vdots & \vdots & \vdots & \ddots & \vdots \\ x_{(R_{vb}-1) \times C_{vb}} & x_{(R_{vb}-1) \times C_{vb}+1} & x_{(R_{vb}-1) \times C_{vb}+2} & \cdots & x_{R_{vb} \times C_{vb}-1} \end{bmatrix} \text{ or}$$

$$M_{og} = \begin{bmatrix} x_0 & x_{R_{vb}} & x_{2R_{vb}} & \cdots & x_{(C_{vb}-1) \times R_{vb}} \\ x_1 & x_{R_{vb}+1} & x_{2R_{vb}+1} & \cdots & x_{(C_{vb}-1) \times R_{vb}+1} \\ \vdots & \vdots & \vdots & \ddots & \vdots \\ x_{R_{vb}-1} & x_{2R_{vb}-1} & x_{3R_{vb}-1} & \cdots & x_{R_{vb} \times C_{vb}-1} \end{bmatrix},$$

where $x_0, x_1, x_2, \ldots, x_{R_{vb} \times C_{vb}-1}$ is the Polar encoded bit sequence, $R_{vb} \times C_{vb} \geq N$, $R_{vb}$ and $C_{vb}$ are both non-negative integers and N is a length of the Polar encoded bit sequence.

It is to be noted that when $R_{vb}$ is constant, $C_{vb}$ is a minimum value satisfying $R_{vb} \times C_{vb} \geq N$; or when $C_{vb}$ is constant, $R_{vb}$ is a minimum value satisfying $R_{vb} \times C_{vb} \geq N$.

It is to be noted that the operation of applying the second predetermined transform to the first bit sequence matrix to obtain the second bit sequence matrix can include at least one of: the g-th column of $M_{vb}$ being obtained from the $\pi_3(g)$-th column of $M_{og}$ by means of column permutation, where $0 \leq g \leq C_{vb}-1$, $0 \leq \pi_3(g) \leq C_{vb}-1$, $R_{vb} \times C_{vb} \geq N$, and g and $\pi_3(g)$ are both non-negative integers; or the h-th row of $M_{vb}$ being obtained from the $\pi_4(h)$-th row of $M_{og}$ by means of row permutation, where $0 \leq h \leq R_{vb}-1$, $0 \leq \pi_4(h) \leq R_{vb}-1$, $R_{vb} \times C_{vb} \geq N$, and h and $\pi_4(h)$ are both non-negative integers.

In the encoding process, the process of selecting appropriate bits from the encoded bit sequence to form a bit sequence to be transmitted is a rate matching process. In the Polar encoding process, as the permutation pattern from $M_{og}$ to $M_{vb}$ is the same for each row, if the number of columns of each of $M_{og}$ and $M_{vb}$ is fixed, when the mother code length of the Polar codes changes, only the number of rows of each of $M_{og}$ and $M_{vb}$ needs to be changed. Alternatively, the permutation pattern from $M_{og}$ to $M_{vb}$ can be the same for each column and, if the number of rows of each of $M_{og}$ and $M_{vb}$ is fixed, when the mother code length of the Polar codes changes, only the number of columns of each of $M_{og}$ and $M_{vb}$ needs to be changed.

In this way, in the implementation of the Polar codes, if the hardware for mapping input bit sequences to input positions in the encoder is designed for the maximum mother code length $N_{max}$, it also applies to situations where the mother code length is smaller than $N_{max}$, which allows reuse of the hardware.

It is to be noted that $\pi_3(g)$ can be obtained according to at least one of:

$\pi_3(g)=BRO(g)$, where BRO( ) denotes a bit reverse ordering operation which includes: converting a decimal number g into a fifth binary number $(B_{n3-1}, B_{n3-2}, \ldots, B_0)$, reversing the fifth binary number to obtain a sixth binary number $(B_0, B_1, \ldots, B_{n3-1})$ and converting the sixth binary number into a decimal number $\pi_3(g)$, where $n3=\log_2(C_{vb})$ and $0 \leq g \leq C_{vb}-1$;

$\pi_3(g)=\{S1, S2, S3\}$, where $S1=\{0, 1, \ldots, g1-1\}$, $S2=\{g2, g3, g2+1, g3+1, \ldots, g4, g5\}$, and S3 is a set of elements in $\{0, 1, \ldots, C_{vb}-1\}$ other than those included in S1 and S2, where $C_{vb}/8 \leq g1 \leq g2 \leq C_{vb}/3$, $g2 \leq g4 \leq g3 \leq 2C_{vb}/3$, $g3 \leq g5 \leq C_{vb}-1$, g1, g2, g3, g4 and g5 are all non- negative integers, and an intersection of any two of S1, S2 and S3 is null;

$\pi_3(g)=\{G\}$, where $\{G\}$ is a sequence obtained by organizing numerical results of applying a function $f(\alpha)$ to column indices $\alpha$ of $M_{og}$ in ascending or descending order, where $0 \leq \alpha \leq C_{vb}-1$;

$\pi_3(g)=\{Q1, Q2, Q3\}$, where $Q2=\{q1, q2, q1+1, q2+1, \ldots, q3, q4\}$, $0 \leq q1 \leq q3 \leq (C_{vb}-1)/2$, $0 \leq q2 \leq q4 \leq (C_{vb}-1)/2$, q1, q2, q3, q4 and q5 are all non-negative integers, Q1 and Q3 are other elements in a difference set between $\{0, 1, \ldots, C_{vb}-1\}$ and Q2, and an intersection of any two of Q1, Q2 and Q3 is null;

$\pi_3(g)$ being different from a predefined sequence V1 in nV1 positions, where $V1=\{0, 1, 2, 3, 4, 5, 6, 7, 8, 9, 10, 11, 12, 16, 13, 17, 14, 18, 15, 19, 20, 24, 21, 22, 25, 26, 28, 23, 27, 29, 30, 31\}$, $0 \leq nV1 \leq 23$; or $\pi_3(g)$ being different from a predefined sequence V2 in nV2 positions, where $V2=\{0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31\}$, $0 \leq nV2 \leq 3$.

It is to be noted that $f(\alpha)$ includes at least one of:

$$f(\alpha) = \sum_{m6=0}^{n3-1} B_{m6} \times 2^{\frac{m6}{k}},$$

$(B_{n3-1}, B_{n3-2}, \ldots, B_0)$ is a binary representation of the index $\alpha$, where $0 \leq m6 \leq n3-1$, $n3=\log_2(C_{vb})$, and k is a non-negative integer;

initializing a function value corresponding to $\alpha$ as $f_1^{(\alpha)}$, and obtaining a function value for each element $f_{C_{vb}}^{(\alpha)}$ after n3-th iteration in accordance with a fifth iteration equation:

$$\begin{cases} f_{2m7}^{(2\alpha-1)} = \varphi^{-1}(1 - [1 - \varphi(f_{m7}^{(\alpha_1)})][1 - \varphi(f_{m7}^{(\alpha_2)})]) \\ f_{2m7}^{(2\alpha)} = f_{m7}^{(\alpha_1)} + f_{m7}^{(\alpha_2)} \end{cases},$$

where $f_1^{(\alpha)}$ is a mean log likelihood ratio; or initializing a function value corresponding to s as $f_1^{(\alpha)}$, and obtaining a function value for each element after n3-th iteration in accordance with a sixth iteration equation:

$$\begin{cases} f_{2m8}^{(2\alpha-1)} = f_{m8}^{(\alpha_1)} + f_{m8}^{(\alpha_2)} - f_{m8}^{(\alpha_1)} f_{m8}^{(\alpha_2)} \\ f_{2m8}^{(2\alpha)} = f_{m8}^{(\alpha_1)} f_{m8}^{(\alpha_2)} \end{cases},$$

where $f_1^{(\alpha)}$ is mutual information, where $1 \leq m7 \leq n3$, $1 \leq m8 \leq n3$, and $\alpha 1$, $\alpha 2$, $2\alpha$ and $2\alpha-1$ are all integers larger than or equal to 0 and smaller than or equal to $C_{vb}-1$.

It is to be noted that $\pi_4(h)$ can be obtained according to at least one of:

$\pi_4(h)=BRO(h)$, where BRO( ) denotes a bit reverse ordering operation which includes: converting a decimal number h into a seventh binary number $(B_{n4-1}, B_{n4-2}, \ldots, B_0)$, reversing the seventh binary number to obtain an eighth binary number $(B_0, B_1, \ldots, B_{n4-1})$ and converting the eighth binary number into a decimal number $\pi_4(h)$, where $n4=\log_2(R_{vb})$ and $0 \leq h \leq R_{vb}-1$;

$\pi_4(h)=\{S4, S5, S6\}$, where $S4=\{0, 1, \ldots, h1-1\}$, $S5=\{h2, h3, h2+1, h3+1, \ldots, h4, h5\}$, and S6 is a set of elements in $\{0, 1, \ldots, R_{vb}-1\}$ other than those included in S4 and S5, where $R_{vb}/8 \leq h1 \leq h2 \leq R_{vb}/3$, $h2 \leq h4 \leq h3 \leq 2R_{vb}/3$, $h3 \leq h5 \leq R_{vb}-1$, h1, h2, h3, h4 and h5 are all non- negative integers, and an intersection of any two of S4, S5 and S6 is null;

$\pi_4(h)=\{H\}$, where $\{H\}$ is a sequence obtained by organizing numerical results of applying a function $f(\beta)$ to row indices $\beta$ of $M_{og}$ in ascending or descending order, where $0 \leq \beta \leq R_{vb}-1$;

$\pi_4(h)=\{O1, O2, O3\}$, where $O2=\{o1, o2, o1+1, o2+1, \ldots, o3, o4\}$, $0 \leq o1 \leq o3 \leq (R_{vb}-1)/2$, $0 \leq o2 \leq o4 \leq (R_{vb}-1)/2$, o1, o2, o3, o4 and o5 are all non-negative integers, O1 and O3 are other elements in a difference set between $\{0, 1, \ldots, R_{vb}-1\}$ and O2, and an intersection of any two of O1, O2 and O3 is null;

$\pi_4(h)$ being different from a predefined sequence VV1 in nVV1 positions, where $VV1=\{0, 1, 2, 3, 4, 5, 6, 7, 8, 9, 10, 11, 12, 16, 13, 17, 14, 18, 15, 19, 20, 24, 21, 22, 25, 26, 28, 23, 27, 29, 30, 31\}$, $0 \leq nVV1 \leq 23$; or $\pi_4(h)$ being different from a predefined sequence VV2 in nVV2 positions, where $VV2=\{0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31\}$, $0 \leq nVV2 \leq 3$.

It is to be noted that $f(\beta)$ includes at least one of:

$$f(\beta) = \sum_{m9=0}^{n4-1} B_{m9} \times 2^{\frac{m9}{k}},$$

$(B_{n4-1}, B_{n4-2}, \ldots, B_0)$ is a binary representation of the index $\beta$, where $0 \leq m9 \leq n4-1$, $n4=\log_2(R_{vb})$, and k is a non-negative integer;

initializing a function value corresponding to $\beta$ as $f_1^{(\beta)}$, and obtaining a function value for each element $f_{R_{vb}}^{(\beta)}$ after n4-th iteration in accordance with a seventh iteration equation:

$$\begin{cases} f_{2m10}^{(2\beta-1)} = \varphi^{-1}\left(1 - [1 - \varphi(f_{m10}^{(\beta_1)})][1 - \varphi(f_{m10}^{(\beta_2)})]\right) \\ f_{2m10}^{(2\beta)} = f_{m10}^{(\beta_1)} + f_{m10}^{(\beta_2)} \end{cases},$$

where is a mean log likelihood ratio; or initializing a function value corresponding to β as $f_1^{(\beta)}$, and obtaining a function value for each element $f_{R_{vb}}^{(\beta)}$ after n4-th iteration in accordance with an eighth iteration equation:

$$\begin{cases} f_{2m11}^{(2\beta-1)} = f_{m11}^{(\beta_1)} + f_{m11}^{(\beta_2)} - f_{m11}^{(\beta_1)} f_{m11}^{(\beta_2)} \\ f_{2m11}^{(2\beta)} = f_{m11}^{(\beta_1)} f_{m11}^{(\beta_2)} \end{cases},$$

where $f_1^{(\beta)}$ is mutual information, where $1 \le m10 \le n4$, $1 \le m11 \le n4$, and β1, β2, 2β and 2β−1 are all integers larger than or equal to 0 and smaller than or equal to $R_{vb}-1$.

It is to be noted that, for explanations for $\pi_3(g)$ and $\pi_4(h)$, reference can be made to $\pi_1(i)$ and descriptions thereof will be omitted here.

In an embodiment of the present disclosure, the operation of obtaining M_index based on the second index matrix includes: selecting a predetermined number of indices from $M_{re}$ row by row, column by column or diagonal by diagonal, as M_index.

In an embodiment of the present disclosure, the operation of selecting the predetermined number of indices from $M_{re}$ column by column includes: selecting $\pi_p$ indices from the p-th column of $M_{re}$, where $\Sigma_{p=1}^{C_{re}} K_p = K$, p is an integer, and $1 \le p \le C_{re}$. The operation of selecting the predetermined number of indices from $M_{re}$ row by row includes: selecting $\pi_q$ indices from the q-th row of $M_{re}$, where $\Sigma_{q=1}^{R_{re}} K_q = K$, q is an integer, and $1 \le q \le R_{re}$. The operation of selecting the predetermined number of indices from $M_{re}$ diagonal by diagonal includes: selecting $K_\delta$ indices from the δ-th diagonal of $M_{re}$, where $$\sum_{\delta=-min(R_{re},C_{re})+1}^{max(R_{re},C_{re})-1} K_\delta = K,$$

δ is an integer, and $-min(R_{re}, C_{re})+1 \le \delta \le max(R_{re}, C_{re})-1$, where $min(R_{re}, C_{re})$ denotes the smaller of $R_{re}$ and $C_{re}$, and $max(R_{re}, C_{re})$ denotes the larger of $R_{re}$ and $C_{re}$.

In an embodiment of the present disclosure, the operation of selecting the predetermined number of indices from $M_{re}$ column by column includes at least one of: selecting $K_{ic1}$ indices from the $1^{st}, 2^{nd}, C_1$-th columns of $M_{re}$, where $\Sigma_{ic1=1}^{C_1} K_{ic1}=K$, $1 \le ic1 \le C_1$, $1 \le C_1 \le C_{re}$, and ic1 and $C_1$ are integers; selecting $K_{ic2}$ indices from the $C_2$-th, $(C_2+1)$-th, . . . , $C_3$-th columns of $M_{re}$, where $\Sigma_{ic2=C_2}^{C_3} K_{ic2}=K$, $C_2 \le ic2 \le C_3$, $1 \le C_2 \le C_3 \le C_{re}$, and ic2, $C_2$ and $C_3$ are integers; or selecting $K_{ic3}$ indices from the $C_4$-th, $(C_4+1)$-th, . . . , $C_{re}$-th columns of $M_{re}$, where $\Sigma_{ic3=C_4}^{C_{re}} K_{ic3}=K$, $C_4 \le ic3 \le C_{re}$, $1 \le C_4 \le C_{re}$, and ic3 and $C_4$ are integers.

In an embodiment of the present disclosure, the operation of selecting the predetermined number of indices from $M_{re}$ row by row includes at least one of: selecting $K_{ir1}$ indices from the $1^{st}, 2^{nd}, \ldots, R_1$-th rows of $M_{re}$, where $\Sigma_{ir1=1}^{R_1} K_{ir1}=K$, $1 \le ir1 \le R_1$, $1 \le R_1 \le R_{re}$, and ir1 and $R_1$ are integers; selecting $K_{ir2}$ indices from the $R_2$-th, $(R_2+1)$-th, . . . , $R_3$-th rows of $M_{re}$, where $\Sigma_{ir2=R_2}^{R_3} K_{ir2}=K$, $R_2 \le ir2 \le R_3$, $1 \le R_2 \le R_3 \le R_{re}$, and ir2, $R_2$ and $R_3$ are integers; or selecting $K_{ir3}$ indices from the $R_4$-th, $(R_4+1)$-th, . . . , $R_{re}$-th rows of $M_{re}$, where $\Sigma_{ir3=R_4}^{R_{re}} K_p=K$, $1 \le R_4 \le R_{re}$, and ir3 and $R_4$ are integers.

In an embodiment of the present disclosure, the operation of selecting the predetermined number of indices from $M_{re}$ diagonal by diagonal includes at least one of: selecting $K_{id1}$ indices from the $(-min(R_{re}, C_{re})+1)$-th, $(-min(R_{re}, C_{re})+2)$-th, . . . , $D_1$-th diagonals of $M_{re}$, where $\Sigma_{id1=-min(R_{re},C_{re})+1}^{D_1} K_{id1}=K$, $-min(R_{re}, C_{re})+1 \le D_1 \le max(R_{re}, C_{re})-1$, and id1 and $D_1$ are integers; selecting $K_{id2}$ indices from the $D_2$-th, $(D_2+1)$-th, . . . , $D_3$-th diagonals of $M_{re}$, where $\Sigma_{id2=D_2}^{D_3} K_{id2}=K$, $-min(R_{re}, C_{re})+1 \le D_2 \le D_3 \le max(R_{re}, C_{re})-1$, and id2, $D_2$ and $D_3$ are integers; and selecting $K_{id3}$ indices from the $D_4$-th, $(D_4+1)$-th, . . . , $(max(R_{re}, C_{re})-1)$-th diagonals of $M_{re}$, where $$\sum_{id3=D_4}^{max(R_{re},C_{re})-1} K_{id3} = K,$$

$-min(R_{re}, C_{re})+1 \le D_4 \le max(R_{re}, C_{re})-1$, and id3 and $D_4$ are integers, where $min(R_{re}, C_{re})$ denotes the smaller of $R_{re}$ and $C_{re}$, and $max(R_{re}, C_{re})$ denotes the larger of $R_{re}$ and $C_{re}$.

It is to be noted that, for a matrix M as an example, if M is a square matrix, the number, cc, of its columns is equal to the number, rr, of its rows. If the 0-th diagonal is the primary diagonal, the diagonals parallel with the primary diagonal are the $1^{st}, 2^{nd}, \ldots, (rr-1)$-th diagonals from the bottom up, and the diagonals parallel with the primary diagonal are the $-1^{st}, -2^{nd}, \ldots, (-rr+1)$-th diagonals from the top down. If the 0-th diagonal is the secondary diagonal, the diagonals parallel with the secondary diagonal are the $1^{st}, 2^{nd}, \ldots, (rr-1)$-th diagonals from the bottom up, and the diagonals parallel with the secondary diagonal are the $-1^{st}, -2^{nd}, \ldots, (-rr+1)$-th diagonals from the top down.

It is to be noted that, for a matrix M as an example, if M is not a square matrix, the number, cc, of its columns can be larger than the number, rr, of its rows. For the matrix $$\begin{pmatrix} a_{1,1} & a_{1,2} & \ldots & a_{1,cc} \\ a_{2,1} & a_{2,2} & \ldots & a_{2,cc} \\ \vdots & \vdots & \ddots & \vdots \\ a_{rr,1} & a_{rr,2} & \ldots & a_{rr,cc} \end{pmatrix}$$

as an example, if the 0-th diagonal is along the line connecting the element $a_{1,cc}$ and $a_{rr,cc-rr+1}$, the diagonals parallel with the 0-th diagonal are the $1^{st}, 2^{nd}, \ldots, (rr-1)$-th diagonals from the bottom up, and the diagonals parallel with the 0-th diagonal are the $-1^{st}, -2^{nd}, \ldots, (-rr+1)$-th diagonals from the top down. If the 0-th diagonal is along the line connecting the element $a_{1,1}$ and $a_{rr,rr}$, the diagonals parallel with the 0-th diagonal are the $1^{st}, 2^{nd}, \ldots, (rr-1)$-th diagonals from the bottom up, and the diagonals parallel with the 0-th diagonal are the $-1^{st}, -2^{nd}, \ldots, (-rr+1)$-th diagonals from the top down.

It is to be noted that, for a matrix M as an example, if M is not a square matrix, the number, rr, of its rows can be larger than the number, cc, of its columns. For the matrix $$\begin{pmatrix} a_{1,1} & a_{1,2} & \ldots & a_{1,cc} \\ a_{2,1} & a_{2,2} & \ldots & a_{2,cc} \\ \vdots & \vdots & \ddots & \vdots \\ a_{rr,1} & a_{rr,2} & \ldots & a_{rr,cc} \end{pmatrix}$$

as an example, if the 0-th diagonal is along the line connecting the element $a_{rr,1}$ and $a_{rr-cc+1,cc}$, the diagonals parallel with the 0-th diagonal are the $1^{st}$, $2^{nd}$, ..., (rr−1)-th diagonals from the bottom up, and the diagonals parallel with the 0-th diagonal are the $(-1)^{st}$, $(-2)^{nd}$, ..., (−rr+1)-th diagonals from the top down. If the 0-th diagonal is along the line connecting the element $a_{rr-cc+1,1}$ and $a_{rr,cc}$, the diagonals parallel with the 0-th diagonal are the $1^{st}2^{nd}$, ..., (rr−1)-th diagonals from the bottom up, and the diagonals parallel with the 0-th diagonal are the $-1^{st}$, $-2^{nd}$, ..., (−rr+1)-th diagonals from the top down.

It is to be noted that, when the predetermined number of indices are selected from $M_{re}$ row by row, column by column or diagonal by diagonal, each index corresponding to a non-transmitted bit sequence in a second bit sequence matrix is skipped. The second bit sequence matrix is obtained from a first bit sequence matrix by using a second predetermined transform. The first bit sequence matrix is formed from the Polar encoded bit sequence. The second predetermined transform includes row permutation or column permutation.

It is to be noted that, if the encoded bit sequence is $\{x_0, x_1, x_2, \ldots, x_{15}\}$ and the bit sequence to be transmitted is $\{x_6, x_7, \ldots, x_{15})\}$, then the indices corresponding to the non-transmitted bit sequence are $\{0, 1, 2, \ldots, 5\}$. In this case, when the indices in M_index are selected based on $M_{re}$, the indices $\{0, 1, 2, \ldots, 5\}$ are to be skipped.

It is to be noted that the operation of selecting T bits based on the second bit sequence matrix as the bit sequence to be transmitted includes: selecting T bits based on the second bit sequence matrix row by row, column by column or diagonal by diagonal, as the bit sequence to be transmitted.

It is to be noted that the operation of selecting T bits based on the second bit sequence matrix row by row, column by column or diagonal by diagonal as the bit sequence to be transmitted includes: selecting T bits based on the second bit sequence matrix row by row, column by column or diagonal by diagonal, from a starting position t in the second bit sequence matrix. When the selection reaches the first or last bit in the second bit sequence matrix, it continues with the last or first bit in the second bit sequence matrix, where $1 \le t \le R_{vb} \times C_{vb}$.

It is to be noted that the operation of selecting T bits based on the second bit sequence matrix row by row, column by column or diagonal by diagonal as the bit sequence to be transmitted includes: selecting the $1^{st}$ to T-th bits or the (N−T+1)-th to N-th bits from the second bit sequence matrix column by column, when T is smaller than or equal to a length N of the Polar encoded bit sequence; selecting the $1^{st}$ to T-th bits or the (N−T+1)-th to N-th bits from the second bit sequence matrix row by row, when T is smaller than or equal to the length N of the Polar encoded bit sequence; selecting the $1^{st}$ to T-th bits or the (N−T+1)-th to N-th bits from the second bit sequence matrix diagonal by diagonal, when T is smaller than or equal to the length N of the Polar encoded bit sequence; selecting, when T is larger than the length N of the Polar encoded bit sequence, T bits row by row, column by column or diagonal by diagonal, from the t-th bit in the second bit sequence matrix. When the selection reaches the first or last bit in the second bit sequence matrix, it continues with the last or first bit in the second bit sequence matrix, where $1 \le t \le R_{vb} \times C_{vb}$ and N is a non-negative integer.

It is to be noted that the operation of selecting T bits from the second bit sequence matrix column by column includes at least one of: selecting $T_{ie1}$ bits from the $1^{st}, 2^{nd}, \ldots, E_1$-th columns, where $\Sigma_{ie1=1}^{E_1} T_{ie1}=T$, $1 \le E_1 \le C_{vb}$, and ie1 and $E_1$ are integers; selecting $T_{ie2}$ bits from the $E_2$-th, ($E_2$+1)-th, ..., $E_3$-th columns, where $\Sigma_{ie2=E_2}^{E_3} T_{ie2}=T$, $1 \le E_2 \le E_3 \le C_{re}$, and ie2, $E_2$ and $E_3$ are integers; or selecting $T_{ie3}$ bits from the $E_4$-th, ($E_4$+1)-th, ..., $E_{vb}$-th columns, where $\Sigma_{ie3=E_4}^{C_{vb}} T_{ie3}=T$, $1 \le E_4 \le C_{vb}$, and ie3 and $E_4$ are integers.

It is to be noted that the operation of selecting T bits from the second bit sequence matrix row by row includes at least one of: selecting Tin bits from the $1^{st}, 2^{nd}, \ldots, F_1$-th rows, where $\Sigma_{if1=1}^{F_1} T_{if1}=T$, $1 \le F \le R_{vb}$, and if1 and $F_1$ are integers; selecting $T_{if2}$ bits from the $F_2$-th, ($F_2$+1)-th, ..., $F_3$-th rows, where $\Sigma_{if2=F_2}^{F_3} T_{if2}=T$, $1 \le F_2 \le F_3 \le R_{vb}$, and if2, $F_2$ and $F_3$ are integers; or selecting $T_{if3}$ bits from the $F_4$-th, ($F_4$+1)-th, ..., $R_{vb}$-th rows, where $\Sigma_{if3=F_4}^{R_{vb}} T_{if3}=T$, $1 \le F_4 \le R_{vb}$, and if3 and $F_4$ are integers.

It is to be noted that the operation of selecting T bits from the second bit sequence matrix diagonal by diagonal includes at least one of: selecting $T_{ig1}$ bits from the $(-\min(R_{vb}, C_{vb})+1)$-th, $(-\min(R_{vb}, C_{vb})+2)$-th, ..., $G_1$-th diagonals, where $\Sigma_{ig1=-\min(R_{vb}, C_{vb})+1}^{G_1} T_{ig1}=T$, $-\min(R_{vb}, C_{vb})+\le G_1 \le \max(R_{vb}, C_{vb})-1$, and ig1 and $G_1$ are integers; selecting $K_{ig2}$ bits from the $G_2$-th, ($G_2$+1)-th, ..., $G_3$-th diagonals, where $\Sigma_{ig2=G_2}^{G_3} T_{ig2}=T$, $-\min(R_{vb}, C_{vb})+1 \le G_2 \le G_3 \le \max(R_{vb}, C_{vb})-1$, and ig2, $G_2$ and $G_3$ are integers; or selecting $K_{id3}$ bits from the $G_4$-th, ($G_4$+1)-th, ..., $(\max(R_{vb}, C_{vb})-1)$-th diagonals, where $$\sum\nolimits_{ig3=G_4}^{max(R_{vb}, C_{vb})-1} T_{ig3} = T,$$

$-\min(R_{vb}, C_{vb})+1 \le G_4 \le \max(R_{vb}, C_{vb})-1$, and ig3 and $G_4$ are integers.

In an example, the bit sequence in $M_{vb}$ can be arranged as $$M_{vb} = \begin{bmatrix} y_0 & y_1 & y_2 & y_3 \\ y_4 & y_5 & y_6 & y_7 \\ y_8 & y_9 & y_{10} & y_{11} \\ y_{12} & y_{13} & y_{14} & y_{15} \end{bmatrix}.$$

Let T=9, when the first 9 bits are selected row by row to form the bit sequence to be transmitted, $\{y_0, y_1, y_2, y_3, y_4, y_5, y_6, y_7, y_8\}$ are selected to form the bit sequence to be transmitted. When the first 9 bits are selected column by column to form the bit sequence to be transmitted, $\{y_0, y_4, y_8, y_{12}, y_1, y_5, y_9, y_{13}, y_2\}$ are selected to form the bit sequence to be transmitted. When the first 9 bits are selected diagonal by diagonal to form the bit sequence to be transmitted, $\{y_0, y_1, y_4, y_2, y_5, y_8, y_3, y_6, y_9\}$ are selected to form the bit sequence to be transmitted. When the last 9 bits are selected row by row to form the bit sequence to be transmitted, $\{y_7, y_8, y_9, y_{10}, y_{11}, y_{12}, y_{13}, y_{14}, y_{15}\}$ are selected to form the bit sequence to be transmitted. When the last 9 bits are selected column by column to form the bit sequence to be transmitted, $\{y_{13}, y_2, y_6, y_{10}, y_{14}, y_3, y_7, y_{11}, y_{15}\}$ are selected to form the bit sequence to be transmitted. When the last 9 bits are selected diagonal by diagonal to form the bit sequence to be transmitted, $\{y_6, y_9, y_{12}, y_7, y_{10}, y_{13}, y_{11}, y_{14}, y_{15}\}$ are selected to form the bit sequence to be transmitted. During the selection in order, when the selection reaches the last bit $y_{15}$ in $M_{vb}$, it continues with the first bit $y_0$ in $M_{vb}$. During the selection in reverse order, when the selection reaches the first bit $y_0$ in $M_{vb}$, it continues with the last bit $y_{15}$ in $M_{vb}$.

It is to be noted that the above steps can be, but not limited to be, performed by a base station or a terminal.

With the description of the above embodiments, it will be apparent to those skilled in the art that the method according to the above embodiments can be implemented by means of software plus a necessary general-purpose hardware platform. Of course it can be implemented in hardware, but in many cases the former is the optimal implementation. Based on this understanding, the technical solution of the present disclosure in essence, or parts thereof contributive to the prior art, can be embodied in the form of a software product. The computer software product can be stored in a storage medium (e.g., ROM/RAM, magnetic disk, or optical disc) and includes instructions for causing a terminal device (which may be a mobile phone, a computer, a server, or a network device, etc.) to perform the method described in the various embodiments of the present disclosure.

Embodiment 2

According to an embodiment of the present disclosure, an apparatus for sequence determination is also provided. The apparatus can be applied in a first station for implementing the above embodiments and examples (details thereof will be omitted here). As used hereinafter, the term "module" can be software, hardware, or a combination thereof, capable of performing a predetermined function. While the apparatuses to be described in the following embodiments can be implemented in software, it can be contemplated that they can also be implemented in hardware or a combination of software and hardware.

Figure 3:
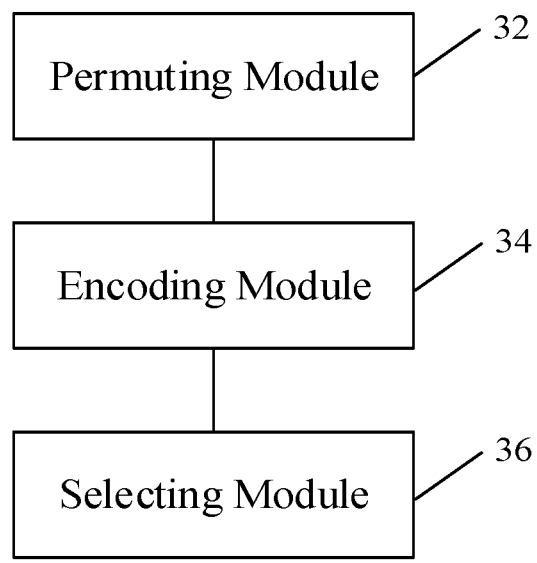
FIG. 3 is a block diagram showing a structure of an apparatus for sequence determination according to an embodiment of the present disclosure.

FIG. 3 is a block diagram showing a structure of an apparatus for sequence determination according to an embodiment of the present disclosure. As shown in FIG. 3, the apparatus includes:

a permuting module 32 configured to map a first bit sequence having a length of K bits to a specified position based on M_index to obtain a second bit sequence;

an encoding module 34 coupled to the above permuting module 32 and configured to apply Polar encoding to the second bit sequence to obtain a Polar encoded bit sequence; and a selecting module 36 coupled to the above encoding module 34 and configured to select T bits based on the Polar encoded bit sequence as a bit sequence to be transmitted, where K and T are both non-negative integers and K≤T.

With the above apparatus, a first bit sequence having a length of K bits is mapped to a specified position based on M_index to obtain a second bit sequence. Polar encoding is applied to the second bit sequence to obtain a Polar encoded bit sequence. T bits are selected based on the Polar encoded bit sequence as a bit sequence to be transmitted. That is, the present disclosure provides a method for determining a bit sequence to be transmitted, capable of solving the problem in the related art associated with lack of a sequence determination scheme in the 5G New RAT.

In an embodiment of the present disclosure, the above apparatus may further include: a first transform module coupled to the above permuting module 32 and configured to apply a first predetermined transform to a first index matrix to obtain a second index matrix and obtain M_index based on the second index matrix. The first predetermined transform includes row permutation or column permutation. That is, in the Polar encoding process, the same transform pattern is applied to one dimension of the first index matrix, such that only the other dimension of the first index matrix needs to be changed when a mother code length changes. Thus, the hardware can be reused in the implementation of Polar codes, thereby solving the problem in the related art associated with incapability of hardware reuse in the Polar encoding process.

In an embodiment of the present disclosure, the apparatus may further include: a second transform module configured to form a first bit sequence matrix from the Polar encoded bit sequence, and apply a second predetermined transform to the first bit sequence matrix to obtain a second bit sequence matrix. The second predetermined transform includes row permutation or column permutation. The selecting module is further configured to select T bits based on the second bit sequence matrix as the bit sequence to be transmitted. That is, the same transform pattern is applied to one dimension of the first bit sequence matrix, such that only the other dimension of the first bit sequence matrix needs to be changed when a mother code length changes. Thus, the hardware can be further reused in the implementation of Polar codes, thereby further solving the problem in the related art associated with incapability of hardware reuse in the Polar encoding process.

It is to be noted that the above apparatus may further include a storage module coupled to the above first transform module and configured to store the second bit sequence matrix.

It is to be noted that the above storage module can be, but not limited to, a buffer or any other memory, such as an internal memory or any other logic entity.

It is to be noted that the above first index matrix can be, but not limited to, a two dimensional, three dimensional or multi-dimensional matrix. In an example where the above first index matrix is a two dimensional matrix, the above first predetermined transform can be embodied such that a row transform pattern or a column transform pattern for the first index matrix is the same.

In an example where the above first index matrix is a two dimensional matrix, in an embodiment of the present disclosure, the second index matrix is $M_{re}$, which is a matrix of $R_{re}$ rows and $C_{re}$ columns. The first index matrix is $M_{or}$, which is:

$$M_{or} = \begin{bmatrix} 0 & 1 & 2 & \cdots & C_{re}-1 \\ C_{re} & C_{re}+1 & C_{re}+2 & \cdots & 2C_{re}-1 \\ \vdots & \vdots & \vdots & \ddots & \vdots \\ (R_{re}-1) \times C_{re} & (R_{re}-1) \times C_{re}+1 & (R_{re}-1) \times C_{re}+2 & \cdots & R_{re} \times C_{re}-1 \end{bmatrix} \text{ or}$$

$$M_{or} = \begin{bmatrix} 0 & R_{re} & 2R_{re} & \cdots & (C_{re}-1) \times R_{re} \\ 1 & R_{re}+1 & 2R_{re}+1 & \cdots & (C_{re}-1) \times R_{re}+1 \\ \vdots & \vdots & \vdots & \ddots & \vdots \\ R_{re}-1 & 2R_{re}-1 & 3R_{re}-1 & \cdots & R_{re} \times C_{re}-1 \end{bmatrix},$$

where $R_{re} \times C_{re} \geq N$, $R_{re}$ and $C_{re}$ are both non-negative integers, and N is a length of the Polar encoded bit sequence.

It is to be noted that when $R_{re}$ is constant, $C_{re}$ is a minimum value satisfying $R_{re} \times C_{re} \geq N$; or when $C_{re}$ is constant, $R_{re}$ is a minimum value satisfying $R_{re} \times C_{re} \geq N$.

It is to be noted that the above first transform module is further configured to obtain the second index matrix according to at least one of: the i-th column of $M_{re}$ being obtained from the $\pi_1(i)$-th column of $M_{or}$ by means of column permutation, where $0 \leq i \leq C_{re}-1$, $0 \leq \pi_1(i) \leq C_{re}-1$, $R_{re} \times C_{re} \geq N$, and i and $\pi_1(i)$ are both non-negative integers; or the j-th row of $M_{re}$ being obtained from the $\pi_2(j)$-th row of $M_{or}$, where $0 \leq j \leq R_{re}-1$, $0 \leq \pi_2(j) \leq R_{re}-1$, $R_{re} \times C_{re} \geq N$, and j and $\pi_2(j)$ are both non-negative integers.

It is to be noted that the above $\pi_1(i)$ can be obtained according to at least one of:

Scheme 1: $\pi_1(i)=BRO(i)$, where BRO( ) denotes a bit reverse ordering operation which includes: converting a decimal number i into a first binary number $(B_{n1-1}, B_{n1-2}, \ldots, B_0)$, reversing the first binary number to obtain a second binary number $(B_0, B_1, \ldots, B_{n1-1})$ and converting the second binary number into a decimal number $\pi_1(i)$, where $n1=\log_2(C_{re})$ and $0 \leq i \leq C_{re}-1$;

Scheme 2: $\pi_1(i)=\{S1, S2, S3\}$, where $S1=\{0, 1, \ldots, i1-1\}$, $S2=\{i2, i3, i2+1, i3+1, \ldots, i4, i5\}$, and S3 is a set of elements in $\{0, 1, \ldots, C_{re}-1\}$ other than those included in S1 and S2, where $C_{re}/8 \leq i1 \leq i2 \leq C_{re}/3$, $i2 \leq i4 \leq i3 \leq 2C_{re}/3$, $i3 \leq i5 \leq C_{re}-1$, i1, i2, i3, i4 and i5 are all non-negative integers, and an intersection of any two of S1, S2 and S3 is null; or Scheme 3: $\pi_1(i)=\{I\}$, where $\{I\}$ is a sequence obtained by organizing numerical results of applying a function f(r) to column indices r of $M_{or}$ in ascending or descending order, where $0 \leq r \leq C_{re}-1$.

The above three schemes will be explained with reference to the following examples.

For Scheme 1, if $C_{re}=8$, $i=6$, then $n1=\log_2(8)=3$. $i=6$ is converted into a binary number $(B_2, B_1, B_0)=(1, 1, 0)$. The binary number $(B_2, B_1, B_0)=(1, 1, 0)$ is reversed to obtain $(B_0, B_1, B_2)=(0, 1, 1)$. $(B_0, B_1, B_2)=(0, 1, 1)$ is then converted into a decimal number $\pi_1(i)=3$.

For Scheme 2, if $C_{re}=8$, $i_1=2$, $i_2=2$, $i_3=4$, $i_4=3$ and $i_5=5$, then $S1=\{0, 1\}$, $S2=\{2, 4, 3, 5\}$, $S3=\{6, 7\}$, and $\pi_1(i)=\{0, 1, 2, 4, 3, 5, 6, 7\}$.

For Scheme 3, $C_{re}=8$, $\{f(0), \ldots, f(7)\}=\{0, 1, 1.18, 2.18, 1.41, 2.41, 2.60, 3.60\}$. $f(0), \ldots, f(7)$ is organized in ascending order to obtain $\pi_1(i)=\{1, 2, 3, 5, 4, 6, 7, 8\}$.

It is to be noted that f(r) includes at least one of:

$$f(r) = \sum_{m1=0}^{n1-1} B_{m1} \times 2^{\frac{m1}{k}},$$

$(B_{n1-1}, B_{n1-2}, \ldots, B_0)$ is a binary representation of the index r, where $0 \leq m1 \leq n1-1$, $n1=\log_2(C_{re})$, and k is a non-negative integer (e.g., $C_{re}=8$, $i=6$, $k=4$, $n1=\log_2(8)=3$, $i=6$ is converted into a binary number $(B_2, B_1, B_0)=(1, 1, 0)$, $$f(6) = \sum_{m1=0}^{n1-1} B_{m1} \times 2^{\frac{m1}{4}} = 0 \times 2^{\frac{0}{4}} + 1 \times 2^{\frac{1}{4}} + 1 \times 2^{\frac{2}{4}} = 2.4142);$$

initializing a function value corresponding to r as $f_1^{(r)}$, and obtaining a function value for each element $f_{C_{re}}^{(r)}$ after n1-th iteration in accordance with a first iteration equation:

$$\begin{cases} f_{2m2}^{(2r-1)} = \varphi^{-1}\left(1 - [1 - \varphi(f_{m2}^{(r1)})][1 - \varphi(f_{m2}^{(r2)})]\right) \\ f_{2m2}^{(2r)} = f_{m2}^{(r1)} + f_{m2}^{(r2)} \end{cases},$$

where $f_1^{(r)}$ is a mean log likelihood ratio (e.g., $\leq(z)$ can be approximately:

$$\varphi(z) = \begin{cases} 1 - \frac{1}{\sqrt{4\pi z}} \int_{-\infty}^{+\infty} \tanh\frac{u}{2} \exp(-(u-z)^2/(4z))du & z > 0 \\ 1, & z = 0 \end{cases},$$

where the nodes $i_1$ and $i_2$ participating in the iterative calculation are dependent on the structure of the Polar encoder);

(Let the initial value $f_1^{(r)}=2/\sigma^2$, where $\sigma^2$ is the variance of noise, $C_{re}=8$, $\sigma^2=0$. $f_1^{(r)}$ is substituted into the iteration equation to obtain $f_2^{(r)}$, which is then substituted into the iteration equation to obtain $f_4^{(r)}$, and so on, until $f_8^{(r)}$ is calculated, where $f(r)=f_8^{(r)}$, $0 \leq r \leq C_{re}-1$, $\{f(0), \ldots, f(7)\}=\{0.04, 0.41, 0.61, 3.29, 1.00, 4.56, 5.78, 16.00\}$); or initializing a function value corresponding to r as $f_1^{(r)}$, and obtaining a function value for each element $f_{C_{re}}^{(r)}$ after n1-th iteration in accordance with a second iteration equation:

$$\begin{cases} f_{2m3}^{(2r-1)} = f_{m3}^{(r1)} + f_{m3}^{(r2)} - f_{m3}^{(r1)} f_{m3}^{(r2)} \\ f_{2m3}^{(2r)} = f_{m3}^{(r1)} f_{m3}^{(r2)} \end{cases},$$

where $f_1^{(r)}$ is mutual information, where $1 \leq m2 \leq n1$, $1 \leq m3 \leq n1$, and r1, r2, 2r and 2r-1 are all integers larger than or equal to 0 and smaller than or equal to $C_{re}-1$ (the nodes $i_1$ and $i_2$ participating in the iterative calculation are dependent on the structure of the Polar encoder);

(Let $f_1^{(r)}=0.5$ and $C_{re}=8$. $f_1^{(r)}$ is substituted into the iteration equation to obtain $f_2^{(r)}$, which is then substituted into the iteration equation to obtain $f_4^{(r)}$, and so on, until $f_8^{(r)}$ is calculated, where $f(r)=f_8^{(r)}$, $0 \leq i \leq C_{re}-1$, $\{f(0), \ldots, f(7)\}=\{0.008, 0.152, 0.221, 0.682, 0.313, 0.779, 0.850, 0.991\}$).

It is to be noted that the above $\pi_2(j)$ can be obtained according to at least one of:

$\pi_2(j)=BRO(j)$, where BRO( ) denotes a bit reverse ordering operation which includes: converting a decimal number j into a third binary number $(B_{n2-1}, B_{n2-2}, \ldots, B_0)$, reversing the third binary number to obtain a fourth binary number $(B_0, B_1, \ldots, B_{n2-1})$ and converting the fourth binary number into a decimal number $\pi_2(j)$, where $n2=\log_2(R_{re})$ and $0 \leq j \leq R_{re}-1$;

$\pi_2(j)=\{S4, S5, S6\}$, where $S4=\{0, 1, \ldots, j1-1\}$, $S5=\{j2, j3, j2+1, j3+1, \ldots, j4, j5\}$, and S6 is a set of elements in $\{0, 1, \ldots, R_{re}-1\}$ other than those included in S4 and S5, where $R_{re}/8 \leq j1 \leq j2 \leq R_{re}/3$, $j2 \leq j4 \leq j3 \leq 2 R_{re}/3$, $j3 \leq j5 \leq R_{re}-1$, j1, j2, j3, j4 and j5 are all non-negative integers, and an intersection of any two of S4, S5 and S6 is null; or $\pi_2(j)=\{J\}$, where $\{J\}$ is a sequence obtained by organizing numerical results of applying a function f(s) to row indices s of $M_{or}$ in ascending or descending order, where $0 \leq s \leq R_{re}-1$.

It is to be noted that f(s) includes at least one of:

$$f(s) = \sum_{m4=0}^{n2-1} B_{m4} \times 2^{\frac{m4}{k}},$$

$(B_{n2-1}, B_{n2-2}, \ldots, B_0)$ is a binary representation of the index s, where $0 \leq m4 \leq n2-1$, $n2=\log_2(R_{re})$, and k is a non-negative integer;

initializing a function value corresponding to s as $f_1^{(s)}$, and obtaining a function value for each element $f_{R_{re}}^{(s)}$ e after n2-th iteration in accordance with a third iteration equation:

$$\begin{cases} f_{2m5}^{(2s-1)} = \varphi^{-1}\left(1 - \left[1 - \varphi\left(f_{m5}^{(s_1)}\right)\right]\left[1 - \varphi\left(f_{m5}^{(s_2)}\right)\right]\right) \\ f_{2m5}^{(2s)} = f_{m5}^{(s_1)} + f_{m5}^{(s_2)} \end{cases},$$

where $f_1^{(s)}$ is a mean log likelihood ratio; or initializing a function value corresponding to s as $f_1^{(s)}$, and obtaining a function value for each element $f_{R_{re}}^{(s)}$ after n2-th iteration in accordance with a fourth iteration equation:

$$\begin{cases} f_{2m6}^{(2s-1)} = f_{m6}^{(s_1)} + f_{m6}^{(s_2)} - f_{m6}^{(s_1)} f_{m6}^{(s_2)} \\ f_{2m6}^{(2s)} = f_{m6}^{(s_1)} f_{m6}^{(s_2)} \end{cases},$$

where $f_1^{(s)}$ is mutual information, where $1 \leq m5 \leq n2$, $1 \leq m6 \leq n2$, s1, s2, 2s and 2s−1 are all integers larger than or equal to 0 and smaller than or equal to $R_{re}-1$.

It is to be noted that, for explanations for the above $\pi_2(j)$, reference can be made to $\pi_1(i)$.

It is to be noted that the above first bit sequence matrix can be, but not limited to, a two dimensional, three dimensional or multi-dimensional matrix. In an example where the above first bit sequence matrix is a two dimensional matrix, the above second predetermined transform can be embodied such that a row transform pattern or a column transform pattern for the first bit sequence matrix is the same.

It is to be noted that the first bit sequence matrix is $M_{og}$. The second bit sequence matrix is $M_{vb}$, which is a matrix of $R_{vb}$ rows and $C_{vb}$ columns. $M_{og}$ is:

$$M_{og} = \begin{bmatrix} x_0 & x_1 & x_2 & \cdots & x_{C_{vb}-1} \\ x_{C_{vb}} & x_{C_{vb}+1} & x_{C_{vb}+2} & \cdots & x_{2C_{vb}-1} \\ \vdots & \vdots & \vdots & \ddots & \vdots \\ x_{(R_{vb}-1) \times C_{vb}} & x_{(R_{vb}-1) \times C_{vb}+1} & x_{(R_{vb}-1) \times C_{vb}+2} & \cdots & x_{R_{vb} \times C_{vb}-1} \end{bmatrix} \text{ or }$$

$$M_{og} = \begin{bmatrix} x_0 & x_{R_{vb}} & x_{2R_{vb}} & \cdots & x_{(C_{vb}-1) \times R_{vb}} \\ x_1 & x_{R_{vb}+1} & x_{2R_{vb}+1} & \cdots & x_{(C_{vb}-1) \times R_{vb}+1} \\ \vdots & \vdots & \vdots & \ddots & \vdots \\ x_{R_{vb}-1} & x_{2R_{vb}-1} & x_{3R_{vb}-1} & \cdots & x_{R_{vb} \times C_{vb}-1} \end{bmatrix},$$

where $x_0, x_1, x_2, \ldots, x_{R_{vb} \times C_{vb}-1}$ is the Polar encoded bit sequence, $R_{vb} \times C_{vb} \geq N$, $R_{vb}$ and $C_{vb}$ are both non-negative integers and N is a length of the Polar encoded bit sequence.

It is to be noted that when $R_{vb}$ is constant, $C_{vb}$ is a minimum value satisfying $R_{vb} \times C_{vb} \geq N$; or when $C_{vb}$ is constant, $R_{vb}$ is a minimum value satisfying $R_{vb} \times C_{vb} \geq N$.

It is to be noted that the above second transform module can further be configured to obtain the second bit sequence matrix according to at least one of: the g-th column of $M_{vb}$ being obtained from the $\pi_3(g)$-th column of $M_{og}$ by means of column permutation, where $0 \leq g \leq C_{vb}-1$, $0 \leq \pi_3(g) \leq C_{vb}-1$, $R_{vb} \times C_{vb} \geq N$, and g and $\pi_3(g)$ are both non-negative integers; or the h-th row of $M_{vb}$ being obtained from the $\pi_4(h)$-th row of $M_{og}$ by means of row permutation, where $0 \leq h \leq R_{vb}-1$, $0 \leq \pi_4(h) \leq R_{vb}-1$, $R_{vb} \times C_{vb} \geq N$, and h and $\pi_4(h)$ are both non-negative integers.

It is to be noted that $\pi_3(g)$ can be obtained according to at least one of:

$\pi_3(g) = BRO(g)$, where BRO( ) denotes a bit reverse ordering operation which includes: converting a decimal number g into a fifth binary number $(B_{n3-1}, B_{n3-2}, \ldots, B_0)$, reversing the fifth binary number to obtain a sixth binary number $(B_0, B_1, \ldots, B_{n3-1})$ and converting the sixth binary number into a decimal number $\pi_3(g)$, where $n3 = \log_2(C_{vb})$ and $0 \leq g \leq C_{vb}-1$;

$\pi_3(g) = \{S1, S2, S3\}$, where $S1 = \{0, 1, \ldots, g1-1\}$, $S2 = \{g2, g3, g2+1, g3+1, \ldots, g4, g5\}$, and S3 is a set of elements in $\{0, 1, \ldots, C_{vb}-1\}$ other than those included in S1 and S2, where $C_{vb}/8 \leq g1 \leq g2 \leq C_{vb}/3$, $g2 \leq g4 \leq g3 \leq 2C_{vb}/3$, $g3 \leq g5 \leq C_{vb}-1$, g1, g2, g3, g4 and g5 are all non-negative integers, and an intersection of any two of S1, S2 and S3 is null;

$\pi_3(g) = \{G\}$, where $\{G\}$ is a sequence obtained by organizing numerical results of applying a function $f(\alpha)$ to column indices $\alpha$ of $M_{og}$ in ascending or descending order, where $0 \leq \alpha \leq C_{vb}-1$;

$\pi_3(g) = \{Q1, Q2, Q3\}$, where $Q2 = \{q1, q2, q1+1, q2+1, \ldots, q3, q4\}$, $0 \leq q1 \leq q3 \leq (C_{vb}-1)/2$, $0 \leq q2 \leq q4 \leq (C_{vb}-1)/2$, q1, q2, q3, q4 and q5 are all non-negative integers, Q1 and Q3 are other elements in a difference set between $\{0, 1, \ldots, C_{vb}-1\}$ and Q2, and an intersection of any two of Q1, Q2 and Q3 is null;

$\pi_3(g)$ being different from a predefined sequence V1 in nV1 positions, where V1 = \{0, 1, 2, 3, 4, 5, 6, 7, 8, 9, 10, 11, 12, 16, 13, 17, 14, 18, 15, 19, 20, 24, 21, 22, 25, 26, 28, 23, 27, 29, 30, 31\}, $0 \leq nV1 \leq 23$; or $\pi_3(g)$ being different from a predefined sequence V2 in nV2 positions, where V2 = \{0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31\}, $0 \leq nV2 \leq 3$.

It is to be noted that $f(\alpha)$ includes at least one of:

$$f(\alpha) = \sum_{m6=0}^{n3-1} B_{m6} \times 2^{\frac{m6}{k}},$$

$(B_{n3-1}, B_{n3-2}, \ldots, B_0)$ is a binary representation of the index $\alpha$, where $0 \leq m6 \leq n3-1$, $n3 = \log_2(C_{vb})$, and k is a non-negative integer;

initializing a function value corresponding to $\alpha$ as $f_1^{(\alpha)}$, and obtaining a function value for each element $f_{C_{vb}}^{(\alpha)}$ after n3-th iteration in accordance with a fifth iteration equation:

$$\begin{cases} f_{2m7}^{(2\alpha-1)} = \varphi^{-1}\left(1 - \left[1 - \varphi\left(f_{m7}^{(\alpha_1)}\right)\right]\left[1 - \varphi\left(f_{m7}^{(\alpha_2)}\right)\right]\right) \\ f_{2m7}^{(2\alpha)} = f_{m7}^{(\alpha_1)} + f_{m7}^{(\alpha_2)} \end{cases},$$

where $f_1^{(\alpha)}$ is a mean log likelihood ratio; or initializing a function value corresponding to s as $f_1^{(\alpha)}$, and obtaining a function value for each element $f_{C_{vb}}^{(\alpha)}$ after n3-th iteration in accordance with a sixth iteration equation:

$$\begin{cases} f_{2m8}^{(2\alpha-1)} = f_{m8}^{(\alpha_1)} + f_{m8}^{(\alpha_2)} - f_{m8}^{(\alpha_1)} f_{m8}^{(\alpha_2)} \\ f_{2m8}^{(2\alpha)} = f_{m8}^{(\alpha_1)} f_{m8}^{(\alpha_2)} \end{cases},$$

where $f_1^{(\alpha)}$ is mutual information, where $1 \le m7 \le n3$, $1 \le m8 \le n3$, and $\alpha1$, $\alpha2$, $2\alpha$ and $2\alpha-1$ are all integers larger than or equal to 0 and smaller than or equal to $C_{vb}-1$.

It is to be noted that $\pi_4(h)$ can be obtained according to at least one of:

$\pi_4(h)=BRO(h)$, where BRO( ) denotes a bit reverse ordering operation which includes: converting a decimal number h into a seventh binary number $(B_{n4-1}, B_{n4-2}, \ldots, B_0)$, reversing the seventh binary number to obtain an eighth binary number $(B_0, B_1, \ldots, B_{n4-1})$ and converting the eighth binary number into a decimal number $\pi_4(h)$, where $n4=\log_2(R_{vb})$ and $0 \le h \le R_{vb}-1$;

$\pi_4(h)=\{S4, S5, S6\}$, where $S4=\{0, 1, \ldots, h1-1\}$, $S5=\{h2, h3, h2+1, h3+1, \ldots, h4, h5\}$, and S6 is a set of elements in $\{0, 1, \ldots, R_{vb}-1\}$ other than those included in S4 and S5, where $R_{vb}/8 \le h1 \le h2 \le R_{vb}/3$, $h2 \le h4 \le h3 \le 2R_{vb}/3$, $h3 \le h5 \le R_{vb}-1$, h1, h2, h3, h4 and h5 are all non-negative integers, and an intersection of any two of S4, S5 and S6 is null;

$\pi_4(h)=\{H\}$, where $\{H\}$ is a sequence obtained by organizing numerical results of applying a function $f(\beta)$ to row indices $\beta$ of $M_{og}$ in ascending or descending order, where $0 \le O3 \le R_{vb}-1$;

$\pi_4(h)=\{O1, O2, O3\}$, where $O2=\{o1, o2, o1+1, o2+1, \ldots, o3, o4\}$, $0 \le o1 \le o3 \le (R_{vb}-1)/2$, $0 \le o2 \le o4 \le (R_{vb}-1)/2$, o1, o2, o3, o4 and o5 are all non-negative integers, O1 and O3 are other elements in a difference set between $\{0, 1, \ldots, R_{vb}-1\}$ and O2, and an intersection of any two of O1, O2 and O3 is null;

$\pi_4(h)$ being different from a predefined sequence VV1 in nVV1 positions, where VV1=$\{0, 1, 2, 3, 4, 5, 6, 7, 8, 9, 10, 11, 12, 16, 13, 17, 14, 18, 15, 19, 20, 24, 21, 22, 25, 26, 28, 23, 27, 29, 30, 31\}$, $0 \le nVV1 \le 23$; or $\pi_4(h)$ being different from a predefined sequence VV2 in nVV2 positions, where VV2=$\{0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31\}$, $0 \le nVV2 \le 3$.

It is to be noted that $f(\beta)$ includes at least one of:

$$f(\beta) = \sum_{m9=0}^{n4-1} B_{m9} \times 2^{\frac{m9}{k}},$$

$(B_{n4-1}, B_{n4-2}, \ldots, B_0)$ is a binary representation of the index $\beta$, where $0 \le m9 \le n4-1$, $n4=\log_2(R_{vb})$, and k is a non-negative integer;

initializing a function value corresponding to $\beta$ as $f_1^{(\beta)}$, and obtaining a function value for each element $f_{R_{vb}}^{(\beta)}$ after n4-th iteration in accordance with a seventh iteration equation:

$$\begin{cases} f_{2m10}^{(2\beta-1)} = \varphi^{-1}(1 - [1 - \varphi(f_{m10}^{(\beta_1)})][1 - \varphi(f_{m10}^{(\beta_2)})]) \\ f_{2m10}^{(2\beta)} = f_{m10}^{(\beta_1)} + f_{m10}^{(\beta_2)} \end{cases},$$

where $f_1^{(\beta)}$ is a mean log likelihood ratio; or initializing a function value corresponding to $\beta$ as $f_1^{(\beta)}$, and obtaining a function value for each element $f_{R_{vb}}^{(\beta)}$ after n4-th iteration in accordance with an eighth iteration equation:

$$\begin{cases} f_{2m11}^{(2\beta-1)} = f_{m11}^{(\beta_1)} + f_{m11}^{(\beta_2)} - f_{m11}^{(\beta_1)} f_{m11}^{(\beta_2)} \\ f_{2m11}^{(2\beta)} = f_{m11}^{(\beta_1)} f_{m11}^{(\beta_2)} \end{cases},$$

where $f_1^{(\beta)}$ is mutual information, where $1 \le m10 \le n4$, $1 \le m11 \le n4$, and $\beta1$, $\beta2$, $2\beta$ and $2\beta-1$ are all integers larger than or equal to 0 and smaller than or equal to $R_{vb}-1$.

It is to be noted that, for explanations for $\pi_3(g)$ and $\pi_4(h)$, reference can be made to $\pi_1(i)$ and descriptions thereof will be omitted here.

In an embodiment of the present disclosure, the above first transform module can further be configured to select a predetermined number of indices based on $M_{re}$ row by row, column by column or diagonal by diagonal, as M_index.

It is to be noted that the operation of selecting the predetermined number of indices from $M_{re}$ column by column includes: selecting $\pi_p$ indices from the p-th column of $M_{re}$, where $\Sigma_{p=1}^{C_{re}}K_p=K$, p is an integer, and $1 \le p \le C_{re}$. The operation of selecting the predetermined number of indices from $M_{re}$ row by row includes: selecting $\pi_q$ indices from the q-th row of $M_{re}$, where $\Sigma_{q=1}^{R_{re}}K_q=K$, q is an integer, and $1 \le q \le R_{re}$. The operation of selecting the predetermined number of indices from $M_{re}$ diagonal by diagonal includes: selecting $K_\delta$ indices from the $\delta$-th diagonal of $M_{re}$, where $$\sum_{\delta=-min(R_{re},C_{re})+1}^{max(R_{re},C_{re})-1} K_\delta = K,$$

$\delta$ is an integer, and $-min(R_{re}, C_{re})+1 \le \delta \le max(R_{re}, C_{re})-1$, where $min(R_{re}, C_{re})$ denotes the smaller of $R_{re}$ and $C_{re}$, and $max(R_{re}, C_{re})$ denotes the larger of $R_{re}$ and $C_{re}$.

It is to be noted that the operation of selecting the predetermined number of indices from $M_{re}$ column by column includes at least one of: selecting $K_{ic1}$ indices from the $1^{st}$, $2^{nd}$...$C_1$-th columns of $M_{re}$, where $\Sigma_{ic1=1}^{C_1}K_{ic1}=K$, $1 \le ic1 \le C_1$, $1 \le C_1 \le C_{re}$, and ic1 and $C_1$ are integers; selecting $K_{ic2}$ indices from the $C_2$-th, $(C_2+1)$-th, ..., $C_3$-th columns of $M_{re}$, where $\Sigma_{ic2=C_2}^{C_3}K_{ic2}=K$, $C_2 \le ic2 \le C_3$, $1 \le C_2 \le C_3 \le C_{re}$, and ic2, $C_2$ and $C_3$ are integers; or selecting $K_{ic3}$ indices from the $C_4$-th, $(C_4+1)$-th, ..., $C_{re}$-th columns of $M_{re}$, where $\Sigma_{ic3=C_4}^{C_{re}}K_{ic3}=K$, $C_4 \le ic3 \le C_{re}$, $1 \le C_4 \le C_{re}$, and ic3 and $C_4$ are integers.

It is to be noted that the operation of selecting the predetermined number of indices from $M_{re}$ row by row includes at least one of: selecting $K_{ir1}$ indices from the $1^{st}$, $2^{nd}$, ..., $R_1$-th rows of $M_{re}$, where $\Sigma_{ir1=1}^{R_1}K_{ir1}=K$, $1 \le ir1 \le R_1$, $1 \le R_1 \le R_{re}$, and ir1 and $R_1$ are integers; selecting $K_{ir2}$ indices from the $R_2$-th, $(R_2+1)$-th, ..., $R_3$-th rows of $M_{re}$, where $\Sigma_{ir2=R_2}^{R_3}K_{ir2}=K$, $R_2 \le ir2 \le R_3$, $1 \le R_2 \le R_3 \le R_{re}$, and ir2, $R_2$ and $R_3$ are integers; or selecting $K_{ir3}$ indices from the $R_4$-th, $(R_4+1)$-th, ... $R_{re}$-th rows of $M_{re}$, where $\Sigma_{ir3=R_4}^{R_{re}}K_p=K$, $1 \le R_4 R_{re}$, and ir3 and $R_4$ are integers.

It is to be noted that the operation of selecting the predetermined number of indices from $M_{re}$ diagonal by diagonal includes at least one of: selecting $K_{id1}$ indices from the $(-min(R_{re}, C_{re})+1)$-th, $(-min(R_{re}, C_{re})+2)$-th, ..., $D_1$-th diagonals of $M_{re}$, where $\Sigma_{id1=-min(R_{re}, C_{re})+1}^{D_1}K_{id1}=K$, $-min(R_{re}, C_{re})+1 \le D_1 \le max(R_{re}, C_{re})-1$, and id1 and $D_1$ are integers; selecting $K_{id2}$ indices from the $D_2$-th, $(D_2+1)$-th, ..., $D_3$-th diagonals of $M_{re}$, where $\Sigma_{id2=D_2}^{D_3}K_{id2}=K$, $-min(R_{re}, C_{re})+1 \le D_2 \le D_3 \le max(R_{re}, C_{re})-1$, and id2, $D_2$ and $D_3$ are integers; and selecting $K_{id3}$ indices from the $D_4$-th, $(D_4+1)$-th, ..., $(max(R_{re}, C_{re})-1)$-th diagonals of $M_{re}$, where $$\sum_{id3=D_4}^{max(R_{re},C_{re})-1} K_{id3} = K,$$

$-\min(R_{re}, C_{re})+1 \leq D_4 \leq \max(R_{re}, C_{re})-1$, and id3 and $D_4$ are integers, where $\min(R_{re}, C_{re})$ denotes the smaller of $R_{re}$ and $C_{re}$, and $\max(R_{re}, C_{re})$ denotes the larger of $R_{re}$ and $C_{re}$.

It is to be noted that, when the predetermined number of indices are selected from $M_{re}$ row by row, column by column or diagonal by diagonal, each index corresponding to a non-transmitted bit sequence in a second bit sequence matrix is skipped. The second bit sequence matrix is obtained from a first bit sequence matrix by using a second predetermined transform. The first bit sequence matrix is formed from the Polar encoded bit sequence. The second predetermined transform includes row permutation or column permutation.

It is to be noted that the above selecting module 36 can further be configured to select T bits based on the second bit sequence matrix row by row, column by column or diagonal by diagonal, as the bit sequence to be transmitted.

It is to be noted that the above selecting module 36 can further be configured to select T bits from the second bit sequence matrix row by row, column by column or diagonal by diagonal, from a starting position t in the second bit sequence matrix. When the selection reaches the first or last bit in the second bit sequence matrix, it continues with the last or first bit in the second bit sequence matrix, where $1 \leq t \leq R_{vb} \times C_{vb}$.

It is to be noted that the above selecting module 36 can further be configured to select the $1^{st}$ to T-th bits or the (N−T+1)-th to N-th bits from the second bit sequence matrix column by column, when T is smaller than or equal to a length N of the Polar encoded bit sequence; select the $1^{st}$ to T-th bits or the (N−T+1)-th to N-th bits from the second bit sequence matrix row by row, when T is smaller than or equal to the length N of the Polar encoded bit sequence; select the $1^{st}$ to T-th bits or the (N−T+1)-th to N-th bits from the second bit sequence matrix diagonal by diagonal, when T is smaller than or equal to the length N of the Polar encoded bit sequence; select, when T is larger than the length N of the Polar encoded bit sequence, T bits row by row, column by column or diagonal by diagonal, from the t-th bit in the second bit sequence matrix. When the selection reaches the first or last bit in the second bit sequence matrix, it continues with the last or first bit in the second bit sequence matrix, where $1 \leq t \leq R_{vb} \times C_{vb}$ and N is a non-negative integer.

It is to be noted that the operation of selecting T bits from the second bit sequence matrix column by column includes at least one of: selecting $T_{ie1}$ bits from the $1^{st}, 2^{nd}, \ldots, E_1$-th columns, where $\Sigma_{ie1=1}^{E_1} T_{ie1}=T$, $1 \leq E_1 \leq C_{vb}$, and ie1 and $E_1$ are integers; selecting $T_{ie2}$ bits from the $E_2$-th, ($E_2$+1)-th, ..., $E_3$-th columns, where $\Sigma_{ie2=E_2}^{E_3} T_{ie2}=T$, $1 \leq E_2 \leq E_3 \leq C_{re}$, and ie2, $E_2$ and $E_3$ are integers; or selecting $T_{ie3}$ bits from the $E_4$-th, ($E_4$+1)-th, ..., $E_{vb}$-th columns, where $\Sigma_{ie3=E_4}^{C_{vb}} T_{ie3}=T$, $1 \leq E_4 \leq C_{vb}$, and ie3 and $E_4$ are integers.

It is to be noted that the operation of selecting T bits from the second bit sequence matrix row by row includes at least one of: selecting Tin bits from the $1^{st}, 2^{nd}, \ldots, F_1$-th rows, where $\Sigma_{if1=1}^{F_1} T_{if1}=T$, $1 \leq F_1 \leq R_{vb}$, and if1 and $F_1$ are integers; selecting $T_{if2}$ bits from the $F_2$-th, ($F_2$+1)-th, ..., $F_3$-th rows, where $\Sigma_{if2=F_2}^{F_3} T_{if2}=T$, $1 \leq F_2 F_3 \leq R_{vb}$, and if2, $F_2$ and $F_3$ are integers; or selecting $T_{if3}$ bits from the $F_4$-th, ($F_4$+1)-th, ..., $R_{vb}$-th rows, where $\Sigma_{if3=F_4}^{R_{vb}} T_{if3}=T$, $1 \leq F_4 \leq R_{vb}$, and if3 and $F_4$ are integers.

It is to be noted that the operation of selecting T bits from the second bit sequence matrix diagonal by diagonal includes at least one of: selecting $T_{ig1}$ bits from the $(-\min(R_{vb}, C_{vb})+1)$-th, $(-\min(R_{vb}, C_{vb})+2)$-th, ..., $G_1$-th diagonals, where $\Sigma_{ig1=-\min(R_{vb}, C_{vb})+1}^{G_1} T_{ig1}=T$, $-\min(R_{vb}, C_{vb})+$ $\leq G_1 \leq \max(R_{vb}, C_{vb})-1$, and ig1 and $G_1$ are integers; selecting $K_{ig2}$ bits from the $G_2$-th, ($G_2$+1)-th, ..., $G_3$-th diagonals, where $\Sigma_{ig2=G_2}^{G_3} T_{ig2}=T$, $-\min(R_{vb}, C_{vb})+1 \leq G_2 \leq G_3 \leq \max(R_{vb}, C_{vb})-1$, and ig2, $G_2$ and $G_3$ are integers; or selecting $K_{id3}$ bits from the $G_4$-th, ($G_4$+1)-th, ..., $(\max(R_{vb}, C_{vb})-1)$-th diagonals, where $$\sum_{ig3=G_4}^{\max(R_{vb},C_{vb})-1} T_{ig3} = T,$$

$-\min(R_{vb}, C_{vb})+1 \leq G_4 \leq \max(R_{vb}, C_{vb})-1$, and ig3 and $G_4$ are integers.

It is to be noted that the above apparatus can be, but not limited to be, provided in a terminal or a network device such as a base station.

It should be noted that each of the above-described modules can be implemented by means of software or hardware, and the latter can be implemented in, but not limited to, the following manner: the above-described modules can be located at the same processor, or can be distributed over a plurality of processors in any combination.

Embodiment 3

Figure 4:
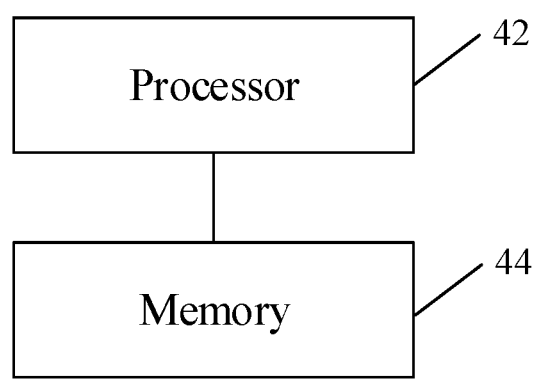
FIG. 4 is a block diagram showing a structure of a device according to Embodiment 3 of the present disclosure.

Embodiment 3 of the present disclosure provides a device. FIG. 4 is a block diagram showing a structure of a device according to Embodiment 3 of the present disclosure. AS shown in FIG. 4, the device includes:

a processor 42 configured to: map a first bit sequence having a length of K bits to a specified position based on M_index to obtain a second bit sequence; apply Polar encoding to the second bit sequence to obtain a Polar encoded bit sequence; and select T bits based on the Polar encoded bit sequence as a bit sequence to be transmitted, where K and T are both non-negative integers and K≤T, and a memory 44 coupled to the processor 42.

With the above device, a first bit sequence having a length of K bits is mapped to a specified position based on M_index to obtain a second bit sequence. Polar encoding is applied to the second bit sequence to obtain a Polar encoded bit sequence. T bits are selected based on the Polar encoded bit sequence as a bit sequence to be transmitted. That is, the present disclosure provides a method for determining a bit sequence to be transmitted, capable of solving the problem in the related art associated with lack of a sequence determination scheme in the 5G New RAT.

In an embodiment of the present disclosure, the above processor 42 can further be configured to: apply a first predetermined transform to a first index matrix to obtain a second index matrix; and obtain M_index based on the second index matrix. The first predetermined transform includes row permutation or column permutation. That is, in the Polar encoding process, the same transform pattern is applied to one dimension of the first index matrix, such that only the other dimension of the first index matrix needs to be changed when a mother code length changes. Thus, the hardware can be reused in the implementation of Polar codes, thereby solving the problem in the related art associated with incapability of hardware reuse in the Polar encoding process.

In an embodiment of the present disclosure, the above processor 42 can further be configured to: write the Polar encoded bit sequence into a first bit sequence matrix; and apply a second predetermined transform to the first bit sequence matrix to obtain a second bit sequence matrix. The second predetermined transform includes row permutation or column permutation. A selecting module is configured to select T bits based on the second bit sequence matrix as the bit sequence to be transmitted. That is, the same transform pattern is applied to one dimension of the first bit sequence matrix, such that only the other dimension of the first bit sequence matrix needs to be changed when a mother code length changes. Thus, the hardware can be further reused in the implementation of Polar codes, thereby further solving the problem in the related art associated with incapability of hardware reuse in the Polar encoding process.

It is to be noted that the above storage module can be configured to store the above second bit sequence matrix. The above storage module can be, but not limited to, a buffer or any other memory, such as an internal memory or any other logic entity.

It is to be noted that the above first index matrix can be, but not limited to, a two dimensional, three dimensional or multi-dimensional matrix. In an example where the above first index matrix is a two dimensional matrix, the above first predetermined transform can be embodied such that a row transform pattern or a column transform pattern for the first index matrix is the same.

In an example where the above first index matrix is a two dimensional matrix, in an embodiment of the present disclosure, the second index matrix is $M_{re}$, which is a matrix of $R_{re}$ rows and $C_{re}$ columns. The first index matrix is $M_{or}$, which is:

$$M_{or} = \begin{bmatrix} 0 & 1 & 2 & \ldots & C_{re}-1 \\ C_{re} & C_{re}+1 & C_{re}+2 & \ldots & 2C_{re}-1 \\ \vdots & \vdots & \vdots & \ddots & \vdots \\ (R_{re}-1)\times C_{re} & (R_{re}-1)\times C_{re}+1 & (R_{re}-1)\times C_{re}+2 & \ldots & R_{re}\times C_{re}-1 \end{bmatrix} \text{ or}$$

$$M_{or} = \begin{bmatrix} 0 & R_{re} & 2R_{re} & \ldots & (C_{re}-1)\times R_{re} \\ 1 & R_{re}+1 & 2R_{re}+1 & \ldots & (C_{re}-1)\times R_{re}+1 \\ \vdots & \vdots & \vdots & \ddots & \vdots \\ R_{re}-1 & 2R_{re}-1 & 3R_{re}-1 & \ldots & R_{re}\times C_{re}-1 \end{bmatrix},$$

where $R_{re}\times C_{re}\geq N$, $R_{re}$ and $C_{re}$ are both non-negative integers, and N is a length of the Polar encoded bit sequence.

It is to be noted that when $R_{re}$ is constant, $C_{re}$ is a minimum value satisfying $R_{re}\times C_{re}\geq N$; or when $C_{re}$ is constant, $R_{re}$ is a minimum value satisfying $R_{re}\times C_{re}\geq N$.

It is to be noted that the above processor 42 can further be configured to obtain the second index matrix according to at least one of: the i-th column of $M_{re}$ being obtained from the $\pi_1(i)$-th column of $M_{or}$ by means of column permutation, where $0\leq i\leq C_{re}-1$, $0\leq \pi_1(i)\leq C_{re}-1$, $R_{re}\times C_{re}\geq N$, and i and $\pi_1(i)$ are both non-negative integers; or the j-th row of $M_{re}$ being obtained from the $\pi_2(j)$-th row of $M_{or}$, where $0\leq j\leq R_{re}-1$, $0\leq \pi 2(j)\leq R_{re}-1$, $R_{re}\times C_{re}\geq N$, and j and $\pi_2(j)$ are both non-negative integers.

It is to be noted that the above $\pi_1(i)$ can be obtained according to at least one of:

Scheme 1: $\pi_1(i)$=BRO(i), where BRO( ) denotes a bit reverse ordering operation which includes: converting a decimal number i into a first binary number $(B_{n1-1}, B_{n1-2}, \ldots, B_0)$, reversing the first binary number to obtain a second binary number $(B_0, B_1, \ldots, B_{n1-1})$ and converting the second binary number into a decimal number $\pi_1(i)$, where $n1=\log_2(C_{re})$ and $0\leq i\leq C_{re}-1$;

Scheme 2: $\pi_1(i)=\{S1, S2, S3\}$, where $S1=\{0, 1, \ldots, i1-1\}$, $S2=\{i2, i3, i2+1, i3+1, \ldots, i4, i5\}$, and S3 is a set of elements in $\{0, 1, \ldots, C_{re}-1\}$ other than those included in S1 and S2, where $C_{re}/8\leq i1\leq i2\leq C_{re}/3$, $i2\leq i4\leq i3\leq 2C_{re}/3$, $i3\leq i5\leq C_{re}-1$, i1, i2, i3, i4 and i5 are all non-negative integers, and an intersection of any two of S1, S2 and S3 is null; or Scheme 3: $\pi_1(i)=\{I\}$, where $\{I\}$ is a sequence obtained by organizing numerical results of applying a function f(r) to column indices r of $M_{or}$ in ascending or descending order, where $0\leq r\leq C_{re}-1$.

The above three schemes will be explained with reference to the following examples.

For Scheme 1, if $C_{re}=8$, i=6, then $n1=\log_2(8)=3$. i=6 is converted into a binary number $(B_2, B_1, B_0)=(1, 1, 0)$. The binary number $(B_2, B_1, B_0)=(1, 1, 0)$ is reversed to obtain $(B_0, B_1, B_2)=(0, 1, 1)$. $(B_0, B_1, B_2)=(0, 1, 1)$ is then converted into a decimal number $\pi_1(i)=3$.

For Scheme 2, if $C_{re}=8$, $i_1=2$, $i_2=2$, $i_3=4$, $i_4=3$ and $i_5=5$, then $S1=\{0, 1\}$, $S2=\{2, 4, 3, 5\}$, $S3=\{6, 7\}$, and $\pi_1(i)=\{0, 1, 2, 4, 3, 5, 6, 7\}$.

For Scheme 3, $C_{re}=8$, $\{f(0), \ldots, f(7)\}=\{0, 1, 1.18, 2.18, 1.41, 2.41, 2.60, 3.60\}$. $f(0), \ldots, f(7)$ is organized in ascending order to obtain 1 $i(i)=\{1, 2, 3, 5, 4, 6, 7, 8\}$.

It is to be noted that f(r) includes at least one of:

$$f(r) = \sum_{m1=0}^{n1-1} B_{m1} \times 2^{\frac{m1}{k}},$$

$(B_{n1-1}, B_{n1-2}, \ldots, B_0)$ is a binary representation of the index r, where $0\leq m1\leq n1-1$, $n1=\log_2(C_{re})$, and k is a non-negative integer (e.g., $C_{re}=8$, i=6, k=4, $n1=\log_2(8)=3$, i=6 is converted into a binary number $(B_2, B_1, B_0)=(1, 1, 0)$, $$f(6) = \sum_{m1=0}^{n1-1} B_{m1} \times 2^{\frac{m1}{4}} = 0\times 2^{\frac{0}{4}} + 1\times 2^{\frac{1}{4}} + 1\times 2^{\frac{2}{4}} = 2.4142);$$

initializing a function value corresponding to r as $f_1^{(r)}$, and obtaining a function value for each element $f_{C_{re}}^{(r)}$ after n1-th iteration in accordance with a first iteration equation:

$$\begin{cases} f_{2m2}^{(2r-1)} = \varphi^{-1}(1-[1-\varphi(f_{m2}^{(r_1)})][1-\varphi(f_{m2}^{(r_2)})]) \\ f_{2m2}^{(2r)} = f_{m2}^{(r_1)} + f_{m2}^{(r_2)} \end{cases},$$

where $f_1^{(r)}$ is a mean log likelihood ratio. (e.g., $\varphi(z)$ can be approximately:

$$\varphi(z) = \begin{cases} 1 - \frac{1}{\sqrt{4\pi z}} \int_{-\infty}^{+\infty} \tanh\frac{u}{2} \exp(-(u-z)^2/(4z)) du & z > 0 \\ 1, & z = 0 \end{cases},$$

where the nodes $i_1$ and $i_2$ participating in the iterative calculation are dependent on the structure of the Polar encoder);

(Let the initial value $f_1^{(r)} = 2/\sigma^2$, where $\sigma^2$ is the variance of noise, $C_{re} = 8$, $\sigma^2 = 0$. $f_1^{(r)}$ is substituted into the iteration equation to obtain $f_2^{(r)}$, which is then substituted into the iteration equation to obtain $f_4^{(r)}$, and so on, until $f_8^{(r)}$ is calculated, where $f(r) = f_8^{(r)}$, $0 \le r \le C_{re} - 1$, {f(0), ..., f(7)} = {0.04, 0.41, 0.61, 3.29, 1.00, 4.56, 5.78, 16.00}); or initializing a function value corresponding to r as $f_1^{(r)}$, and obtaining a function value for each element $f_{C_{re}}^{(r)}$ after n1-th iteration in accordance with a second iteration equation:

$$\begin{cases} f_{2m3}^{(2r-1)} = f_{m3}^{(r_1)} + f_{m3}^{(r_2)} - f_{m3}^{(r_1)} f_{m3}^{(r_2)} \\ f_{2m3}^{(2r)} = f_{m3}^{(r_1)} f_{m3}^{(r_2)} \end{cases},$$

where $f_1^{(r)}$ is mutual information, where $1 \le m2 \le n1$, $1 \le m3 \le n1$, and r1, r2, 2r and 2r−1 are all integers larger than or equal to 0 and smaller than or equal to $C_{re} - 1$ (the nodes $i_1$ and $i_2$ participating in the iterative calculation are dependent on the structure of the Polar encoder);

(Let $f_1^{(r)} = 0.5$ and $C_{re} = 8$. $f_1^{(r)}$ is substituted into the iteration equation to obtain $f_2^{(r)}$, which is then substituted into the iteration equation to obtain $f_4^{(r)}$, and so on, until $f_8^{(r)}$ is calculated, where $f(r) = f_8^{(r)}$, $0 \le i \le C_{re} - 1$, {f(0), ..., f(7)} = {0.008, 0.152, 0.221, 0.682, 0.313, 0.779, 0.850, 0.991}).

It is to be noted that the above $\pi_2(j)$ can be obtained according to at least one of:

$\pi_2(j) = BRO(j)$, where BRO( ) denotes a bit reverse ordering operation which includes: converting a decimal number j into a third binary number $(B_{n2-1}, B_{n2-2}, \ldots, B_0)$, reversing the third binary number to obtain a fourth binary number $(B_0, B_1, \ldots, B_{n2-1})$ and converting the fourth binary number into a decimal number $\pi_2(j)$, where $n2 = \log_2(R_{re})$ and $0 \le j \le R_{re} - 1$;

$\pi_2(j) = \{S4, S5, S6\}$, where $S4 = \{0, 1, \ldots, j1-1\}$, $S5 = \{j2, j3, j2+1, j3+1, \ldots, j4, j5\}$, and S6 is a set of elements in $\{0, 1, \ldots, R_{re}-1\}$ other than those included in S4 and S5, where $R_{re}/8 \le j1 \le j2 \le R_{re}/3$, $j2 \le j4 \le j3 \le 2 R_{re}/3$, $j3 \le j5 \le R_{re}-1$, j1, j2, j3, j4 and j5 are all non-negative integers, and an intersection of any two of S4, S5 and S6 is null; or $\pi_2(j) = \{J\}$, where $\{J\}$ is a sequence obtained by organizing numerical results of applying a function f(s) to row indices s of $M_{or}$ in ascending or descending order, where $0 \le s \le R_{re} - 1$.

It is to be noted that f(s) includes at least one of:

$$f(s) = \sum_{m4=0}^{n2-1} B_{m4} \times 2^{\frac{m4}{k}},$$

$(B_{n2-1}, B_{n2-2}, \ldots, B_0)$ is a binary representation of the index s, where $0 \le m4 \le n2-1$, $n2 = \log_2(R_{re})$, and k is a non-negative integer;

initializing a function value corresponding to s as $f_1^{(s)}$, and obtaining a function value for each element $f_{R_{re}}^{(s)}$ after n2-th iteration in accordance with a third iteration equation:

$$\begin{cases} f_{2m5}^{(2s-1)} = \varphi^{-1}\left(1 - [1 - \varphi(f_{m5}^{(s_1)})][1 - \varphi(f_{m5}^{(s_2)})]\right) \\ f_{2m5}^{(2s)} = f_{m5}^{(s_1)} + f_{m5}^{(s_2)} \end{cases},$$

where $f_1^{(s)}$ is a mean log likelihood ratio; or initializing a function value corresponding to s as $f_1^{(s)}$, and obtaining a function value for each element $f_{R_{re}}^{(s)}$ after n2-th iteration in accordance with a fourth iteration equation:

$$\begin{cases} f_{2m6}^{(2s-1)} = f_{m6}^{(s_1)} + f_{m6}^{(s_2)} - f_{m6}^{(s_1)} f_{m6}^{(s_2)} \\ f_{2m6}^{(2s)} = f_{m6}^{(s_1)} f_{m6}^{(s_2)} \end{cases},$$

where $f_1^{(s)}$ is mutual information, where $1 \le m5 \le n2$, $1 \le m6 \le n2$, s1, s2, 2s and 2s−1 are all integers larger than or equal to 0 and smaller than or equal to $R_{re} - 1$.

It is to be noted that, for explanations for the above $\pi_2(j)$, reference can be made to $\pi_1(i)$.

It is to be noted that the above first bit sequence matrix can be, but not limited to, a two dimensional, three dimensional or multi-dimensional matrix. In an example where the above first bit sequence matrix is a two dimensional matrix, the above second predetermined transform can be embodied such that a row transform pattern or a column transform pattern for the first bit sequence matrix is the same.

It is to be noted that the first bit sequence matrix is $M_{og}$. The second bit sequence matrix is $M_{vb}$, which is a matrix of $R_{vb}$ rows and $C_{vb}$ columns. $M_{og}$ is:

$$M_{og} = \begin{bmatrix} x_0 & x_1 & x_2 & \cdots & x_{C_{vb}-1} \\ x_{C_{vb}} & x_{C_{vb}+1} & x_{C_{vb}+2} & \cdots & x_{2C_{vb}-1} \\ \vdots & \vdots & \vdots & \ddots & \vdots \\ x_{(R_{vb}-1) \times C_{vb}} & x_{(R_{vb}-1) \times C_{vb}+1} & x_{(R_{vb}-1) \times C_{vb}+2} & \cdots & x_{R_{vb} \times C_{vb}-1} \end{bmatrix} \text{ or}$$

$$M_{og} = \begin{bmatrix} x_0 & x_{R_{vb}} & x_{2R_{vb}} & \cdots & x_{(C_{vb}-1) \times R_{vb}} \\ x_1 & x_{R_{vb}+1} & x_{2R_{vb}+1} & \cdots & x_{(C_{vb}-1) \times R_{vb}+1} \\ \vdots & \vdots & \vdots & \ddots & \vdots \\ x_{R_{vb}-1} & x_{2R_{vb}-1} & x_{3R_{vb}-1} & \cdots & x_{R_{vb} \times C_{vb}-1} \end{bmatrix},$$

where $x_0, x_1, x_2, \ldots, x_{R_{vb} \times C_{vb}-1}$ is the Polar encoded bit sequence, $R_{vb} \times C_{vb} \ge N$, $R_{vb}$ and $C_{vb}$ are both non-negative integers and N is a length of the Polar encoded bit sequence.

It is to be noted that when $R_{vb}$ is constant, $C_{vb}$ is a minimum value satisfying $R_{vb} \times C_{vb} \ge N$; or when $C_{vb}$ is constant, $R_{vb}$ is a minimum value satisfying $R_{vb} \times C_{vb} \ge N$.

It is to be noted that the above processor 42 can further be configured to obtain the second bit sequence matrix according to at least one of: the g-th column of $M_{vb}$ being obtained from the $\pi_3(g)$-th column of $M_{og}$ by means of column permutation, where $0 \le g \le C_{vb}-1$, $0 \le \pi_3(g) \le C_{vb}-1$, $R_{vb} \times C_{vb} \ge N$, and g and $\pi_3(g)$ are both non-negative integers; or the h-th row of $M_{vb}$ being obtained from the $\pi_4(h)$-th row of $M_{og}$ by means of row permutation, where $0 \le h \le R_{vb}-1$, $0 \le \pi_4(h) \le R_{vb}-1$, $R_{vb} \times C_{vb} \ge N$, and h and $\pi_4(h)$ are both non-negative integers.

It is to be noted that $\pi_3(g)$ can be obtained according to at least one of:

$\pi_3(g) = BRO(g)$, where BRO( ) denotes a bit reverse ordering operation which includes: converting a decimal number g into a fifth binary number $(B_{n3-1}, B_{n3-2}, \ldots, B_0)$, reversing the fifth binary number to obtain a sixth binary number ($B_0$, $B_{11}$, ..., $B_{n3-1}$) and converting the sixth binary number into a decimal number $\pi_3(g)$, where $n3=\log_2(C_{vb})$ and $0 \le g \le C_{vb}-1$;

$\pi_3(g)=\{S1, S2, S3\}$, where $S1=\{0, 1, ..., g1-1\}$, $S2=\{g2, g3, g2+1, g3+1, ..., g4, g5\}$, and S3 is a set of elements in $\{0, 1, ..., C_{vb}-1\}$ other than those included in S1 and S2, where $C_{vb}/8 \le g1 \le g2 \le C_{vb}/3$, $g2 \le g4 \le g3 \le 2C_{vb}/3$, $g3 \le g5 \le C_{vb}-1$, g1, g2, g3, g4 and g5 are all non-negative integers, and an intersection of any two of S1, S2 and S3 is null;

$\pi_3(g)=\{G\}$, where $\{G\}$ is a sequence obtained by organizing numerical results of applying a function $f(\alpha)$ to column indices $\alpha$ of $M_{og}$ in ascending or descending order, where $0 \le \alpha \le C_{vb}-1$;

$\pi_3(g)=\{Q1, Q2, Q3\}$, where $Q2=\{q1, q2, q1+1, q2+1, ..., q3, q4\}$, $0 \le q1 \le q3 \le (C_{vb}-1)/2$, $0 \le q2 \le q4 \le (C_{vb}-1)/2$, q1, q2, q3, q4 and q5 are all non-negative integers, Q1 and Q3 are other elements in a difference set between $\{0, 1, ..., C_{vb}-1\}$ and Q2, and an intersection of any two of Q1, Q2 and Q3 is null;

$\pi_3(g)$ being different from a predefined sequence V1 in nV1 positions, where V1={0, 1, 2, 3, 4, 5, 6, 7, 8, 9, 10, 11, 12, 16, 13, 17, 14, 18, 15, 19, 20, 24, 21, 22, 25, 26, 28, 23, 27, 29, 30, 31}, $0 \le nV1 \le 23$; or $\pi_3(g)$ being different from a predefined sequence V2 in nV2 positions, where V2={0, 1, 2, 4, 3, 5, 6, 7, 8, 16, 9, 17, 10, 18, 11, 19, 12, 20, 13, 21, 14, 22, 15, 23, 24, 25, 26, 27, 29, 30, 31}, $0 \le nV2 \le 3$.

It is to be noted that $f(\alpha)$ includes at least one of:

$$f(\alpha) = \sum_{m6=0}^{n3-1} B_{m6} \times 2^{\frac{m6}{k}},$$

($B_{n3-1}, B_{n3-2}, ..., B_0$) is a binary representation of the index $\alpha$, where $0 \le m6 \le n3-1$, $n3=\log_2(C_{vb})$, and k is a non-negative integer;

initializing a function value corresponding to $\alpha$ as $f_1^{(\alpha)}$, and obtaining a function value for each element $f_{C_{vb}}^{(\alpha)}$ after n-th iteration in accordance with a fifth iteration equation:

$$\begin{cases} f_{2m7}^{(2\alpha-1)} = \varphi^{-1}\left(1 - \left[1 - \varphi(f_{m7}^{(\alpha_1)})\right]\left[1 - \varphi(f_{m7}^{(\alpha_2)})\right]\right) \\ f_{2m7}^{(2\alpha)} = f_{m7}^{(\alpha_1)} + f_{m7}^{(\alpha_2)} \end{cases},$$

where $f_1^{(\alpha)}$ is a mean log likelihood ratio; or initializing a function value corresponding to s as a), and obtaining a function value for each element $f_{C_{vb}}^{(\alpha)}$ after n3-th iteration in accordance with a sixth iteration equation:

$$\begin{cases} f_{2m8}^{(2\alpha-1)} = f_{m8}^{(\alpha_1)} + f_{m8}^{(\alpha_2)} - f_{m8}^{(\alpha_1)} f_{m8}^{(\alpha_2)} \\ f_{2m8}^{(2\alpha)} = f_{m8}^{(\alpha_1)} f_{m8}^{(\alpha_2)} \end{cases},$$

where $f_1^{(\alpha)}$ is mutual information, where $1 \le m7 \le n3$, $1 \le m8 \le n3$, and $\alpha1$, $\alpha2$, $2\alpha$ and $2\alpha-1$ are all integers larger than or equal to 0 and smaller than or equal to $C_{vb}-1$.

It is to be noted that $\pi_4(h)$ can be obtained according to at least one of:

$\pi_4(h)=BRO(h)$, where BRO( ) denotes a bit reverse ordering operation which includes: converting a decimal number h into a seventh binary number ($B_{n4-1}, B_{n4-2}, ..., B_0$), reversing the seventh binary number to obtain an eighth binary number ($B_0, B_1, ..., B_{n4-1}$) and converting the eighth binary number into a decimal number $\pi_4(h)$, where $n4=\log_2(R_{vb})$ and $0 \le h \le R_{vb}-1$;

$\pi_4(h)=\{S4, S5, S6\}$, where $S4=\{0, 1, ..., h1-1\}$, $S5=\{h2, h3, h2+1, h3+1, ..., h4, h5\}$, and S6 is a set of elements in $\{0, 1, ..., R_{vb}-1\}$ other than those included in S4 and S5, where $R_{vb}/8 \le h1 \le h2 \le R_{vb}/3$, $h2 \le h4 \le h3 \le 2R_{vb}/3$, $h3 \le h5 \le R_{vb}-1$, h1, h2, h3, h4 and h5 are all non-negative integers, and an intersection of any two of S4, S5 and S6 is null;

$\pi_4(h)=\{H\}$, where $\{H\}$ is a sequence obtained by organizing numerical results of applying a function $f(\beta)$ to row indices $\beta$ of $M_{og}$ in ascending or descending order, where $0 \le 3 \le R_{vb}-1$;

$\pi_4(h)=\{O1, O2, O3\}$, where $O2=\{o1, o2, o1+1, o2+1, ..., o3, o4\}$, $0 \le o1 \le o3 \le (R_{vb}-1)/2$, $0 \le o2 \le o4 \le (R_{vb}-1)/2$, o1, o2, o3, o4 and o5 are all non-negative integers, O1 and O3 are other elements in a difference set between $\{0, 1, ..., R_{vb}-1\}$ and O2, and an intersection of any two of O1, O2 and O3 is null;

$\pi_4(h)$ being different from a predefined sequence VV1 in nVV1 positions, where VV1={0, 1, 2, 3, 4, 5, 6, 7, 8, 9, 10, 11, 12, 16, 13, 17, 14, 18, 15, 19, 20, 24, 21, 22, 25, 26, 28, 23, 27, 29, 30, 31}, $0 \le nVV1 \le 23$; or $\pi_4(h)$ being different from a predefined sequence VV2 in nVV2 positions, where VV2={0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31}, $0 \le nVV2 \le 3$.

It is to be noted that $f(\beta)$ includes at least one of:

$$f(\beta) = \sum_{m9=0}^{n4-1} B_{m9} \times 2^{\frac{m9}{k}},$$

($B_{n4-1}, B_{n4-2}, ..., B_0$) is a binary representation of the index $\beta$, where $0 \le m9 \le n4-1$, $n4=\log_2(R_{vb})$, and k is a non-negative integer;

initializing a function value corresponding to $\beta$ as $f_1^{(\beta)}$, and obtaining a function value for each element $f_{R_{vb}}^{(\beta)}$ after n4-th iteration in accordance with a seventh iteration equation:

$$\begin{cases} f_{2m10}^{(2\beta-1)} = \varphi^{-1}\left(1 - \left[1 - \varphi(f_{m10}^{(\beta_1)})\right]\left[1 - \varphi(f_{m10}^{(\beta_2)})\right]\right) \\ f_{2m10}^{(2\beta)} = f_{m10}^{(\beta_1)} + f_{m10}^{(\beta_2)} \end{cases},$$

where $f_1^{(\beta)}$ is a mean log likelihood ratio; or initializing a function value corresponding to $\beta$ as $f_1^{(\beta)}$, and obtaining a function value for each element $f_{R_{vb}}^{(\beta)}$ after n4-th iteration in accordance with an eighth iteration equation:

$$\begin{cases} f_{2m11}^{(2\beta-1)} = f_{m11}^{(\beta_1)} + f_{m11}^{(\beta_2)} - f_{m11}^{(\beta_1)} f_{m11}^{(\beta_2)} \\ f_{2m11}^{(2\beta)} = f_{m11}^{(\beta_1)} f_{m11}^{(\beta_2)} \end{cases},$$

where $f_1^{(\beta)}$ is mutual information, where $1 \le m10 \le n4$, $1 \le m11 \le n4$, and $\beta1$, $\beta2$, $2\beta$ and $2\beta-1$ are all integers larger than or equal to 0 and smaller than or equal to $R_{vb}-1$.

It is to be noted that, for explanations for $\pi_3(g)$ and $\pi_4(h)$, reference can be made to $\pi_1(i)$ and descriptions thereof will be omitted here.

In an embodiment of the present disclosure, the above first transform module can further be configured to select a predetermined number of indices based on $M_{re}$ row by row, column by column or diagonal by diagonal, as M_index.

It is to be noted that the operation of selecting the predetermined number of indices from $M_{re}$ column by column includes: selecting $\pi_p$ indices from the p-th column of $M_{re}$, where $\Sigma_{p=1}^{C_{re}}K_p=K$, p is an integer, and $1 \leq p \leq C_{re}$. The operation of selecting the predetermined number of indices from $M_{re}$ row by row includes: selecting $\pi_q$ indices from the q-th row of $M_{re}$, where $\Sigma_{q=1}^{R_{re}}K_q=K$, q is an integer, and $1 \leq q \leq R_{re}$. The operation of selecting the predetermined number of indices from $M_{re}$ diagonal by diagonal includes: selecting $K_\delta$ indices from the δ-th diagonal of $M_{re}$, where $$\sum_{\delta=-min(R_{re},C_{re})+1}^{max(R_{re},C_{re})-1} K_\delta = K,$$

δ is an integer, and $-min(R_{re}, C_{re})+1 \leq \delta \leq max(R_{re}, C_{re})-1$, where $min(R_{re}, C_{re})$ denotes the smaller of $R_{re}$ and $C_{re}$, and $max(R_{re}, C_{re})$ denotes the larger of $R_{re}$ and $C_{re}$.

It is to be noted that the operation of selecting the predetermined number of indices from $M_{re}$ column by column includes at least one of: selecting $K_{ic1}$ indices from the $1^{st}$, $2^{nd}$...$C_1$-th columns of $M_{re}$, where $\Sigma_{ic1=1}^{C_1}K_{ic1}=K$, $1 \leq ic1 \leq C_1$, $1 \leq C \leq C_{re}$, and ic1 and $C_1$ are integers; selecting $K_{ic2}$ indices from the $C_2$-th, $(C_2+1)$-th, ..., $C_3$-th columns of $M_{re}$, where $\Sigma_{ic2=C_2}^{C_3}K_{ic2}=K$, $C_2 \leq ic2 \leq C_3$, $1 \leq C_2 \leq C_3 \leq C_{re}$, and ic2, $C_2$ and $C_3$ are integers; or selecting $K_{ic3}$ indices from the $C_4$-th, $(C_4+1)$-th, ..., $C_{re}$-th columns of $M_{re}$, where $\Sigma_{ic3=C_4}^{C_{re}}K_{ic3}=K$, $C_4 \leq ic3 \leq C_{re}$, $1 \leq C_4 \leq C_{re}$, and ic3 and $C_4$ are integers.

It is to be noted that the operation of selecting the predetermined number of indices from $M_{re}$ row by row includes at least one of: selecting $K_{ir1}$ indices from the $1^{st}$, $2^{nd}$, ..., $R_1$-th rows of $M_{re}$, where $\Sigma_{ir1=1}^{R_1}K_{ir1}=K$, $1 \leq ir1 \leq R$, $1 \leq R_1 \leq R_{re}$, and ir1 and $R_1$ are integers; selecting $K_{ir2}$ indices from the $R_2$-th, $(R_2+1)$-th, ..., $R_3$-th rows of $M_{re}$, where $\Sigma_{ir2=R_2}^{R_3}K_{ir2}=K$, $R_2 \leq ir2 \leq R_3$, $1 \leq R_2 \leq R_3 \leq R_{re}$, and ir2, $R_2$ and $R_3$ are integers; or selecting $K_{ir3}$ indices from the $R_4$-th, $(R_4+1)$-th, ..., $R_{re}$-th rows of $M_{re}$, where $\Sigma_{ir3=R_4}^{R_{re}}K_p=K$, $1 \leq R_4 \leq R_{re}$, and ir3 and $R_4$ are integers.

It is to be noted that the operation of selecting the predetermined number of indices from $M_{re}$ diagonal by diagonal includes at least one of: selecting $K_{id1}$ indices from the $(-min(R_{re}, C_{re})+1)$-th, $(-min(R_{re}, C_{re})+2)$-th, ..., $D_1$-th diagonals of $M_{re}$, where $\Sigma_{id1=-min(R_{re}, C_{re})+1}^{D_1}K_{id1}=K$, $-min(R_{re}, C_{re})+1 \leq D_1 \leq max(R_{re}, C_{re})-1$, and id1 and $D_1$ are integers; selecting $K_{id2}$ indices from the $D_2$-th, $(D_2+1)$-th, ..., $D_3$-th diagonals of $M_{re}$, where $\Sigma_{id2=D_2}^{D_3}K_{id2}=K$, $-min(R_{re}, C_{re})+1 \leq D_2 \leq D_3 \leq max(R_{re}, C_{re})-1$, and id2, $D_2$ and $D_3$ are integers; and selecting $K_{id3}$ indices from the $D_4$-th, $(D_4+1)$-th, ..., $(max(R_{re}, C_{re})-1)$-th diagonals of $M_{re}$, where $$\sum_{id3=D_4}^{max(R_{re},C_{re})-1} K_{id3} = K,$$

$-min(R_{re}, C_{re})+1 \leq D_4 \leq max(R_{re}, C_{re})-1$, and id3 and $D_4$ are integers, where $min(R_{re}, C_{re})$ denotes the smaller of $R_{re}$ and $C_{re}$, and $max(R_{re}, C_{re})$ denotes the larger of $R_{re}$ and $C_{re}$.

It is to be noted that, when the predetermined number of indices are selected from $M_{re}$ row by row, column by column or diagonal by diagonal, each index corresponding to a non-transmitted bit sequence in a second bit sequence matrix is skipped. The second bit sequence matrix is obtained from a first bit sequence matrix by using a second predetermined transform. The first bit sequence matrix is formed from the Polar encoded bit sequence. The second predetermined transform includes row permutation or column permutation.

It is to be noted that the above processor 42 can further be configured to select T bits based on the second bit sequence matrix row by row, column by column or diagonal by diagonal, as the bit sequence to be transmitted.

It is to be noted that the above processor 42 can further be configured to select T bits based on the second bit sequence matrix row by row, column by column or diagonal by diagonal, from a starting position t in the second bit sequence matrix. When the selection reaches the first or last bit in the second bit sequence matrix, it continues with the last or first bit in the second bit sequence matrix, where $1 \leq t \leq R_{vb} \times C_{vb}$.

It is to be noted that the above processor 42 can further be configured to select the $1^{st}$ to T-th bits or the $(N-T+1)$-th to N-th bits from the second bit sequence matrix column by column, when T is smaller than or equal to a length N of the Polar encoded bit sequence; select the $1^{st}$ to T-th bits or the $(N-T+1)$-th to N-th bits from the second bit sequence matrix row by row, when T is smaller than or equal to the length N of the Polar encoded bit sequence; select the $1^{st}$ to T-th bits or the $(N-T+1)$-th to N-th bits from the second bit sequence matrix diagonal by diagonal, when T is smaller than or equal to the length N of the Polar encoded bit sequence; select, when T is larger than the length N of the Polar encoded bit sequence, T bits row by row, column by column or diagonal by diagonal, from the t-th bit in the second bit sequence matrix. When the selection reaches the first or last bit in the second bit sequence matrix, it continues with the last or first bit in the second bit sequence matrix, where $1 \leq t \leq R_{vb} \times C_{vb}$ and N is a non-negative integer.

It is to be noted that the operation of selecting T bits from the second bit sequence matrix column by column includes at least one of: selecting $T_{ie1}$ bits from the $1^{st}$, $2^{nd}$, ..., $E_1$-th columns, where $\Sigma_{ie1=1}^{E_1}T_{ie1}=T$, $1 \leq E_1 \leq C_{vb}$, and ie1 and $E_1$ are integers; selecting $T_{ie2}$ bits from the $E_2$-th, $(E_2+1)$-th, ..., $E_3$-th columns, where $\Sigma_{ie2=E_2}^{E_3}T_{ie2}=T$, $1 \leq E_2 \leq E_3 \leq C_{re}$, and ie2, $E_2$ and $E_3$ are integers; or selecting $T_{ie3}$ bits from the $E_4$-th, $(E_4+1)$-th, ..., $E_{vb}$-th columns, where $\Sigma_{ie3=E_4}^{C_{vb}}T_{ie3}=T$, $1 \leq E_4 \leq C_{vb}$, and ie3 and $E_4$ are integers.

It is to be noted that the operation of selecting T bits from the second bit sequence matrix row by row includes at least one of: selecting Tin bits from the $1^{st}$, $2^{nd}$, ..., $F_1$-th rows, where $\Sigma_{if1=1}^{F_1}T_{if1}=T$, $1 \leq F_1 \leq R_{vb}$, and if1 and $F_1$ are integers; selecting $T_{if2}$ bits from the $F_2$-th, $(F_2+1)$-th, ..., $F_3$-th rows, where $\Sigma_{if2=F_2}^{F_3}T_{if2}=T$, $1 \leq F_3 \leq R_{vb}$, and if2, $F_2$ and $F_3$ are integers; or selecting $T_{if3}$ bits from the $F_4$-th, $(F_4+1)$-th, ..., $R_{vb}$-th rows, where $\Sigma_{if3=F_4}^{R_{vb}}T_{if3}=T$, $1 \leq F_4 R_{vb}$, and if3 and $F_4$ are integers.

It is to be noted that the operation of selecting T bits from the second bit sequence matrix diagonal by diagonal includes at least one of: selecting $T_{ig1}$ bits from the $(-min(R_{vb}, C_{vb})+1)$-th, $(-min(R_{vb}, C_{vb})+2)$-th, ..., $G_1$-th diagonals, where $\Sigma_{ig1=-min(R_{vb}, C_{vb})+1}^{G_1}T_{ig1}=T$, $-min(R_{vb}, C_{vb})+ \leq G_1 \leq max(R_{vb}, C_{vb})-1$, and ig1 and $G_1$ are integers; selecting $K_{ig2}$ bits from the $G_2$-th, $(G_2+1)$-th, ..., $G_3$-th diagonals, where $\Sigma_{ig2=G_2}^{G_3}T_{ig2}=T$, $-min(R_{vb}, C_{vb})+1 \leq G_2 \leq G_3 \leq max(R_{vb}, C_{vb})-1$, and ig2, $G_2$ and $G_3$ are integers; or selecting $K_{id3}$ bits from the $G_4$-th, $(G_4+1)$-th, ..., $(max(R_{vb}, C_{vb})-1)$-th diagonals, where $$\sum_{ig3=G_4}^{max(R_{vb},C_{vb})-1} T_{ig3} = T,$$

−min($R_{vb}$, $C_{vb}$)+1≤$G_4$≤max($R_{vb}$, $C_{vb}$)−1, and ig3 and $G_4$ are integers.

It is to be noted that the above device can be, but not limited to a terminal or a network device such as a base station.

Embodiment 4

According to an embodiment of the present disclosure, a storage medium is also provided. The storage medium stores a program which, when executed, performs any of the above described methods.

According to an embodiment of the present disclosure, the above storage medium can be configured to store program codes for performing the steps of the method described above in connection with Embodiment 1.

According to an embodiment of the present disclosure, the above storage medium may include, but not limited to, a USB disk, a Read-Only Memory (ROM), a Random Access Memory (RAM), a mobile hard disk, a magnetic disk, an optical disc, or other mediums capable of storing program codes.

According to an embodiment of the present disclosure, a processor is provided. The processor is configured to execute a program for performing the steps of any of the above described methods.

According to an embodiment of the present disclosure, the above program is configured to perform the steps of the method described above in connection with Embodiment 1.

For detailed examples of this embodiment, reference can be made to those examples described in connection with the above and optional embodiments and description thereof will be omitted here.

In the following, the present disclosure will be further explained with reference to the examples, such that the present disclosure can be better understood.

Example 1

The following numerical values are provided for the purpose of illustration. For other situations, reference can be made to the following operation steps.

It is assumed that the number of columns in each of the index matrix $M_{or}$, the index matrix $M_{re}$, the bit sequence matrix $M_{vb}$ and the bit sequence matrix $M_{og}$ is fixed to be 32. The length of the first bit sequence is K=40 and the length of the bit sequence to be transmitted is T=100. Polar encoding having a mother code length of 128 is applied. In particular, the encoding process is as follows.

(1) The number $R_{re}$ of rows of the index matrix $M_{re}$ needs to be selected as a minimum value satisfying $R_{re} \times C_{re} \geq N$. According to the above assumptions, $C_{re}=32$ and N=128, then $R_{re}=4$. It is assumed that the indices in the index matrix $M_{og}$ are arranged row by row:

$$M_{or} = \begin{bmatrix} 0 & 1 & 2 & \cdots & C_{re}-1 \\ C_{re} & C_{re}+1 & C_{re}+2 & \cdots & 2C_{re}-1 \\ \vdots & \vdots & \vdots & \ddots & \vdots \\ (R_{re}-1) \times C_{re} & (R_{re}-1) \times C_{re}+1 & (R_{re}-1) \times C_{re}+2 & \cdots & R_{re} \times C_{re}-1 \end{bmatrix}$$

$$= \begin{bmatrix} 0 & 1 & 2 & \cdots & 31 \\ 32 & 33 & 34 & \cdots & 63 \\ 64 & 65 & 66 & \ddots & 95 \\ 96 & 97 & 98 & \cdots & 127 \end{bmatrix}$$

(2) If the index matrix $M_{re}$ is obtained from the index matrix $M_{or}$ by means of column permutation, e.g., by mapping the $\pi_1(i)$-th column of the index matrix $M_{or}$ to the i-th column of the index matrix $M_{re}$ by means of column permutation. The indices in $\pi_1(i)$ are arranged in ascending order of numerical results obtained based on a function. If the function is expressed as $$f(i) = \sum_{m=0}^{n-1} B_m \times 2^{\frac{m}{k}}$$

k=4, then
{f(0), . . . , f(31)}={0, 1, 1.19, 2.19, 1.41, 2.41, 2.60, 3.60, 1.68, 2.68, 2.87, 3.87, 3.10, 4.10, 4.29, 5.29, 2.00, 3.00, 3.19, 4.19, 3.41, 4.41, 4.60, 5.60, 3.68, 4.68, 4.87, 0.87, 5.10, 6.10, 6.29, 7.29}. f(0), . . . , f(31) are arranged in ascending order to obtain a column permutation pattern $\pi_1(i)$={0, 1, 2, 4, 8, 16, 3, 5, 6, 9, 10, 17, 12, 18, 20, 7, 24, 11, 13, 19, 14, 21, 22, 25, 26, 28, 15, 23, 27, 29, 30, 31}. Accordingly, the column having an index of 0 in the index matrix $M_{or}$ is the column having an index of 0 in the index matrix $M_{re}$, the column having an index of 1 in the index matrix $M_{or}$ is the column having an index of 1 in the index matrix $M_{re}$, the column having an index of 2 in the index matrix $M_{or}$ is the column having an index of 2 in the index matrix $M_{re}$, the column having an index of 4 in the index matrix $M_{or}$ is the column having an index of 3 in the index matrix $M_{re}$, the column having an index of 8 in the index matrix $M_{or}$ is the column having an index of 4 in the index matrix $M_{re}$, and so on.

(3) The bit sequence matrix $M_{vb}$ is obtained from the bit sequence matrix $M_{og}$ by means of column permutation, e.g., by mapping the $\pi_2(i)$-th column of the bit sequence matrix $M_{og}$ to the i-th column of the bit sequence matrix $M_{vb}$ by means of column permutation. Here, $\pi_2(i)$=BRO(i), and the column permutation pattern is $\pi_2(i)$={0,16,8,24,4,20,12,28, 2,18,10,26,6,22,14,30,1,17,9,25,5,21,13,29,3,19,11,27,7,23, 15,31}. Accordingly, the column having an index of 0 in the bit sequence matrix $M_{og}$ is the column having an index of 0 in the bit sequence matrix $M_{vb}$, the column having an index of 16 in the bit sequence matrix $M_{og}$ is the column having an index of 1 in the bit sequence matrix $M_{vb}$, the column having an index of 8 in the bit sequence matrix $M_{og}$ is the column having an index of 2 in the bit sequence matrix $M_{vb}$, and so on.

(4) The first T=100 bits are selected from the bit sequence matrix $M_{vb}$ column by column to form a bit sequence to be transmitted, which is {$y_0$, $y_{32}$, $y_{64}$, $y_{96}$, $y_{16}$, $y_{48}$, $y_{80}$, $y_{112}$, . . . , $y_{23}$, $y_{55}$, $y_{87}$, $y_{119}$}.

(5) K=40 indices in total are selected from the index matrix $M_{re}$ row by row to form the index sequence M_index. It is to be noted that, during the selection of the indices, each index corresponding to a non-transmitted bit sequence is skipped. That is, the selection is made from the indices corresponding to the bit sequence to be transmitted as outputted from an encoder in the step (4).

(6) After an input bit sequence having a length of K is mapped to encoder positions indicated by the index sequence M_index, Polar encoding can be applied to obtain an encoded bit sequence having a length of N=128. The bits determined in the step (4) are organized into a bit sequence to be transmitted, for transmission from a transmitter.

Example 2

It is assumed that the number of columns in each of the index matrix $M_{or}$, the index matrix $M_{re}$, the bit sequence matrix $M_{vb}$ and the bit sequence matrix $M_{og}$ is fixed to be 32. The length of the input bit sequence is K=40 and the length of the bit sequence to be transmitted is T=100. Polar encoding having a mother code length of 128 is applied. In particular, the encoding process is different from Example 1 in that, in the step (4), the last T=100 bits are selected from the bit sequence matrix $M_{vb}$ column by column to form the bit sequence to be transmitted, which is $\{y_8, y_{24}, y_{40}, y_{56}, y_{72}, y_{88}, y_{104}, y_{120}, \ldots, y_{15}, y_{31}, y_{47}, y_{63}, y_{79}, y_{95}, y_{111}, y_{127}\}$.

Example 3

It is assumed that the number of columns in each of the index matrix $M_{or}$, the index matrix $M_{re}$, the bit sequence matrix $M_{vb}$ and the bit sequence matrix $M_{og}$ is fixed to be 32. The length of the input bit sequence is K=40 and the length of the bit sequence to be transmitted is T=150. Polar encoding having a mother code length of 128 is applied. In particular, the encoding process is different from Example 1 in that, in the step (4), T=130 bits are selected from the bit sequence matrix $M_{vb}$ row by row, starting from the first element in the bit sequence matrix $M_{vb}$. When the selection reaches the last bit $y_{127}$ in the buffer or in the bit sequence matrix $M_{vb}$, it continues with the first bit $y_0$ of the bit sequence matrix $M_{vb}$. The resulting bit sequent to be transmitted is $\{y_0, y_1, y_2, \ldots, y_{127}, y_0, y_1, y_2\}$.

Example 4

It is assumed that the number of columns in each of the index matrix $M_{or}$, the index matrix $M_{re}$, the bit sequence matrix $M_{vb}$ and the bit sequence matrix $M_{og}$ is fixed to be 32. The length of the input bit sequence is K=40 and the length of the bit sequence to be transmitted is T=150. Polar encoding having a mother code length of 128 is applied. In particular, the encoding process is different from Example 3 in that, in the step (4), T=130 bits are selected from the bit sequence matrix $M_{vb}$ row by row, starting from the last element in the bit sequence matrix $M_{vb}$. When the selection reaches the first bit $y_0$ in the buffer or in the bit sequence matrix $M_{vb}$, it continues with the last bit $y_{127}$ of the bit sequence matrix $M_{vb}$. The resulting bit sequent to be transmitted is $\{y_0, y_1, y_2, \ldots, y_{127}, y_{127}, y_{126}, y_{125}\}$.

Example 5

It is assumed that the number of columns in each of the index matrix $M_{or}$, the index matrix $M_{re}$, the bit sequence matrix $M_{vb}$ and the bit sequence matrix $M_{og}$ is fixed to be 32. The length of the input bit sequence is K=40 and the length of the bit sequence to be transmitted is T=100. Polar encoding having a mother code length of 128 is applied. In particular, the encoding process is different from Example 1 in that, the input bit sequence having the length of K=40 is mapped to the encoder positions using Gaussian approximation, density evolution, PW sequence, FRANK sequence, or other schemes. Details of the operations will be omitted here.

Example 6

It is assumed that the number of columns in each of the index matrix $M_{or}$, the index matrix $M_{re}$, the bit sequence matrix $M_{vb}$ and the bit sequence matrix $M_{og}$ is fixed to be 32. The length of the input bit sequence is K=40 and the length of the bit sequence to be transmitted is T=100. Polar encoding having a mother code length of 128 is applied. In particular, the encoding process is different from Example 2 in that, the input bit sequence having the length of K=40 is mapped to the encoder positions using Gaussian approximation, density evolution, PW sequence, FRANK sequence, or other schemes. Details of the operations will be omitted here.

Example 7

It is assumed that the number of columns in each of the index matrix $M_{or}$, the index matrix $M_{re}$, the bit sequence matrix $M_{vb}$ and the bit sequence matrix $M_{og}$ is fixed to be 32. The length of the input bit sequence is K=40 and the length of the bit sequence to be transmitted is T=130. Polar encoding having a mother code length of 128 is applied. In particular, the encoding process is different from Example 3 in that, the input bit sequence having the length of K=40 is mapped to the encoder positions using Gaussian approximation, density evolution, PW sequence, FRANK sequence, or other schemes. Details of the operations will be omitted here.

Example 8

It is assumed that the number of columns in each of the index matrix $M_{or}$, the index matrix $M_{re}$, the bit sequence matrix $M_{vb}$ and the bit sequence matrix $M_{og}$ is fixed to be 32. The length of the input bit sequence is K=40 and the length of the bit sequence to be transmitted is T=130. Polar encoding having a mother code length of 128 is applied. In particular, the encoding process is different from Example 4 in that, the input bit sequence having the length of K=40 is mapped to the encoder positions using Gaussian approximation, density evolution, PW sequence, FRANK sequence, or other schemes. Details of the operations will be omitted here.

Example 9

It is assumed that the number of columns in each of the index matrix $M_{or}$, the index matrix $M_{re}$, the bit sequence matrix $M_{vb}$ and the bit sequence matrix $M_{og}$ is fixed to be 32. The length of the input bit sequence is K=40 and the length of the bit sequence to be transmitted is T=100. Polar encoding having a mother code length of 128 is applied. In particular, the encoding process is different from Example 1 in that a different rate matching scheme is used. Details of the operations will be omitted here.

Example 10

It is assumed that the number of columns in each of the index matrix $M_{or}$, the index matrix $M_{re}$, the bit sequence matrix $M_{vb}$ and the bit sequence matrix $M_{og}$ is fixed to be 32. The length of the input bit sequence is K=40 and the length of the bit sequence to be transmitted is T=100. Polar encoding having a mother code length of 128 is applied. In particular, the encoding process is different from Example 2 in that a different rate matching scheme is used. Details of the operations will be omitted here.

Example 11

It is assumed that the number of columns in each of the index matrix $M_{or}$, the index matrix $M_{re}$, the bit sequence matrix $M_{vb}$ and the bit sequence matrix $M_{og}$ is fixed to be 32. The length of the input bit sequence is K=40 and the length of the bit sequence to be transmitted is T=130. Polar encoding having a mother code length of 128 is applied. In particular, the encoding process is different from Example 3 in that a different rate matching scheme is used. Details of the operations will be omitted here.

Example 12

It is assumed that the number of columns in each of the index matrix $M_{or}$, the index matrix $M_{re}$, the bit sequence matrix $M_{vb}$ and the bit sequence matrix $M_{og}$ is fixed to be 32. The length of the input bit sequence is K=40 and the length of the bit sequence to be transmitted is T=130. Polar encoding having a mother code length of 128 is applied. In particular, the encoding process is different from Example 4 in that a different rate matching scheme is used. Details of the operations will be omitted here.

It can be appreciated by those skilled in the art that the above-described modules or steps of the present disclosure can be implemented by a general purpose computing device, and can be centralized at one single computing device or distributed over a network of multiple computing devices. Optionally, they can be implemented by means of computer executable program codes, which can be stored in a storage device and executed by one or more computing devices. In some cases, the steps shown or described herein may be performed in an order different from the one described above. Alternatively, they can be implemented separately in individual integrated circuit modules, or one or more of the modules or steps can be implemented in one single integrated circuit module. Thus, the present disclosure is not limited to any particular hardware, software, and combination thereof.

The foregoing is merely illustrative of the examples of the present disclosure and is not intended to limit the present disclosure. Various changes and modifications may be made by those skilled in the art. Any modifications, equivalent alternatives or improvements that are made without departing from the spirits and principles of the present disclosure are to be encompassed by the scope of the present disclosure.

INDUSTRIAL APPLICABILITY

With the present disclosure, a first bit sequence having a length of K bits is mapped to a specified position based on M_index to obtain a second bit sequence. Polar encoding is applied to the second bit sequence to obtain a Polar encoded bit sequence. T bits are selected based on the Polar encoded bit sequence as a bit sequence to be transmitted. That is, the present disclosure provides a method for determining a bit sequence to be transmitted, capable of solving the problem in the related art associated with lack of a sequence determination scheme in the 5G New RAT.

What is claimed is:
1. A method for channel coding, comprising:
mapping a first bit sequence having a length of K bits to a second bit sequence based on an index indicating a first permutation pattern;
applying Polar encoding to the second bit sequence to obtain a Polar encoded bit sequence;
forming a first matrix based on the Polar encoded bit sequence;
determining a second matrix by applying a second permutation pattern to the first matrix; and
selecting T bits based on the second matrix,
where K and T are both non-negative integers.
2. The method of claim 1, wherein the first matrix is $M_{og}$, and

$$M_{og} = \begin{bmatrix} x_0 & x_1 & x_2 & \cdots & x_{C_{vb}-1} \\ x_{C_{vb}} & x_{C_{vb}+1} & x_{C_{vb}+2} & \cdots & x_{2C_{vb}-1} \\ \vdots & \vdots & \vdots & \ddots & \vdots \\ x_{(R_{vb}-1)\times C_{vb}} & x_{(R_{vb}-1)\times C_{vb}+1} & x_{(R_{vb}-1)\times C_{vb}+2} & \cdots & x_{R_{vb}\times C_{vb}-1} \end{bmatrix} \text{ or}$$

$$M_{og} = \begin{bmatrix} x_0 & x_{R_{vb}} & x_{2R_{vb}} & \cdots & x_{(C_{vb}-1)\times R_{vb}} \\ x_1 & x_{R_{vb}+1} & x_{2R_{vb}+1} & \cdots & x_{(C_{vb}-1)\times R_{vb}+1} \\ \vdots & \vdots & \vdots & \ddots & \vdots \\ x_{R_{vb}-1} & x_{2R_{vb}-1} & x_{3R_{vb}-1} & \cdots & x_{R_{vb}\times C_{vb}-1} \end{bmatrix},$$

where $x_0, x_1, x_2, \ldots, x_{R_{vb}\times C_{vb}-1}$ is the Polar encoded bit sequence, $R_{vb}$ and $C_{vb}$ being both non-negative integers.
3. The method of claim 1, wherein the second premutation pattern comprises a row or a column being same as a predefined sequence V2 in all positions, where V2={0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31}.
4. The method of claim 1, wherein said selecting T bits based on the second matrix comprises:
selecting T bits column by column from the second matrix.
5. The method of claim 1, wherein said selecting T bits based on the second matrix comprises:
performing a selection of T bits from a starting position t in the second matrix, wherein the selection continues with a first bit in the second matrix upon reaching a last bit in the second matrix, where 1≤t.
6. The method of claim 1, wherein the first matrix comprises 32 columns.
7. A device for channel coding, comprising:
a processor; and
a memory including processor executable code, wherein the processor executable code upon execution by the processor configures the processor to:
map a first bit sequence having a length of K bits to a second bit sequence based on an index indicating a first permutation pattern;
apply Polar encoding to the second bit sequence to obtain a Polar encoded bit sequence;
form a first matrix based on the Polar encoded bit sequence;
determine a second matrix by applying a second permutation pattern to the first matrix; and
select T bits based on the second matrix, where K and T are both non-negative integers.

8. The device of claim 7, wherein the first matrix is $M_{og}$, and $$M_{og} = \begin{bmatrix} x_0 & x_1 & x_2 & \cdots & x_{C_{vb}-1} \\ x_{C_{vb}} & x_{C_{vb}+1} & x_{C_{vb}+2} & \cdots & x_{2C_{vb}-1} \\ \vdots & \vdots & \vdots & \ddots & \vdots \\ x_{(R_{vb}-1) \times C_{vb}} & x_{(R_{vb}-1) \times C_{vb}+1} & x_{(R_{vb}-1) \times C_{vb}+2} & \cdots & x_{R_{vb} \times C_{vb}-1} \end{bmatrix} \text{ or}$$

$$M_{og} = \begin{bmatrix} x_0 & x_{R_{vb}} & x_{2R_{vb}} & \cdots & x_{(C_{vb}-1) \times R_{vb}} \\ x_1 & x_{R_{vb}+1} & x_{2R_{vb}+1} & \cdots & x_{(C_{vb}-1) \times R_{vb}+1} \\ \vdots & \vdots & \vdots & \ddots & \vdots \\ x_{R_{vb}-1} & x_{2R_{vb}-1} & x_{3R_{vb}-1} & \cdots & x_{R_{vb} \times C_{vb}-1} \end{bmatrix},$$

where $x_0, x_1, x_2, \ldots, x_{R_{vb} \times C_{vb}-1}$ is the Polar encoded bit sequence, $R_{vb}$ and $C_{vb}$ being both non-negative integers.

9. The device of claim 7, wherein the second premutation pattern comprises a row or a column being same as a predefined sequence V2 in all positions, where V2={0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31}.

10. The device of claim 7, wherein the processor executable code upon execution by the processor configures the processor to select T bits column by column from the second matrix.

11. The device of claim 7, wherein the processor executable code upon execution by the processor configures the processor to perform a selection of T bits from a starting position t in the second matrix, wherein the selection continues with a first bit in the second matrix upon reaching a last bit in the second matrix, wherein t>=1.

12. The device of claim 7, wherein the first matrix comprises 32 columns.

13. A non-transitory storage medium having code stored thereon, the code upon execution by a processor, causing the processor to implement a method that comprises:
mapping a first bit sequence having a length of K bits to a second bit sequence based on an index indicating a first permutation pattern;
applying Polar encoding to the second bit sequence to obtain a Polar encoded bit sequence;
forming a first matrix based on the Polar encoded bit sequence;
determining a second matrix by applying a second permutation pattern to the first matrix;
selecting T bits based on the second matrix,
where K and T are both non-negative integers.

14. The non-transitory storage medium of claim 13, wherein the first matrix is $M_{og}$, and $$M_{og} = \begin{bmatrix} x_0 & x_1 & x_2 & \cdots & x_{C_{vb}-1} \\ x_{C_{vb}} & x_{C_{vb}+1} & x_{C_{vb}+2} & \cdots & x_{2C_{vb}-1} \\ \vdots & \vdots & \vdots & \ddots & \vdots \\ x_{(R_{vb}-1) \times C_{vb}} & x_{(R_{vb}-1) \times C_{vb}+1} & x_{(R_{vb}-1) \times C_{vb}+2} & \cdots & x_{R_{vb} \times C_{vb}-1} \end{bmatrix} \text{ or}$$

$$M_{og} = \begin{bmatrix} x_0 & x_{R_{vb}} & x_{2R_{vb}} & \cdots & x_{(C_{vb}-1) \times R_{vb}} \\ x_1 & x_{R_{vb}+1} & x_{2R_{vb}+1} & \cdots & x_{(C_{vb}-1) \times R_{vb}+1} \\ \vdots & \vdots & \vdots & \ddots & \vdots \\ x_{R_{vb}-1} & x_{2R_{vb}-1} & x_{3R_{vb}-1} & \cdots & x_{R_{vb} \times C_{vb}-1} \end{bmatrix},$$

where $x_0, x_1, x_2, \ldots, x_{R_{vb} \times C_{vb}-1}$ is the Polar encoded bit sequence, $R_{vb}$ and $C_{vb}$ being both non-negative integers.

15. The non-transitory storage medium of claim 13, wherein the second premutation pattern comprises a row or a column being same as a predefined sequence V2 in all positions, where V2={0, 1, 2, 4, 3, 5, 6, 7, 8, 16, 9, 17, 10, 18, 11, 19, 12, 20, 13, 21, 14, 22, 15, 23, 24, 25, 26, 28, 27, 29, 30, 31}.

16. The non-transitory storage medium of claim 13, wherein said selecting T bits based on the second matrix:
selecting T bits column by column from the second matrix.

17. The non-transitory storage medium of claim 13, wherein the method further comprises:
performing a selection of T bits from a starting position t in the second matrix, wherein the selection continues with a first bit in the second matrix upon reaching a last bit in the second matrix, wherein t>=1.

18. The non-transitory storage medium of claim 13, wherein the first matrix comprises 32 columns.

* * * * *